(12) United States Patent
Umezawa et al.

(10) Patent No.: US 7,280,407 B2
(45) Date of Patent: Oct. 9, 2007

(54) SEMICONDUCTOR MEMORY DEVICE INCLUDING FLOATING GATES AND CONTROL GATES, CONTROL METHOD FOR THE SAME, AND MEMORY CARD INCLUDING THE SAME

(75) Inventors: Akira Umezawa, Tokyo (JP); Yoshiharu Hirata, Yokohama (JP); Takuya Fujimoto, Yokohama (JP); Yoshiaki Hashiba, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 193 days.

(21) Appl. No.: 11/087,576

(22) Filed: Mar. 24, 2005

(65) Prior Publication Data
US 2005/0237824 A1  Oct. 27, 2005

(30) Foreign Application Priority Data
Apr. 23, 2004 (JP) .............................. 2004-128155

(51) Int. Cl.
*G11C 16/06* (2006.01)
*G11C 16/04* (2006.01)
(52) U.S. Cl. .......................... 365/185.25; 365/185.18; 365/189.09; 365/189.11; 365/204; 365/226
(58) Field of Classification Search ............ 365/185.25
See application file for complete search history.

(56) References Cited

U.S. PATENT DOCUMENTS 5,371,705 A * 12/1994 Nakayama et al. .... 365/185.23
5,513,146 A * 4/1996 Atsumi et al. ......... 365/185.23
5,999,456 A * 12/1999 Sali et al. ............... 365/185.28
6,031,774 A * 2/2000 Chung ......................... 365/204
6,278,316 B1 * 8/2001 Tanzawa et al. ............ 327/536
6,373,749 B1 * 4/2002 Atsumi et al. ......... 365/185.29
6,438,032 B1 * 8/2002 Pekny et al. ........... 365/185.18
6,456,534 B2 * 9/2002 Jinbo .................... 365/185.25
6,667,910 B2 * 12/2003 Abedifard et al. ..... 365/185.29
6,781,890 B2 * 8/2004 Tanaka et al. ......... 365/189.09

OTHER PUBLICATIONS

Shigeru Atsumi, et al., "A Channel-Erasing 1.8V-Only 32Mb NOR Flash EEPROM with a Bit-Line Direct-Sensing Scheme", 2000 IEEE International Solid-State Circuits Conference, Feb. 8, 2000, pp. 276-277.

(Continued)

*Primary Examiner*—Son L. Mai
(74) *Attorney, Agent, or Firm*—Oblon, Spivak, McClelland, Maier & Neustadt, P.C.

(57) ABSTRACT

A semiconductor memory device includes memory cells, a memory cell array, word lines, a first charge pump circuit, and a discharge circuit. The memory cell has a first MOS transistor with a stacked gate including a floating gate and a control gate. The memory cell array includes the memory cells arranged in a matrix. The word line connects commonly the control gates of the first MOS transistors in a same row. The first charge pump circuit is activated and generates a first voltage in a write operation and erase operation. The first voltage is supplied with either the well region or the word lines. The discharge circuit, when the first charge pump circuit is deactivated, discharges the charge generated by the first charge pump circuit to ground or to a power-supply potential, while causing current to flow to an output node of the first voltage.

17 Claims, 38 Drawing Sheets

OTHER PUBLICATIONS

Toru Tanzawa, et al., "High-Voltage Transistor Scaling Circuit Techniques for High-Density Negative-Gate Channel-Erasing NOR Flash Memories", IEEE Journal of Solid-State Circuits, vol. 37, No. 10, Oct. 2002, pp. 1318-1324.

Wei-Hua Liu, et al., "A 2-Transistor Source-select (2TS) Flash EEPROM for 1.8V-Only Applications", Non-Volatile Semiconductor Memory Workshop 4.1, 1997, pp. 1-3.

* cited by examiner

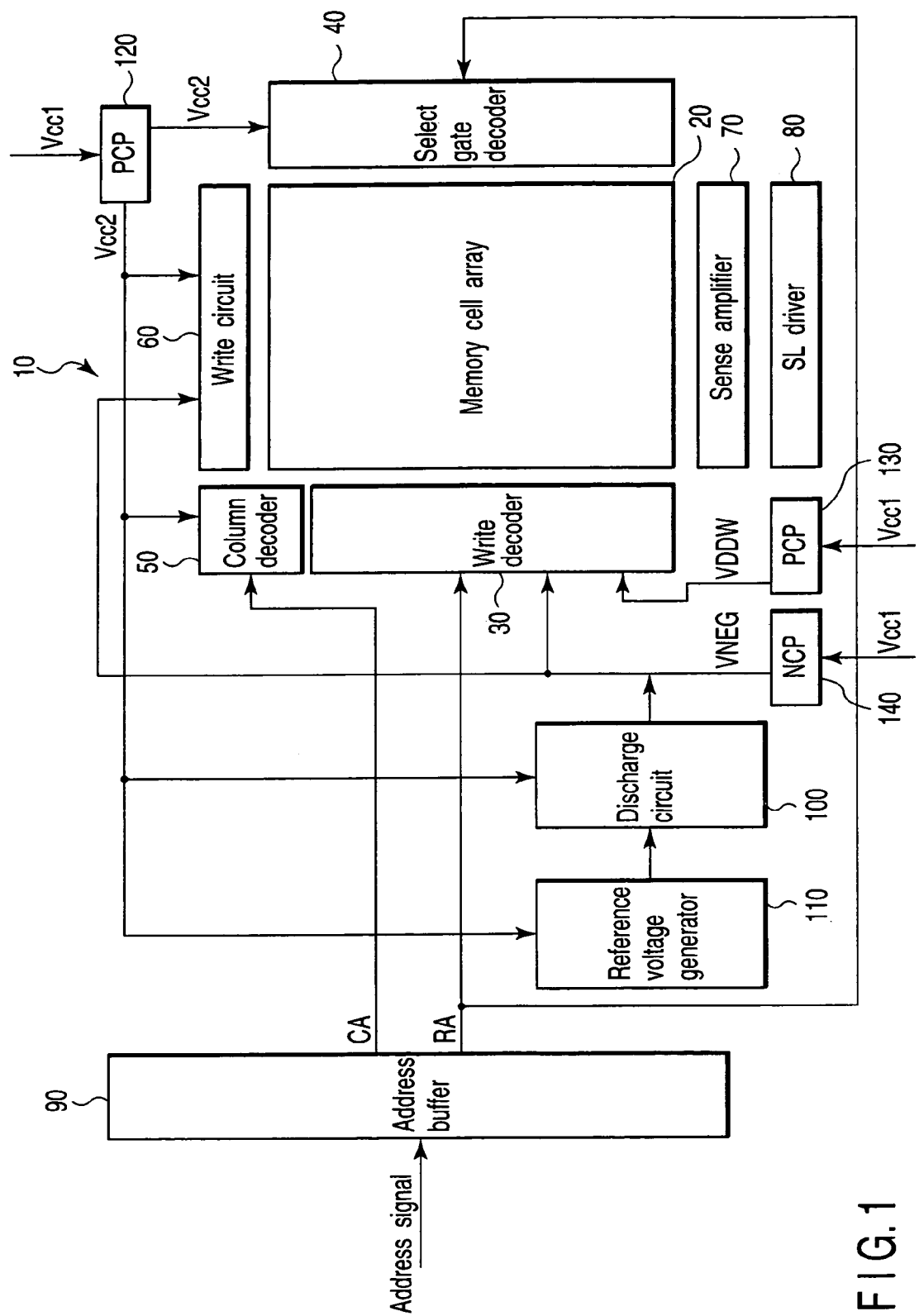
F I G. 1

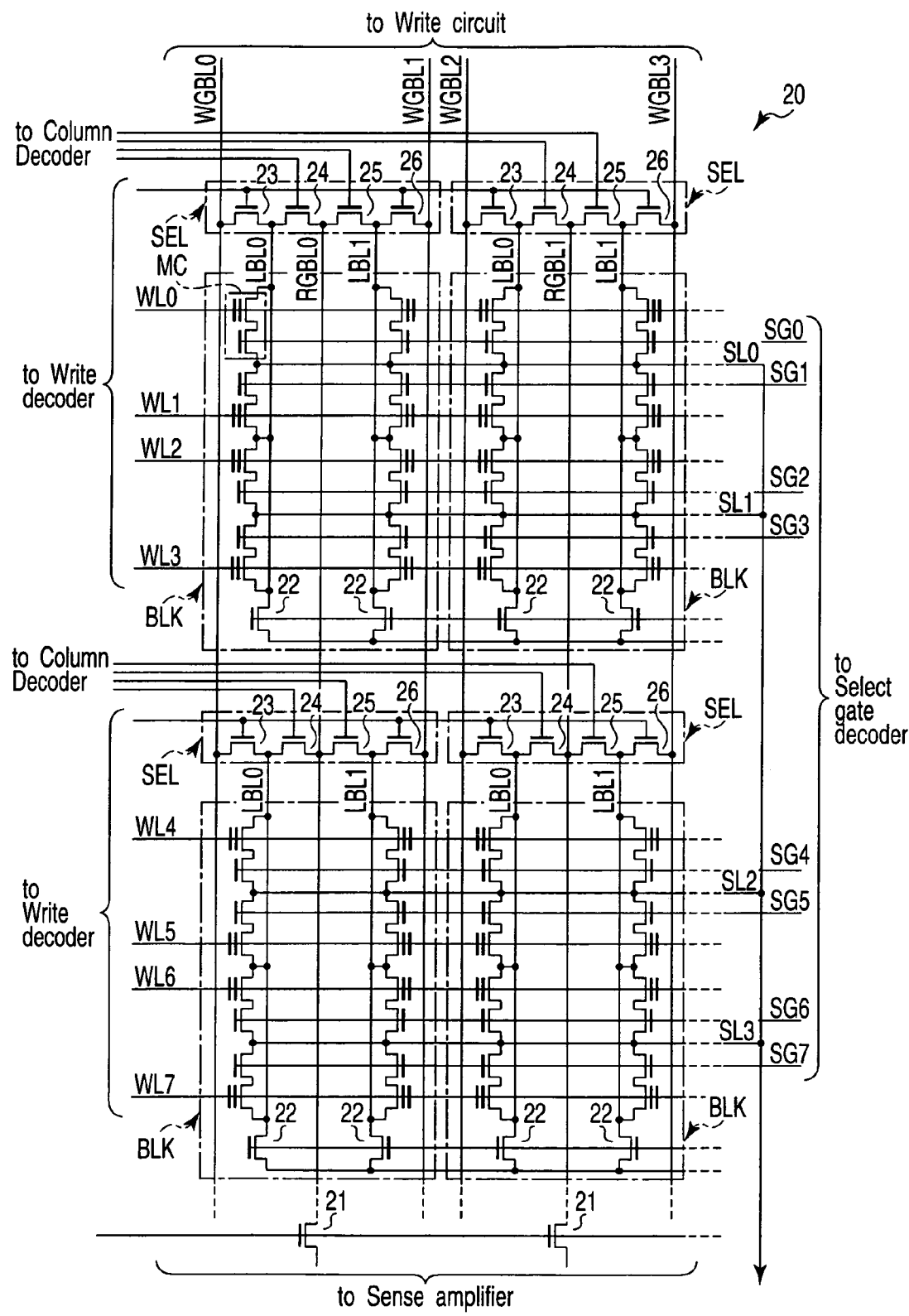
F I G. 2

AFTER ERASE OPERATION

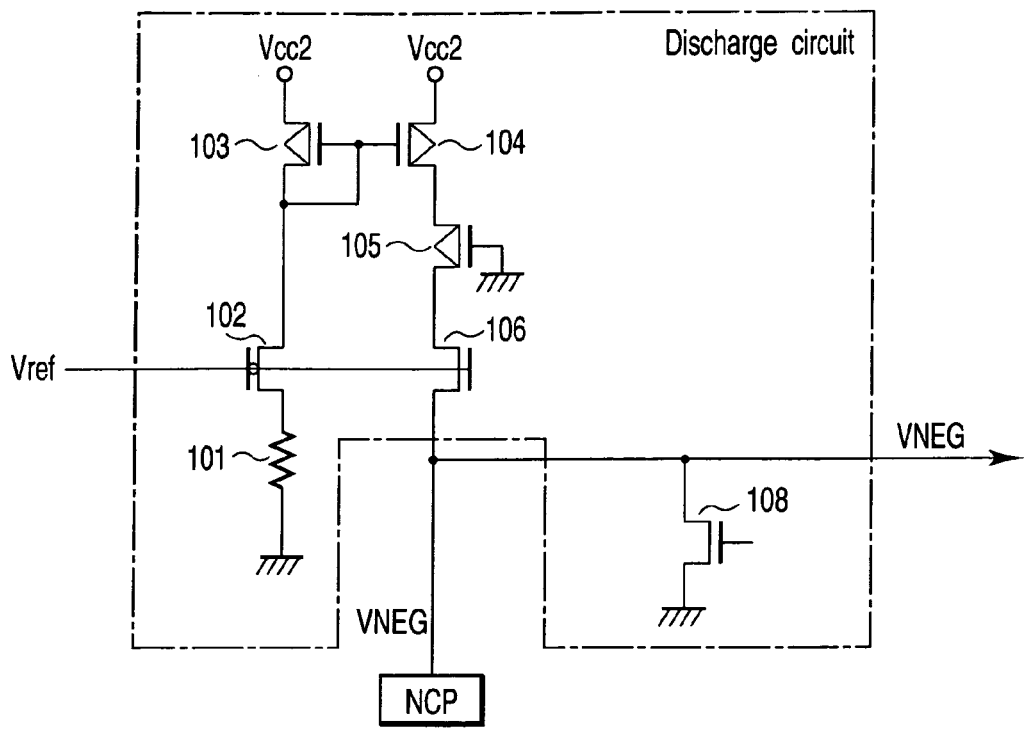
F I G. 17
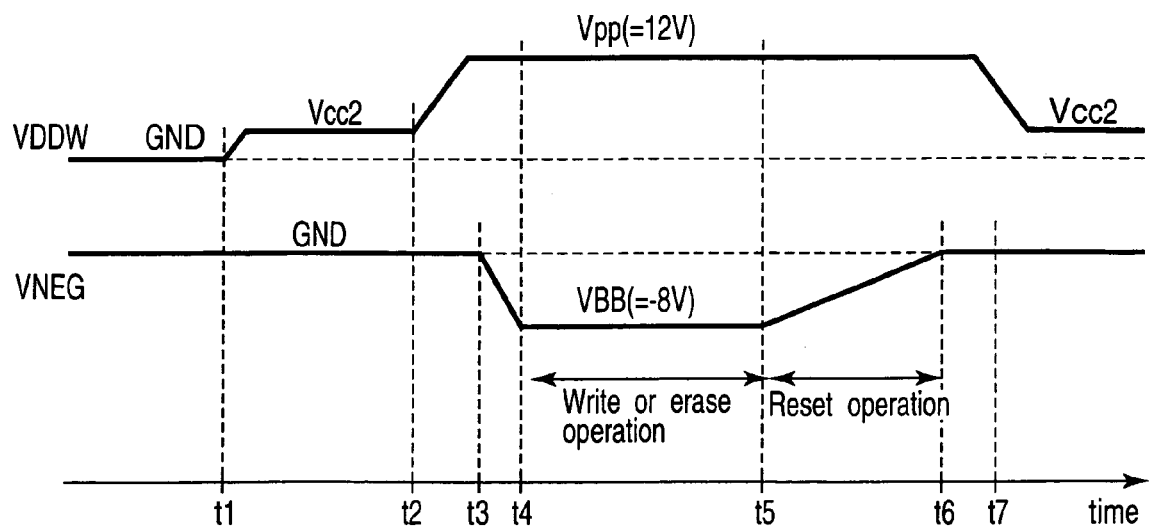
F I G. 18

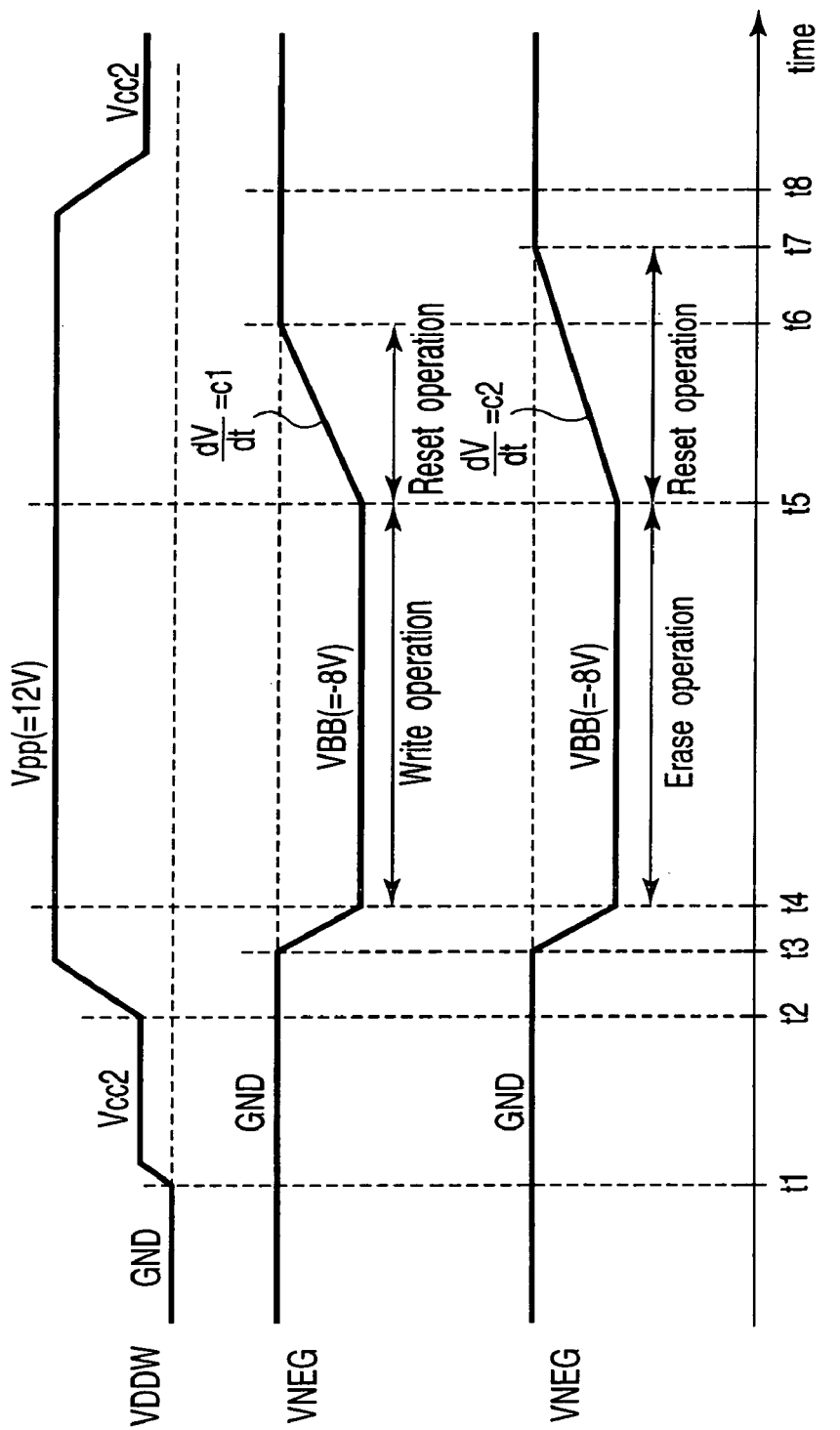
F I G. 2 0

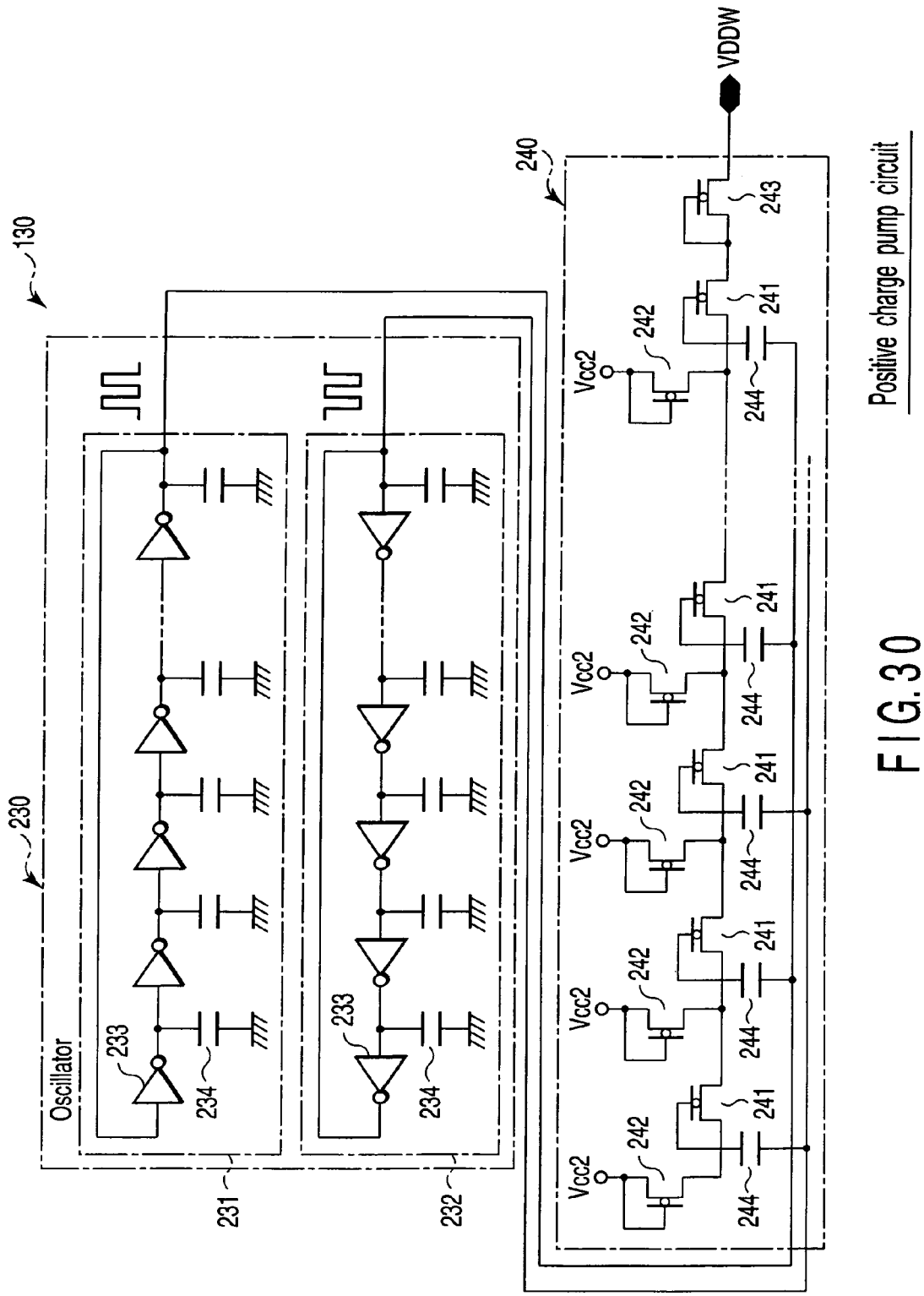
F I G. 30

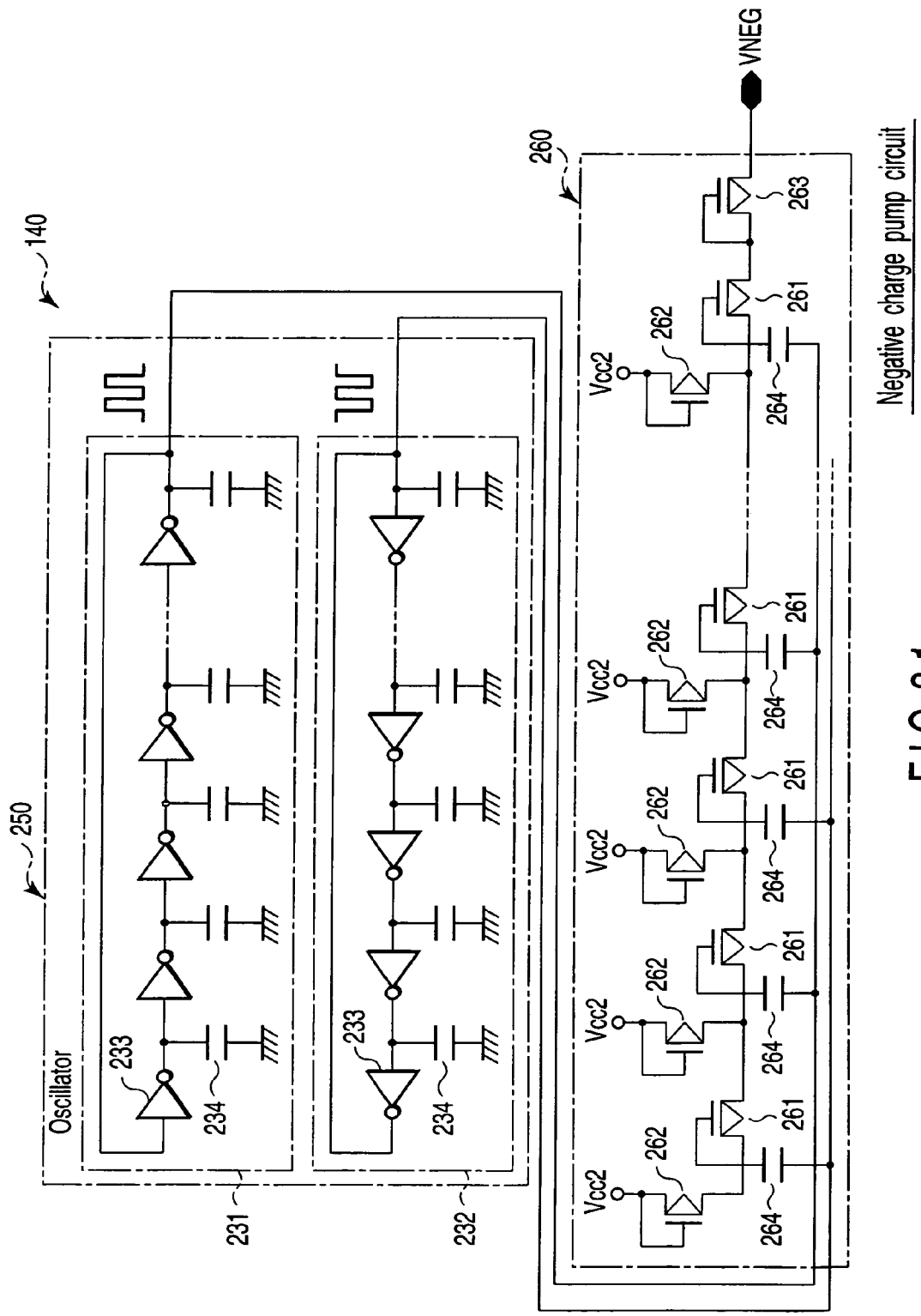
F I G. 31

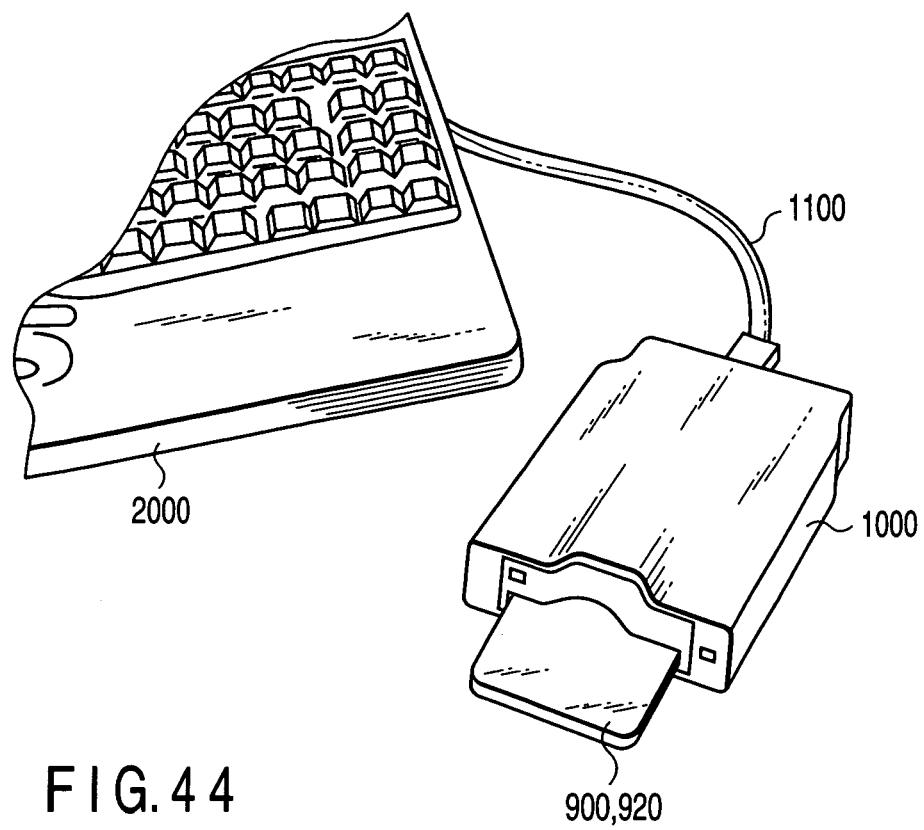
F I G. 4 4
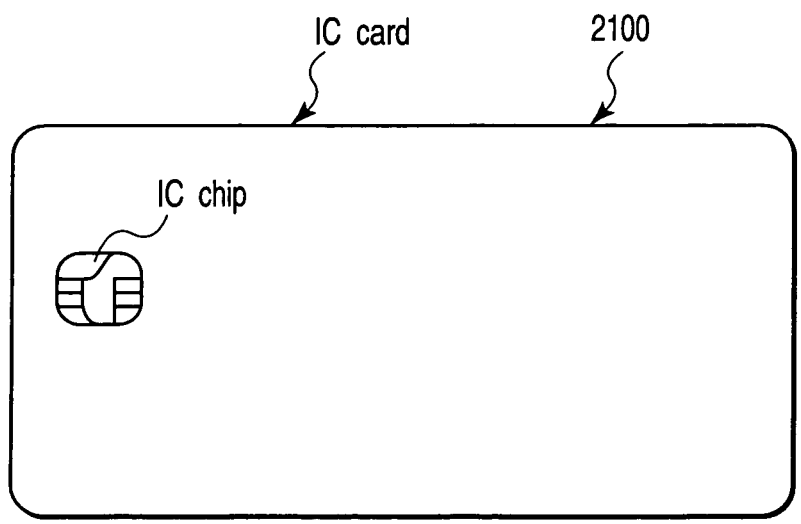
F I G. 4 5

SEMICONDUCTOR MEMORY DEVICE INCLUDING FLOATING GATES AND CONTROL GATES, CONTROL METHOD FOR THE SAME, AND MEMORY CARD INCLUDING THE SAME

CROSS-REFERENCE TO RELATED APPLICATIONS

This application is based upon and claims the benefit of priority from prior Japanese Patent Application No. 2004-128155, filed Apr. 23, 2004, the entire contents of which are incorporated herein by reference.

BACKGROUND OF THE INVENTION

1. Field of the Invention

This invention relates to a semiconductor memory device, a control method for the semiconductor memory device, and a memory card including the semiconductor memory device. More particularly, this invention relates to a nonvolatile semiconductor memory device including MOS transistors, each having a floating gate and a control gate.

2. Description of the Related Art

NOR flash memories and NAND flash memories have been widely used as nonvolatile semiconductor memories.

In recent years, a flash memory combining the features of the NOR flash memory and the NAND flash memory has been proposed in, for example, Wei-Hua Liu, "A 2-Transistor Source-select (2TS) Flash EEPROM for 1.8-V-Only Application," Non-Volatile Semiconductor Memory Workshop 4.1, 1997. A flash memory of this type has memory cells, each including two MOS transistors (hereinafter, a flash memory including such memory cells is referred to as a 2Tr flash memory). In a memory cell of a 2Tr flash memory, one MOS transistor functioning as a nonvolatile memory section has a structure including a control gate and a floating gate and is connected to a bit line. The other MOS transistor, which is connected to a source line, is used to select a memory cell.

In flash memories, when the voltages of the word lines and others are reset at the end of a write, read, or erase operation, an adverse effect of coupling must be taken into consideration. Related techniques have been described in, for example, U.S. Pat. No. 6,373,749 and in Shigeru Atsumi et al., "A Channel-Erasing 1.8-V-Only 32 Mb NOR Flash EEPROM with a Bit-Line Direct-Sensing Scheme," IEEE International Solid-State Circuits Conference/SESSION 16/NON-VOLATILE and SRAM/PAPER TP 16.7, February, 2000.

BRIEF SUMMARY OF THE INVENTION

A semiconductor memory device according to an aspect of the present invention comprises: memory cells each of which has a first MOS transistor with a stacked gate including a floating gate formed on a gate insulating film on a well region formed in the surface of a semiconductor substrate and a control gate formed on an inter-gate insulating film on the floating gate;
a memory cell array in which the memory cells are arranged in a matrix;
word lines each of which connects commonly the control gates of the first MOS transistors in a same row;
a first charge pump circuit which is activated and generates a first voltage in a write operation and erase operation and which supplies the first voltage to either the well region or the word lines; and
a discharge circuit which, when the first charge pump circuit is deactivated, discharges the charge generated by the first charge pump circuit to ground or to a power-supply potential, while causing current to flow to an output node of the first voltage.

A method of controlling a semiconductor device according to an aspect of the present invention comprises: causing a first charge pump circuit to apply a positive voltage to a first node;
causing a second charge pump circuit to apply a negative voltage to a second node;
writing data into or erasing data from nonvolatile memory cells by using the positive and negative voltages;
deactivating the first charge pump circuit after data is written into or read from the nonvolatile memory cells;
causing a discharge circuit to discharge the charge at the first node to ground or a power-supply potential, while causing current flow to the first node; and
causing the first MOS transistor to connect the first node to ground after the charge at the first node is discharged.

A memory card according to an aspect of the present invention comprises a semiconductor memory device which includes: memory cells each of which has a first MOS transistor with a stacked gate including a floating gate formed on a gate insulating film on a well region formed in the surface of a semiconductor substrate and a control gate formed on an inter-gate insulating film on the floating gate;
a memory cell array in which the memory cells are arranged in a matrix;
word lines each of which connects commonly the control gates of the first MOS transistors in a same row;
a first charge pump circuit which is activated and generates a first voltage in a write operation and erase operation and which supplies the first voltage to either the well region or the word lines; and
a discharge circuit which, when the first charge pump circuit is deactivated, discharges the charge generated by the first charge pump circuit to ground or to a power-supply potential, while causing current to flow to an output node of the first voltage.

BRIEF DESCRIPTION OF THE SEVERAL VIEWS OF THE DRAWING

FIG. 1 is a block diagram of a flash memory according to a first embodiment of the present invention;

FIG. 2 is a circuit diagram of a memory cell array included in the flash memory of the first embodiment;

FIG. 17 is a circuit diagram of a discharge circuit included in a flash memory according to a third embodiment of the present invention;

FIG. 18 is a timing chart for the potentials at node VDDW and node VNEG included in the flash memory of the third embodiment;

FIG. 20 is a timing chart for the potentials at node VDDW and node VNEG included in the flash memory of the fourth embodiment;

FIG. 30 is a circuit diagram of a charge pump circuit included in a flash memory according to a ninth embodiment of the present invention;

FIG. 31 is a circuit diagram of a charge pump circuit included in the flash memory of the ninth embodiment;

FIG. 44 shows an outward appearance of a connection unit for connecting with a memory card including a flash memory according to the first to tenth embodiments;

FIG. 45 shows an outward appearance of an IC card including a flash memory according to the first to tenth embodiments.

DETAILED DESCRIPTION OF THE INVENTION

Figure 3:
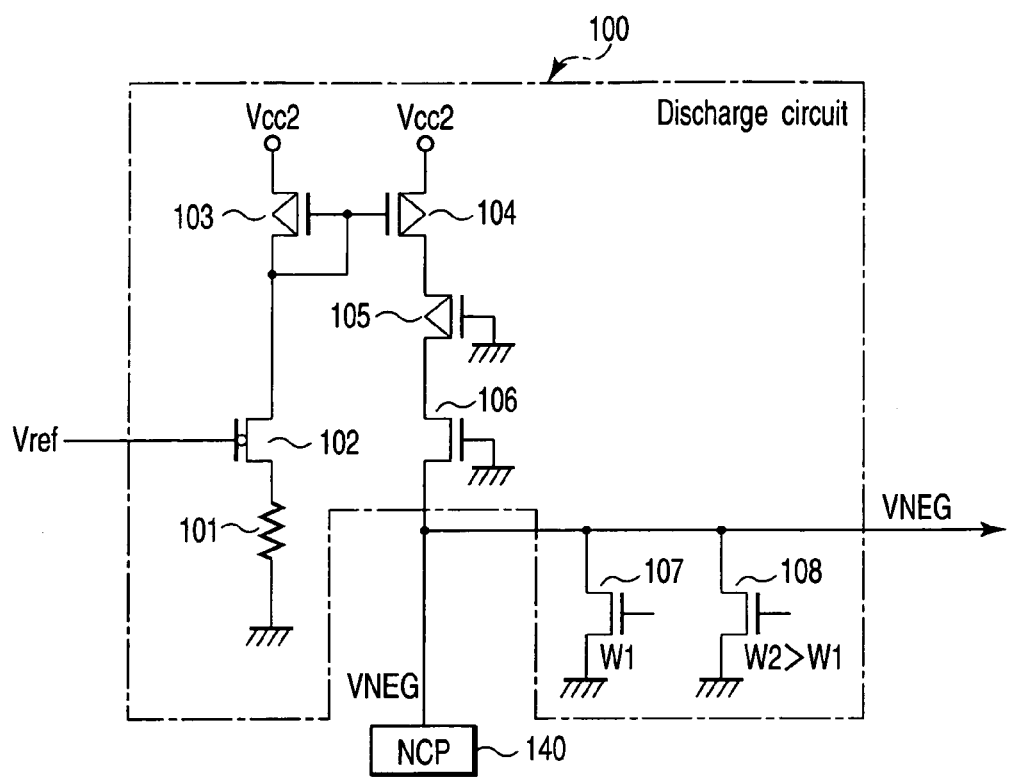
FIG. 3 is a circuit diagram of a discharge circuit included in the flash memory of the first embodiment.

A semiconductor memory device according to a first embodiment of the present invention and a control method for the semiconductor memory device will be explained by reference to FIG. 1. FIG. 1 is a block diagram of a flash memory according to the first embodiment.

As shown in FIG. 1, a flash memory 10 comprises a memory cell array 20, a write decoder 30, a select gate decoder 40, a column decoder 50, a write circuit 60, a sense amplifier 70, a source line driver 80, an address buffer 90, a discharge circuit 100, a reference voltage generator 110, charge pump circuits 120 to 140.

The memory cell array 20 has a plurality of memory cells arranged in a matrix. The configuration of the memory cell array 20 will be explained by reference to FIG. 2. FIG. 2 is a circuit diagram of a part of the memory cell array 20.

As shown in FIG. 2, the memory cell array 20 has ((m+1)×(n+1)) memory cell blocks BLKs (m and n are natural numbers), selectors SELs provided for the memory cell blocks BLKs in a one-to-one correspondence, and MOS transistors 21. Although only (2×2) memory cell blocks BLKs are shown in FIG. 2, the number is illustrative and not restrictive.

Each of the memory cell blocks includes a plurality of memory cells MCs. Each of the memory cells MCs includes a memory cell transistor MT and a select transistor ST, which have their current paths connected in series. The memory cell transistor MT has a stacked gate structure that includes a floating gate formed above a semiconductor substrate with a gate insulating film interposed therebetween and a control gate formed on the floating gate with an inter-gate insulating film interposed therebetween. The floating gates are separated on a memory cell transistor MT basis. Like the memory cell transistor MT, the select transistor ST has a stacked gate structure. However, the select transistor ST differs from the memory cell transistor MT in that the floating gates adjoining in the row direction are connected to one another and the floating gate and control gate are connected to each other electrically. Hereinafter, the stacked gates of the select transistors STs are just referred to as the gates. The source region of the memory cell transistor MT is connected to the drain region of the select transistor ST. Each memory cell block includes (4×2) memory cells with the above configuration. Although the number of memory cells arranged in the column direction is 4 in FIG. 1, the number is illustrative and not restrictive and may be 8 or 16, for example. The memory cells MCs adjoining in the column direction share the source region of the select transistor ST or the drain region of the memory cell transistor MT. The drain regions of the memory cell transistors MTs in two columns of memory cells are connected to two local bit lines LBL0, LBL1, respectively. One end of each of the local bit lines LBL0, LBL1 is connected to the selector SEL and the other ends are connected to the write decoder 30 via the current paths of the MOS transistors 22. In the memory cell array 20, the control gates of the memory cell transistors MTs in a same row are connected commonly to any one of word lines WL0 to WL(4m−1). The gates of the select transistors STs in a same row are connected commonly to any one of select gate lines SG0 to SG(4m−1). The local bit lines LBL0, LBL1 are connected commonly to the memory cell transistors in each of the memory cell blocks BLKs, whereas the word lines WLs and select gate lines SGs are connected commonly to the memory cell transistors and select transistors in a same row across the memory cell blocks. The word lines WL0 to WL(4m−1) are connected to the write decoder 30 and the select gate lines SG0 to SG(4m−1) are connected to the select gate decoder 40. The source regions of the select transistors STs are connected commonly to a plurality of memory cell blocks BLKs and then are connected to the source line driver 80.

Next, the configuration of the selector SEL will be explained. Each of the selectors SELs includes four MOS transistors 23 to 26 connected in series. Specifically, one end of the current path of the MOS transistor 23 is connected to one end of the current path of the MOS transistor 24. The other end of the current path of the MOS transistor 24 is connected to one end of the MOS transistor 25. The other end of the current path of the MOS transistor 25 is connected to one end of the current path of the MOS transistor 26. The gates of the MOS transistors 23, 26 are connected to the write decoder 30 and the gates of the MOS transistors 24, 25 are connected to the column decoder 50. The local bit line LBL0 of a corresponding memory cell block BLK is connected to the junction node of the MOS transistor 23 and MOS transistor 24. The local bit line LBL1 of a corresponding memory cell block BLK is connected to the junction node of the MOS transistor 25 and MOS transistor 26. Furthermore, the other ends of the MOS transistors 23, 26 of the selector SEL are connected to any one of write global bit lines WGBL0 to WGBL(2n−1). Each of the write global bit lines WGBL0 to WGBL(2n−1) is connected commonly to the other ends of the current paths of the MOS transistors 23 or MOS transistors 26 in a same column. One end of each of the write global bit lines WGBL0 to WGBL(2n−1) is connected to the write circuit 60 provided for each write global bit line. To the corresponding junction nodes of the MOS transistors 24 and MOS transistors 25, read global bit lines RGBL0 to RGBL(n−1) are connected. Each of the read global bit lines RGBL0 to RGBL(n−1) is connected commonly to the junction nodes of the MOS transistors 24 and MOS transistors 25 of the selectors SEL in a same column. One end of each of the read global bit lines RGBL0 to RGBL(n−1) is connected to the sense amplifier 70 via the current path of the corresponding MOS transistor 22. The gates of the individual MOS transistors 21 are connected to one another and then connected to the column decoder 50.

The configuration of the memory cell array 20 can also be explained as follows. In the memory cell array 20, a plurality of memory cells MCs are arranged in a matrix. The control gates of the memory cell transistors MCs of the memory cells MCs in a same row are connected commonly to any one of the word lines WL0 to WL(4m−1). The gates of the select transistors of the memory cells in a same row are connected commonly to any one of the select gate lines SG0 to SG(4m−1). The drains of the memory cell transistors MTs of four memory cells MCs connected in series in a same column are connected commonly to any one of the local bit lines LBL0, LBL1. Specifically, the memory cells MCs in the memory cell array 20 are connected to different local bit lines in units of four memory cells MCs arranged in a line. Then, one end of each of the local bit lines in a same row is connected to one another via the MOS transistor 22 and then is connected to the write decoder 30. The other ends of the local bit lines LBL0, LBL1 in a same column are connected commonly to any one of the write global bit lines WGBL0 to WGBL(2n−1) via the MOS transistors 23, 26 respectively and further are connected commonly to any one of the read global bit lines RGB0 to RGBL(n−1) via the MOS transistors 24, 25. Then, the sources of the select transistors STs of the memory cells MCs are connected to one another and then are connected to the source line driver 80. In the memory cell array with the above configuration, two columns of four memory cells MCs connected to the same local bit line form a same memory block BLK. The memory cell blocks in a same column are connected to a common write global bit line and a common read global bit line. The memory cell blocks in a different column are connected to a different common write global bit line and a different common read global bit line.

Referring to FIG. 1, explanation will be continued. The charge pump circuit 120 generates a positive potential. Specifically, the charge pump circuit 120 raises an externally inputted voltage Vcc (1.25 to 1.65V) to an internal voltage Vcc2 (2.5 to 3.6V). Then, the charge pump circuit 120 supplies the internal voltage Vcc2 to the select gate decoder 40, column decoder 50, write circuit 60, discharge circuit 100, and reference voltage generator 110.

The charge pump circuit 130 generates a positive potential. Specifically, the charge pump circuit 130 raises the externally inputted voltage Vcc1 to an internal voltage VPP (e.g., 12V). Then, the charge pump circuit 130 supplies the internal voltage VPP to the write decoder 60. Hereinafter, the output node of the charge pump circuit 130 is referred to as node VDDW.

The charge pump circuit 140 generates a negative potential. Specifically, the charge pump circuit 140 generates an internal voltage VBB on the basis of the externally inputted voltage Vcc1. The internal voltage VBB is, for example, −8V. The charge pump circuit 140 then supplies the internal voltage VBB to the write decoder 30 and write circuit 60. Hereinafter, the output node of the charge pump circuit 140 is referred to as node VNEG.

The write decoder 30 selects any one of the word lines WL0 to WLm in a write operation and supplies a positive voltage to the selected word line. The positive voltage is VPP supplied from node VDDW of the charge pump circuit 130. In a write operation, the write decoder 30 applies a negative voltage to all of the select gate lines SG0 to SGm. The negative voltage is VBB supplied from node VNEG of the charge pump circuit 140. The negative voltage VBB supplied from node VNEG of the charge pump circuit 140 is applied to a well region in which the memory cell array 20 is formed. In a write operation, the write decoder 30 applies a voltage to the MOS transistors 23, 26 in the selector SEL. In addition, the write decoder 30 applies a voltage to the gate of the MOS transistor 22 and the common junction node of the local bit lines.

The select gate decoder 40 selects any one of the select gate lines SG0 to SG(4m−1) in a read operation. Then, the select gate decoder 40 applies the positive voltage Vcc2 supplied from the charge pump circuit 120 to the selected select gate line.

In a read operation, the column decoder 50 selects one of the MOS transistors in the selector SEL and supplies the voltage Vcc2 to the gate of the selected MOS transistor. In addition, the column decoder 50 turns on the MOS transistor 22 in the read operation.

In addition to the decoders, a special circuit may be provided to apply voltages to the gate and source of the MOS transistor 22 and to the MOS transistors 23 to 26 in the selector SEL.

The write circuit 60 latches write data.

The sense amplifier 70 amplifies read-out data.

The source line driver 80 supplies a voltage to the source lines.

The address buffer 90 holds an address signal. Then, the address buffer 90 supplies a column address signal CA to the column decoder 50 and a row address signal RA to the write decoder 30 and select gate decoder 40.

The discharge circuit 100 discharges the charge at node VNEG after a write operation or an erase operation.

The reference voltage generator 110 generates a reference voltage of Vref and supplies the reference voltage Vref to the discharge circuit 100.

FIG. 3 is a circuit diagram showing a configuration of the discharge circuit 100. As shown in FIG. 3, the discharge circuit 100 includes a resistive element 101, an intrinsic MOS transistor 102, p-channel MOS transistors 103 to 105, and n-channel MOS transistors 106 to 108.

One end of the resistive element 101 is connected to ground. The source of the MOS transistor 102 is connected to the other end of the resistive element 101. The reference voltage Vref generated by the reference voltage generator 110 is applied to the gate of the MOS transistor 102. The gates of the MOS transistors 103, 104 are connected to each other, thereby forming a current mirror circuit. The sources of the MOS transistors 103, 104 are connected to Vcc2. The drain of the MOS transistor 103 is connected to the drain of the MOS transistor 102 and to the gate of the MOS transistor 103. The drain of the MOS transistor 104 is connected to the source of the MOS transistor 105. The MOS transistor 105 has its gate connected to, for example, ground and its drain connected to the drain of the MOS transistor 106. The MOS transistor 106 has its gate connected to, for example, ground and its source connected to node VNEG. Each of the MOS transistors 107, 108 has its drain connected to node VNEG and its source connected to ground. The MOS transistor 108 is larger in size than the MOS transistor 107 and has a greater current supplying capability than the MOS transistor 107. The MOS transistor 106 has a thicker gate insulating film than the MOS transistors forming memory cells or the MOS transistors 103, 104 forming the current mirror circuit in the discharge circuit 100. The reason is that the MOS transistor 106 is connected directly to node VNEG and the negative potential VBB is applied to node VNEG.

Figure 4:
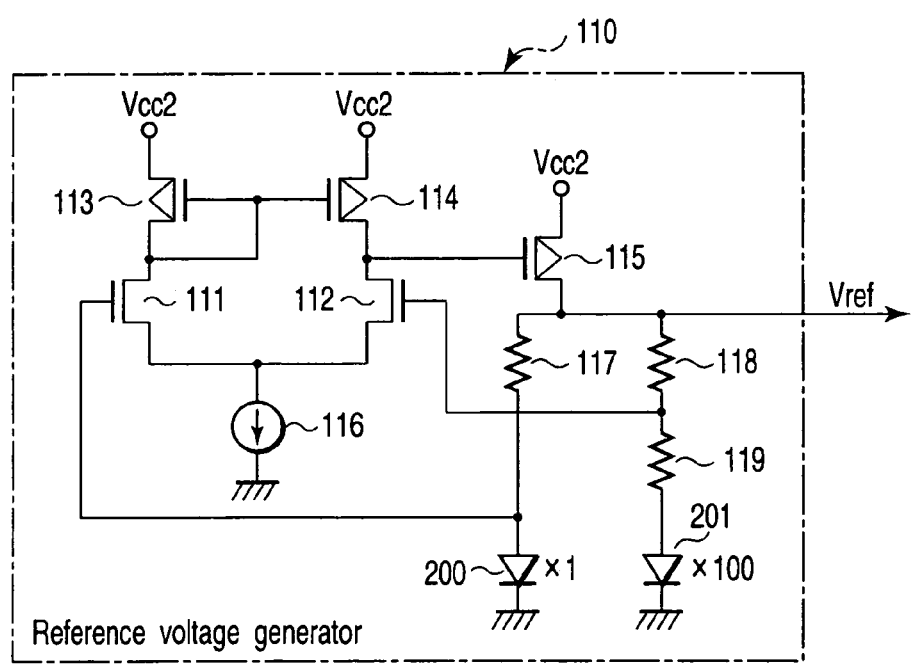
FIG. 4 is a circuit diagram of a reference voltage generator included in the flash memory of the first embodiment.

FIG. 4 is a circuit diagram showing a configuration of the reference voltage generator 110. As shown in FIG. 4, the reference voltage generator 110 includes n-channel MOS transistors 111, 112, p-channel transistors 113 to 115, a constant-current source 116, resistive elements 117 to 119, and diodes 200, 201.

The gates of the MOS transistors 113, 114 are connected to each other, thereby forming a current mirror circuit. The sources of the MOS transistors 113, 114 are connected to Vcc2. The source of the MOS transistor 113 is connected to the gate of the MOS transistor 113. The drains of the MOS transistors 111, 112 are connected to each other and further connected to the constant-current source 116. The resistive element 117 and diode 200 are connected in series. Specifically, one end of the resistive element 117 is connected to the anode of the diode 200, whose cathode is connected to the ground potential. The resistive elements 118, 119 and a hundred diodes 201 are connected in series. Specifically, one end of the resistive element 118 is connected to one end of the resistive element 119. The other end of the resistive element 119 is connected to the anode of the diode 201. The cathode of the diode 201 is connected to the ground potential. One end of the resistive element 117 and one end of the resistive element 118 are connected to the gates of the MOS transistors 111, 112, respectively. The other end of the resistive element 117 and the other end of the resistive element 118 are connected to each other and then connected to the drain of the MOS transistor 115. The MOS transistor 115 has its source connected to Vcc2 and its gate connected to the drain of the MOS transistor 114. Then, the reference voltage Vref is outputted at the common junction node of the other end of the resistive element 117, the other end of the resistive element 118, and the drain of the MOS transistor 115.

The reference voltage Vref generated by the reference voltage generator 110 is expressed by the following equation:

$$Vref = Vf + (kT/q)\ln(N100/N1)$$

where k is Boltzmann's constant, T is the absolute temperature, Vf is the forward bias of the p-n junction, N100 is the number of diodes 201, and N1 is the number of diodes 200. Since the temperature coefficient of Vf is negative, the number of diodes 200 and the number of diodes 201 are determined so as to offset the coefficient. In the first embodiment, the number of diodes 200 is 1 and the number of diodes 201 is 100. With these numbers, a constant voltage of Vref (about 1.25V in the first embodiment) less affected by a fluctuation in Vcc2 is generated.

Next, the operation of the flash memory configured as described above will be explained.

<Write Operation>

Data is written simultaneously into all of the memory cells connected to any one of the word lines. Either "0" data or "1" data is written, depending on whether electrons are injected into the floating gate of the memory cell transistor MT. Electrons are injected into the floating gate by Fowler-Nordheim (FN) tunneling.

First, in FIG. 1, write data ("1" or "0") is inputted from an I/O terminal (not shown). Then, the write data is inputted to the write circuit 60. The write circuit 60 has latch circuits provided for the write global bit lines in a one-to-one correspondence. Each bit in the write data is inputted to the corresponding latch circuit. If "1" data is stored in the latch circuit, the output of the latch circuit becomes 0V. Conversely, if "0" data is stored in the latch circuit, the output of the latch circuit becomes VBB (−8V). These voltages are applied to the corresponding write global bit lines WGBLs. The negative voltage VBB applied to the latch circuits is supplied via node VNEG from the charge pump circuit 140.

Then, the write decoder 30 selects any one of the word lines WL0 to WL(4m−1). The write decoder 30 then makes all of the select gate lines SG0 to SG(4m−1) unselected and turns off the MOS transistor 22. The positive voltage VPP (e.g., 12V) is applied to the selected word line and the negative voltage VBB is applied to the select gate lines SG0 to SG(4m−1). As a result, all of the select transistors are in the off state. In addition, the write decoder 30 sets the potential VPW of the well region where the memory cell array is formed to the negative voltage VBB. The positive voltage VPP is supplied from the charge pump circuit 130 to the write decoder 30 via node VDDW. The negative voltage VBB is supplied from the charge pump circuit 140 to the write decoder 30 via node VNEG.

Furthermore, the write decoder turns on the MOS transistors 23, 26 in the selector SEL corresponding to the memory cell block BLK including the selected word line. As a result, the write global bit line WGBL and the local bit line LBL are connected electrically. However, the MOS transistors 23, 26 in the selectors SEL corresponding to the memory cell blocks BLKs not including the selected word line are turned off. On the other hand, the column decoder 50 turns off the MOS transistors 24, 25 in all of the selectors SELs. Thus, the read global bit line RGBL is separated electrically from the local bit line LBL.

As a result, a potential corresponding to "1" data or "0" data is applied from the write global bit line to the local bit line LBL of the memory cell block BLK including the selected word line via the MOS transistors 23, 26 in the selector SEL. The potential is applied to the drain region of the memory cell transistor MT. Then, VPP (12V) is applied to the selected word line WL, 0V is applied to the drain region of the memory cell MC into which "1" data is to be written, and VBB (−8V) is applied to the drain region of the memory cell MC into which "0" data is to be written. Therefore, since the potential difference (12V) between the gate and drain of the memory cell MC into which "1" data is to be written is insufficient, no electrons are injected into the floating gate, with the result that the memory cell MC keeps the negative threshold value. On the other hand, since the potential difference between the gate and drain of the memory cell MC into which "0" data is to be written is large (20V), electrons are injected into the floating gate by FN tunneling, with the result that the threshold value of the memory cell MC changes to positive.

Figure 5:
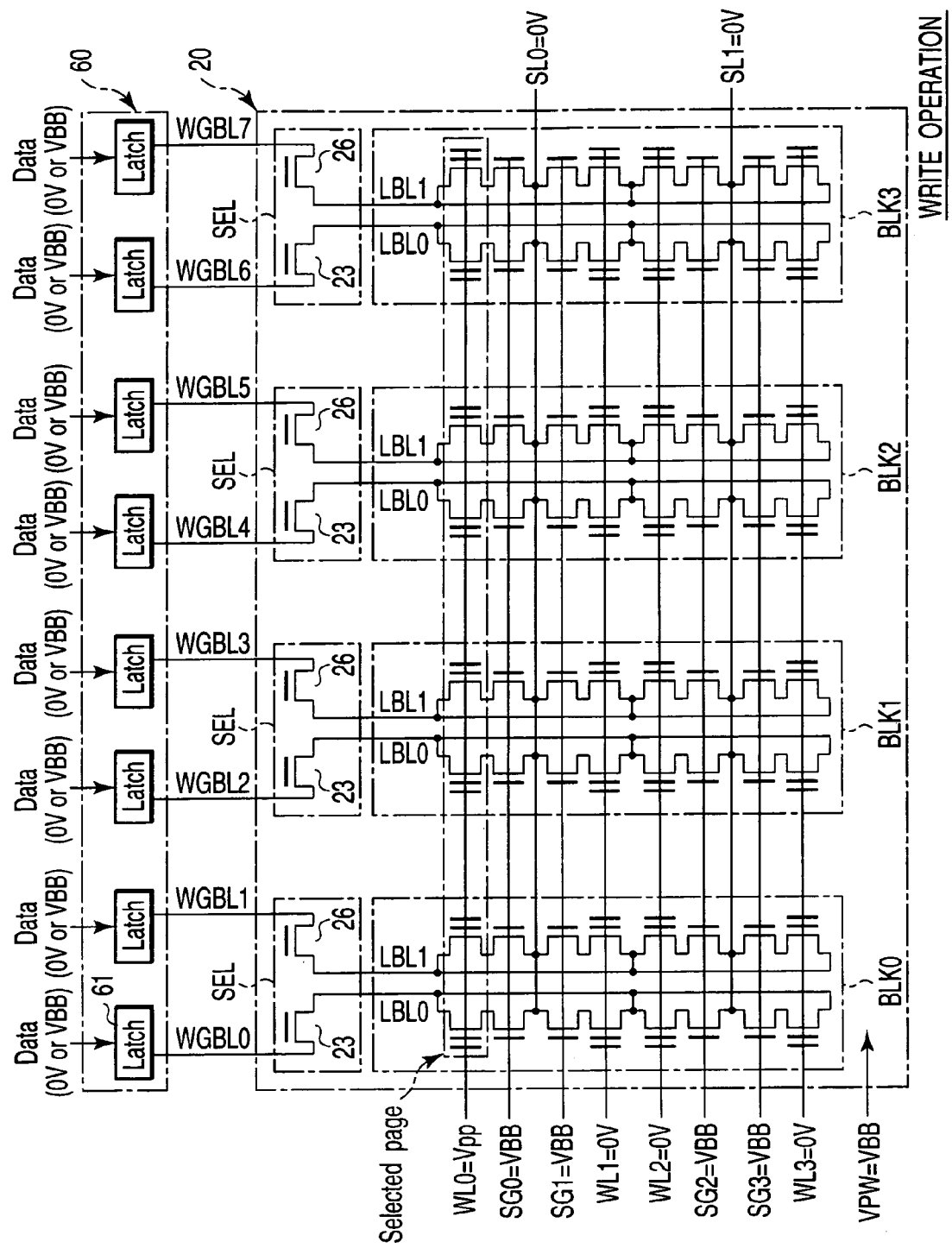
FIG. 5 is a circuit diagram of the memory cell array and write circuit included in the flash memory of the first embodiment, which helps explain a write operation.

In this way, data is written into the memory cells. FIG. 5 is a circuit diagram to help explain the way the data is written into the memory cells MCs connected to word line WL0. There are four memory cell blocks BLKs in the word line direction. The four memory cell blocks BLKs which include word line WL0 are referred to as BLK0 to BLK3. The memory cells MCs connected to word line WL0 are referred to as MC0 to MC7 in sequence.

As shown in FIG. 5, the data to be written into the memory cells MC0 to MC7 are held in the corresponding latch circuits 61. Then, the MOS transistors 23, 26 in the selector SEL are turned on, thereby connecting the write global bit lines WGBL0 to WGBL15 to the local bit lines LBL0, LBL1. As a result, the potential (0V or VBB) corresponding to the write data is applied to the drain regions of the memory cells MC0 to MC7. Since the memory cell blocks excluding the memory cell blocks BLK0 to BLK3 are separated electrically from the write global bit lines WGBL0 to WGBL7, they cannot be seen from the write global bit lines WGBL0 to WGBL7.

Then, VPP is applied to word line WL0 and 0V is applied to the other word lines WL1 to WL3. In addition, VBB is applied to the well region in which the memory cell array is formed. As a result, the data held in the latch circuits 61 are written simultaneously into all of the memory cells MC0 to MC7 connected to word line WL0.

<Read Operation>

In a read operation, data can be read simultaneously from a plurality of memory cells connected to any one of the word lines. Data is read from one memory cell MC per block.

First, in FIG. 1, the select gate decoder 40 selects any one of the select gate lines SG0 to SG(4m−1). A high (H) level (e.g., Vcc2) is supplied to the selected select gate line. The unselected select gate lines are all at a low (L) level (e.g., 0V). Thus, the select transistor ST connected to the selected select gate line is turned on, whereas the select transistors ST connected to the unselected select gate lines are turned off. In addition, the write decoder 30 not only sets all of the word lines WL0 to WL(4m−1) to the low level but also turns off the MOS transistor 22. The source line driver 80 sets the potential of the source line to 0V.

Furthermore, the column decoder 50 turns on one of the MOS transistors 24, 25 in the selector SEL corresponding to the memory cell block BLK including the selected select gate line. As a result, the read global bit lines RGGL0 to RGBL(n−1) are connected to the local bit line LBL0 or LBL1 electrically. The MOS transistors 24, 25 in the selectors SELs corresponding to the memory cell blocks BLKs not including the selected select gate line are turned off. The write decoder 30 turns off the MOS transistors 23, 26 in all of the selectors SELs. As a result, the write global bit line WGBL is separated from the local bit line LBL electrically. The column decoder 50 turns on the MOS transistor 21.

As a result, the local bit line LBL0 or LBL1 is connected to the sense amplifier 70 via the MOS transistor 24 or MOS transistor 25 in the selector SEL and the read global bit lines RGBL0 to RGBL(n−1).

Then, for example, about 1V is supplied to the read global bit lines RGBL0 to RGBL(n−1). Then, since the memory cell transistor MT in the memory cell MC in which "1" data has been written has a negative threshold voltage, it turns on. Therefore, in the memory cell MC connected to the selected select gate line, current flows from the read global bit line RGBL to the source line SL via the local bit line LBL, memory cell transistor MT, and select transistor ST. On the other hand, since the memory cell transistor MT in the memory cell MC in which "0" data has been written has a positive threshold voltage, it turns off. Thus, no current flows in the read global bit line RGBL.

Figure 6:
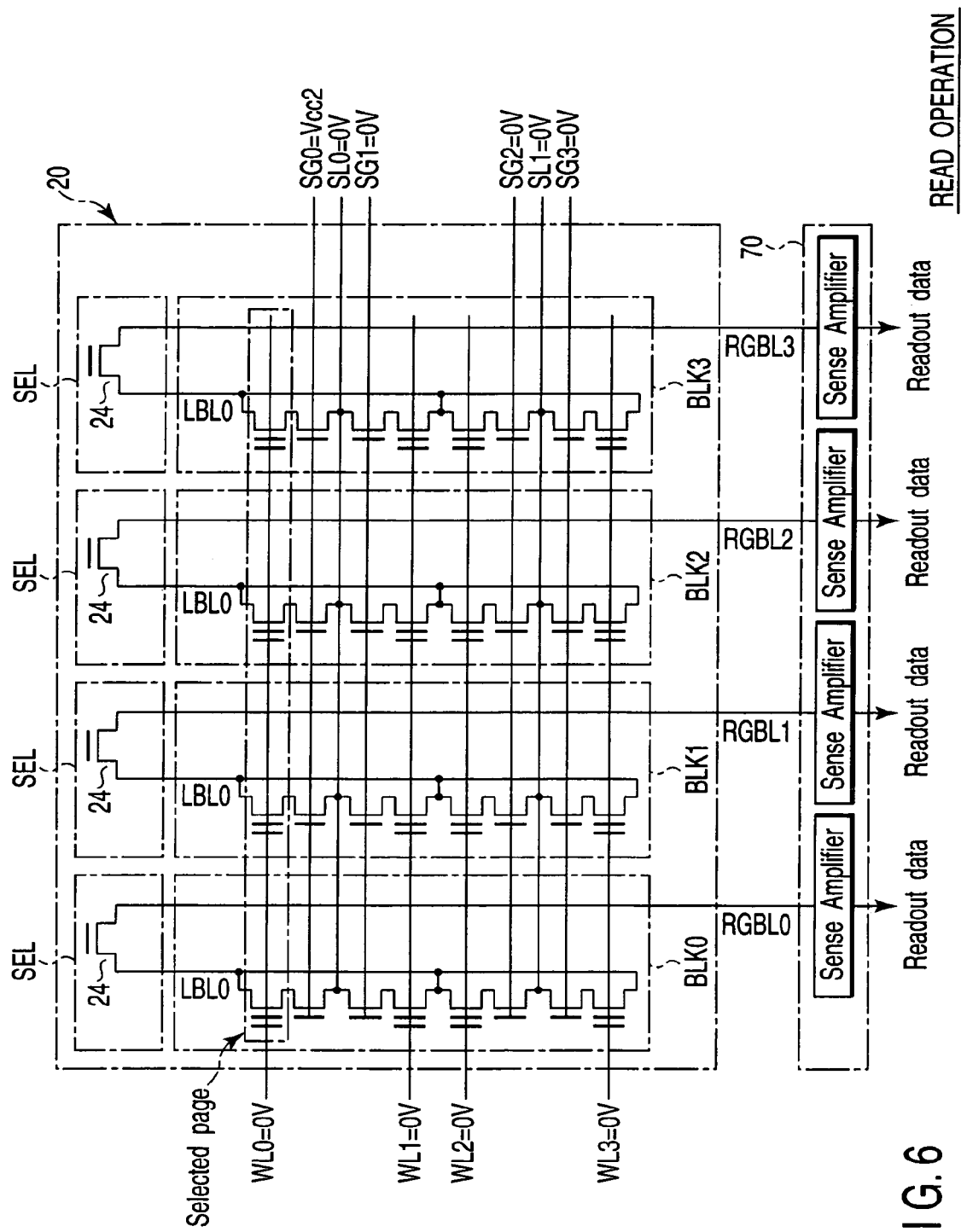
FIG. 6 is a circuit diagram of the memory cell array and sense amplifier included in the flash memory of the first embodiment, which helps explain a read operation.

As described above, the potential on the read global bit line RGBL varies. The variation is amplified by the sense amplifier 70, thereby carrying out the read operation. FIG. 6 is a circuit diagram showing the way the data is read from the memory cells MCs connected to word line WL0 and local bit line LBL0. There are four memory cell blocks BLKs in the word line direction. The four memory cell blocks BLKs which include word line WL0 are referred to as BLK0 to BLK3. The memory cells MCs connected to word line WL0 and to local bit line LBL0 are referred to as MC0 to MC3 in sequence.

As shown in FIG. 6, the MOS transistors 24 in the selectors SELs are turned on, thereby connecting the read global bit lines RGBL0 to RGBL3 to local bit line LBL0. Then, a potential of about 1V is applied to the read global bit lines RGBL0 to RGBL3. Since the memory cell blocks excluding the memory cell blocks BLK0 to BLK3 are separated electrically from the read global bit lines RGBL0 to RGBL3, they cannot be seen from the read global bit lines RGBL0 to RGBL3. Furthermore, in the memory cell blocks BLK0 to BLK3, too, since local bit line LBL1 is separated electrically from the read global bit lines RGBL0 to RGBL3, the memory cells MCs connected to local bit line LBL1 cannot be seen from the read global bit lines RGBL0 to RGBL3.

Then, Vcc2 is applied to select gate line SG0 and 0V is applied to the other select gate lines SG1 to SG3. Current flows through the read global bit lines RGBLs connected to those of the memory cells MC0 to MC3 in which "0" data has been written, with the result that the potentials on the read global bit lines drop. On the other hand, no current flows through the read global bit lines RGBLs connected to the memory cells in which "0" data has been written, with the result that the potentials on the read global bit lines RGDL remain unchanged. As a result, the data are read simultaneously from all of the memory cells MC0 to MC3 connected to word line WL0 and to local bit line LBL0.

In the above example, the data has been read from the memory cells connected to local bit line LBL0. In a case where the data is read from the memory cells connected to local bit line LBL1, the MOS transistors 25 in the selectors SELs are turned on and the MOS transistors 24 are turned off.

<Erase Operation>

Figure 7:
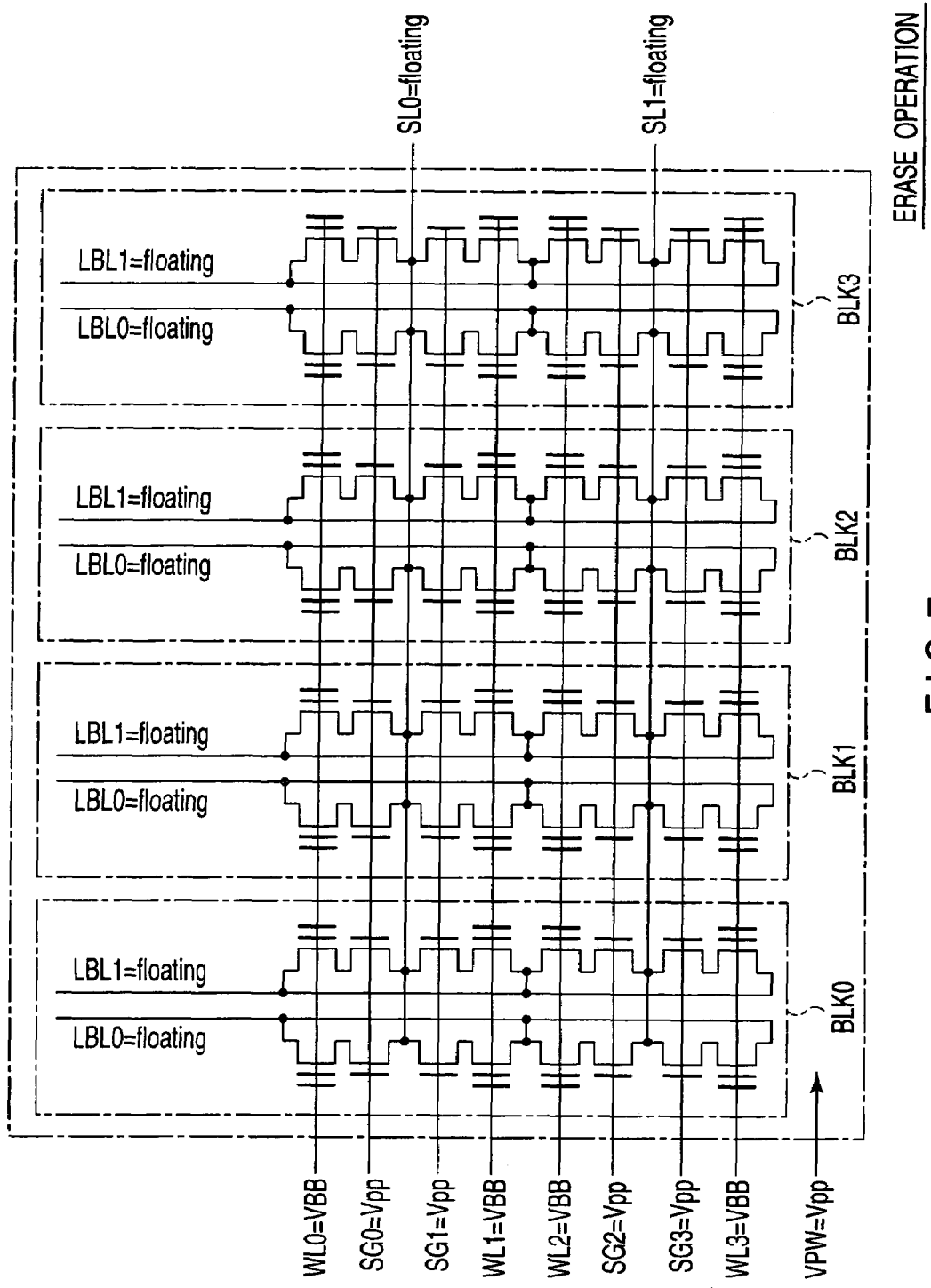
FIG. 7 is a circuit diagram of the memory cell array included in the flash memory of the first embodiment, which helps explain an erase operation.

The data in all of the memory cells sharing a well region is erased at the same time. Therefore, in the example of FIG. 2, all the memory cells included in the memory cell array 20 are erased from simultaneously, which is shown in FIG. 7 concretely.

In FIG. 1, the write decoder 30 sets all of the word lines WL0 to WL(4m−1) to the negative potential VBB and the potential VPW of the well region in which the memory cell array is formed to the positive potential VPP. In addition, the write decoder 30 sets the select gate lines SG0 to SG(4m−1) to the positive potential VPP. Of course, the negative potential VBB and the positive potential VPP are supplied to the write decoder 30 via node VNEG and VDDW, respectively. As a result, electrons are pulled out of the floating gates of the memory cell transistors of the memory cells MCs into the semiconductor substrate by FN tunneling. Consequently, the threshold voltages of all of the memory cells MCs become negative, thereby erasing the data. In the erase operation, the local bit lines LBL0, LBL1, and source lines are put in the floating state.

<Reset Operation>

Figure 8:
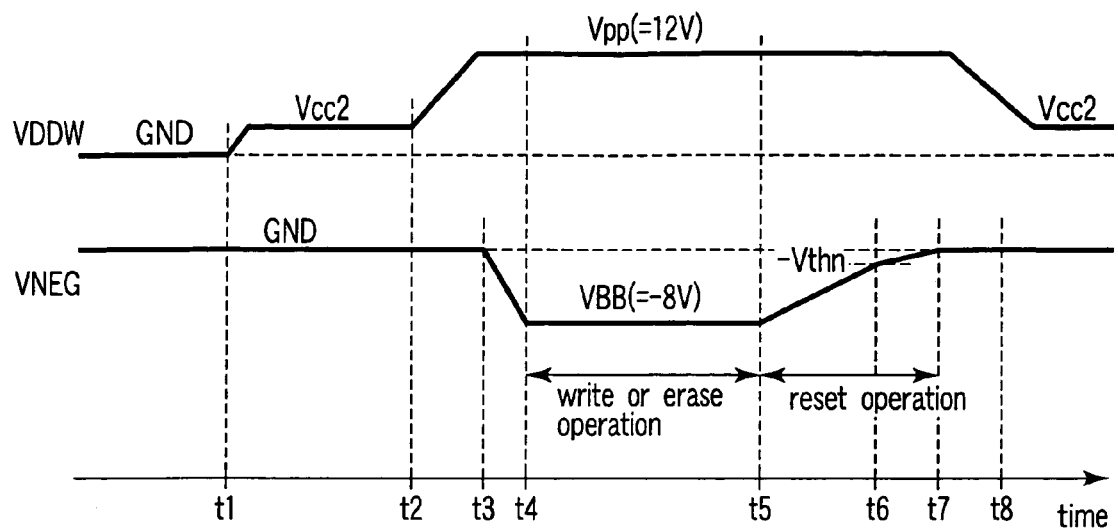
FIG. 8 is a timing chart for the potentials at node VDDW and node VNEG included in the flash memory of the first embodiment.

A reset operation is for setting the potentials of node VDDW and node VNEG at 0V when the charge pump circuits 130, 140 have been deactivated after a write operation or an erase operation. A reset operation is carried out mainly by the discharge circuit 100. Hereinafter, in parallel with an explanation of changes in the potentials at node VDDW and node VNEG with the passage of time, a reset operation will be explained. FIG. 8 is a timing chart for the potentials at node VDDW and node VNEG.

First, before time t1 at which a write operation or an erase operation is started, the charge pump circuits 130, 140 are deactivated. Thus, the potentials at node VDDW and node VNEG are at 0V. The reference voltage generator 110 does not supply the reference voltage Vref to the discharge circuit 100.

To carry out a write operation or an erase operation, the charge pump 130 is activated at time t1. Specifically, the charge pump circuit 130 generates Vcc2 and then generates the positive voltage VPP (=12V) on the basis of Vcc2 (at time t2). After the potential at node VDDW reaches VPP, the charge pump circuit 140 is activated.

Figure 9:
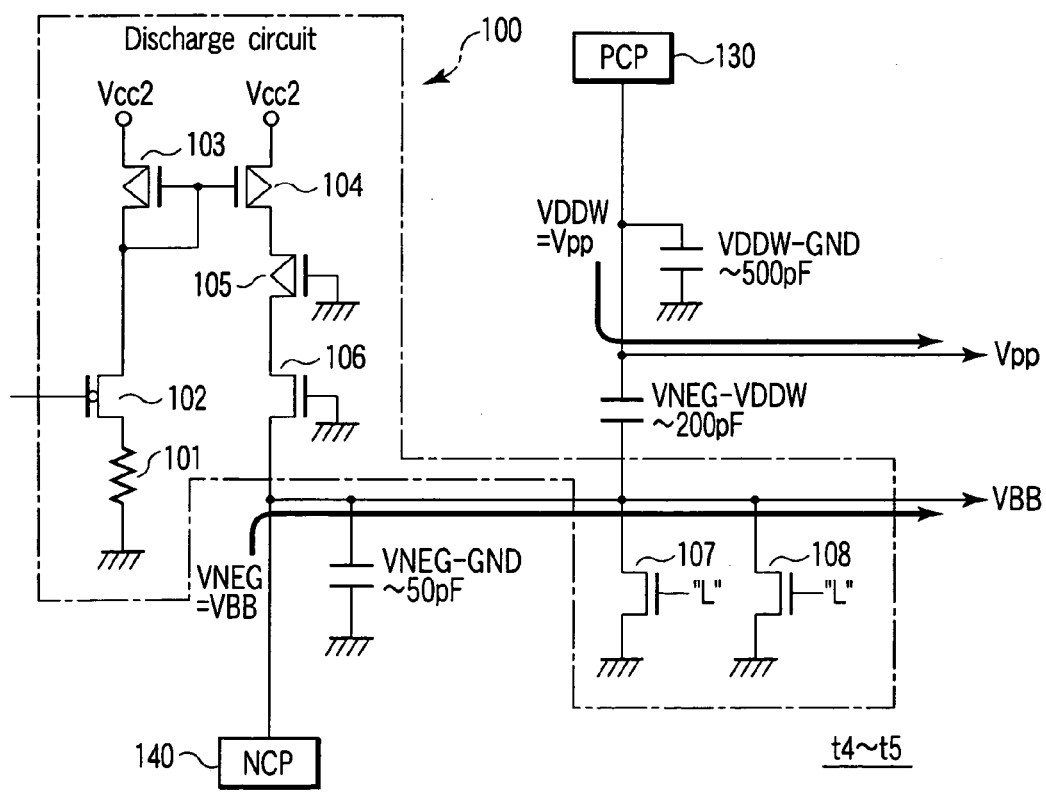
FIG. 9 is a circuit diagram of the discharge circuit in a write operation or an erase operation of the flash memory according to the first embodiment.

The charge pump circuit 140, when being activated, generates the negative potential VBB (=−8V) (time t3). When the potential at node VNEG has reached VBB (time t4), a write operation or an erase operation is carried out (time t4 to time t5), which is shown in FIG. 9. FIG. 9 shows the discharge circuit 100 and charge pump circuits 130, 140.

Specifically, the positive potential VPP and negative potential VBB outputted from the charge pump circuits 130, 140 are supplied to the write decoder 30 via node VDDW and node VNEG, respectively, and further applied to the word lines, select gate lines, and well regions.

After the write operation or erase operation is completed (time t5), then a reset operation is carried out. First, with the potential at node VDDW kept at VPP, the potential at node VNEG is returned to 0V. Hereinafter, a method of returning the potential at node VNEG to 0V will be explained in detail.

Figure 10:
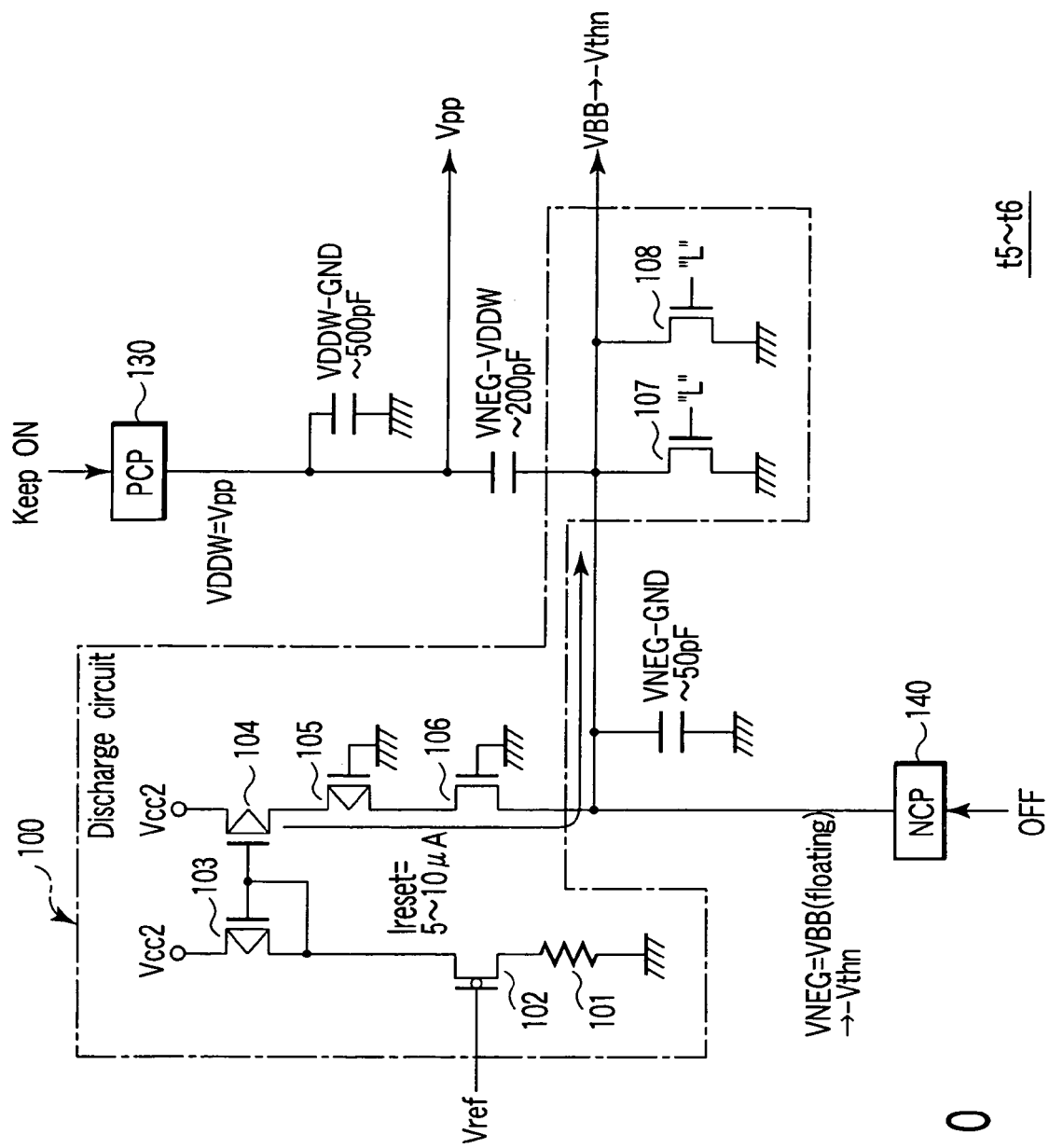
FIG. 10 is a circuit diagram of the discharge circuit in a reset operation of the flash memory according to the first embodiment.

First, the charge pump circuit 140 is deactivated. Thus, node VNEG goes into the floating state at VBB. Then, the reference voltage generator 110 supplies the reference voltage Vref to the discharge circuit 100. Then, the current mirror circuit formed of the MOS transistors 103, 104 supplies a constant current Ireset (=α·Vref/R1) according to the reference voltage Vref and the resistance value R1 of the resistive element 101. Ireset is, for example, about 5 to 10 μA. Since the potential at node VNEG at time t5 is VBB, the n-channel MOS transistor 106 is in the on state. Thus, Ireset flows into node VNEG, which is shown in FIG. 10. As a result, the charge at node VNEG is discharged to the Vcc2 node. For example, the charge accumulated in the parasitic capacitance between node VNEG node and GND or in the parasitic capacitance between node VNEG and node VDDW moves to the Vcc2 node. Consequently, as shown in the period between time t5 and time t6 in FIG. 8, the potential at node VNEG rises from VBB at a constant rate.

Figure 11:
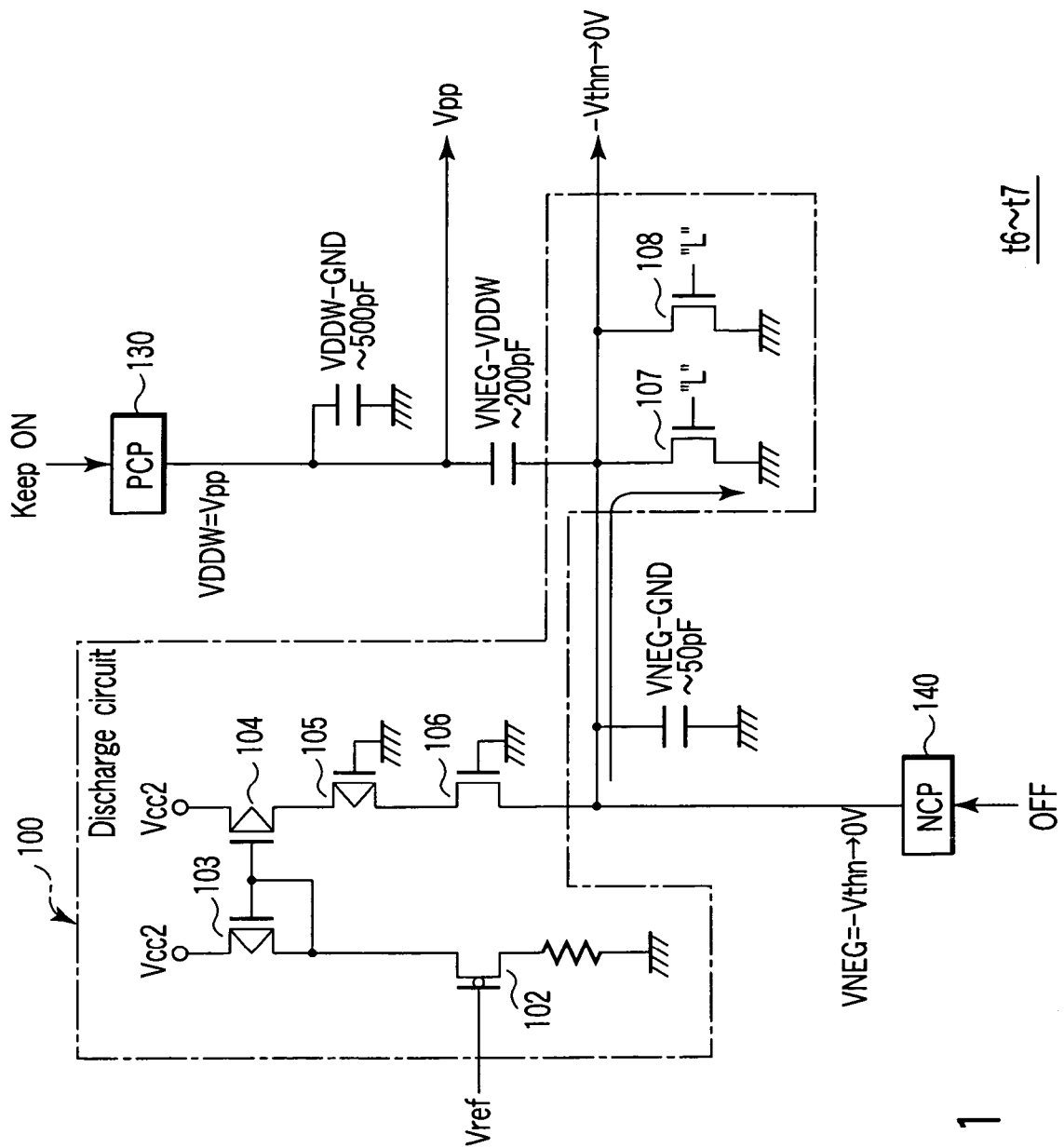
FIG. 11 is a circuit diagram of the discharge circuit in a reset operation of the flash memory according to the first embodiment.

When the potential at node VNEG has reached −Vthn at time t6, the MOS transistor 106 is cut off. Here, Vthn is the threshold voltage of the MOS transistor 106. Thus, Ireset cannot flow into node VNEG. Then, at time t6, the MOS transistor 107 is turned on, which is shown in FIG. 11. As a result, node VNEG is connected to GND, thereby releasing the charge to GND.

Figure 12:
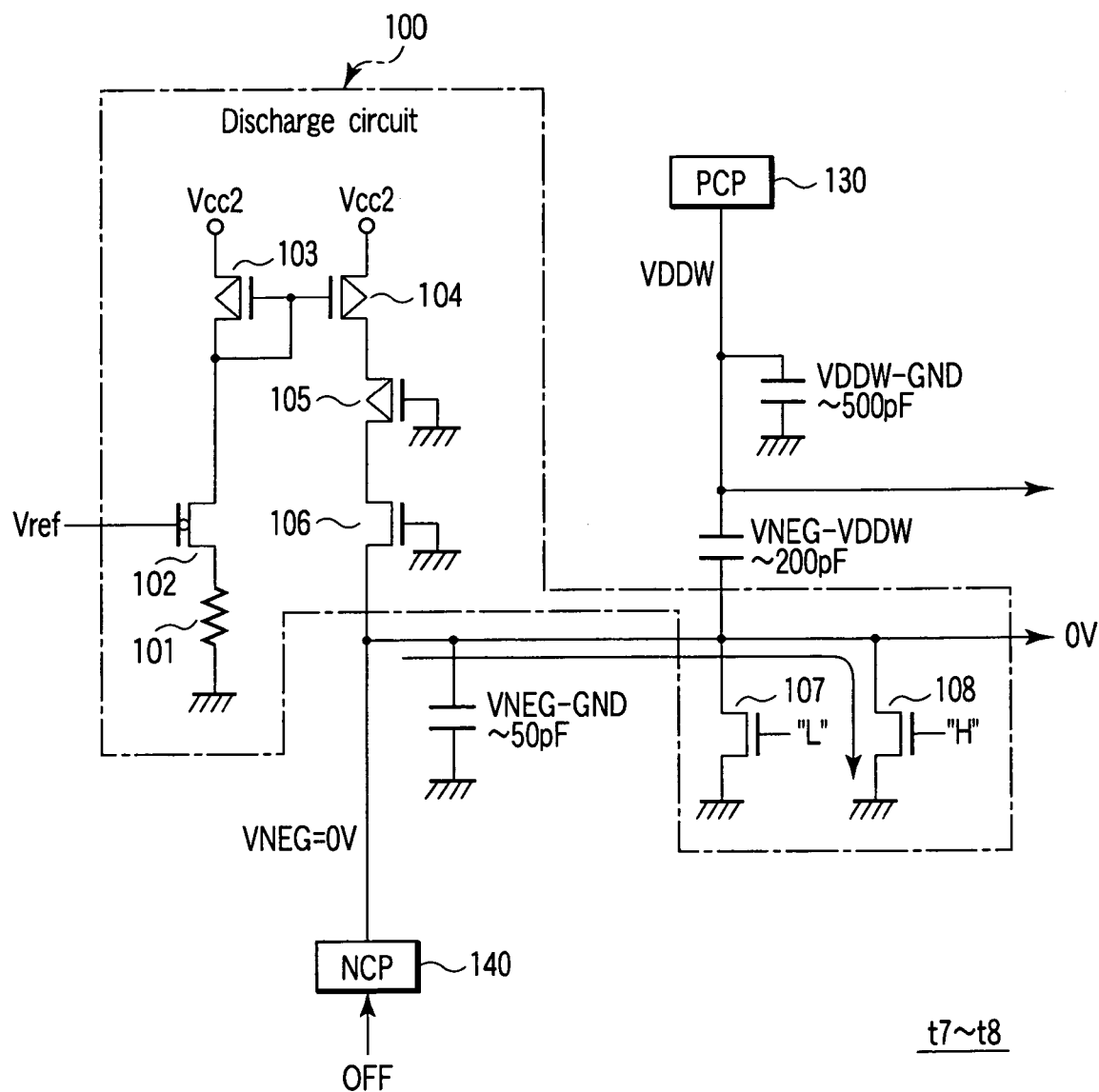
FIG. 12 is a circuit diagram of the discharge circuit in a reset operation of the flash memory according to the first embodiment.

As a result of releasing the charge to GND, the potential at node VNEG becomes 0V (time t7). Thereafter, as shown in FIG. 12, the MOS transistor 108 is turned on at time t8, which forces node VNEG node to connect to GND.

After node VNEG is set to 0V, the potential at node VDDW is set to Vcc2 and thereafter is set to 0V.

As a result, the potentials at node VNEG and node VDDW are reset to 0V.

As described above, the flash memory of the first embodiment produces the effects in the following items (1) to (3):

(1) The effect of coupling noise can be reduced.

Hereinafter, this effect will be explained. There is a parasitic capacitance Cparas between the word lines and other terminals. Therefore, when the word lines are reset from VPP or VBB to 0V, a transient current of I=Cparas·(dV/dt) flows due to coupling. Here, dV/dt is a differential of the word line voltage with respect to time, showing the degree of change in the voltage of the word line. With the configuration of the first embodiment, the discharge circuit 100 for discharging the charge at node VNEG is provided. Then, the discharge circuit 100 discharges the charge accumulated in the parasitic capacitance at node VNEG, while supplying the current Ireset to node VNEG. At this time, since the current Ireset is generated on the basis of the reference voltage Vref, it is a constant current less affected by, for example, fluctuations in the power supply voltage. Thus, the potential at node VNEG varies with a constant gradient. Then, the potential at node VNEG can be changed gently as compared with a case where, for example, node VNEG is connected directly to GND. In other words, dV/dt in the above equation can be made smaller. Thus, node VNEG node can be reset to 0V with minimum coupling noise.

(2) The circuit design can be simplified.

With the first embodiment, node VNEG is reset using only the discharge circuit 100 and reference voltage generator 110. Therefore, the logic of other circuits need not be altered. Accordingly, the configuration of the peripheral circuits, including the decoders, may remain unchanged, which enables node VNEG to be reset, while simplifying the circuit design.

(3) Noise resistance of node VNEG can be improved.

In the first embodiment, the discharge circuit 100 includes the MOS transistor 107, 108. When the potential at node VNEG is raised by the current Ireset to such an extent that, for example, the potential at node VDDW or the like does not vary due to coupling, more particularly, when the potential at node VNEG has reached −Vthn, the MOS transistor 107 is turned on. As a result, the potential at node VNEG becomes 0V. Thereafter, the MOS transistor 108 with a higher current supplying capability than that of the MOS transistor 107 connects node VNEG to the ground potential node. Therefore, node VNEG is forced to connect to GND, which improves the noise resistance of node VNEG.

Figure 13:
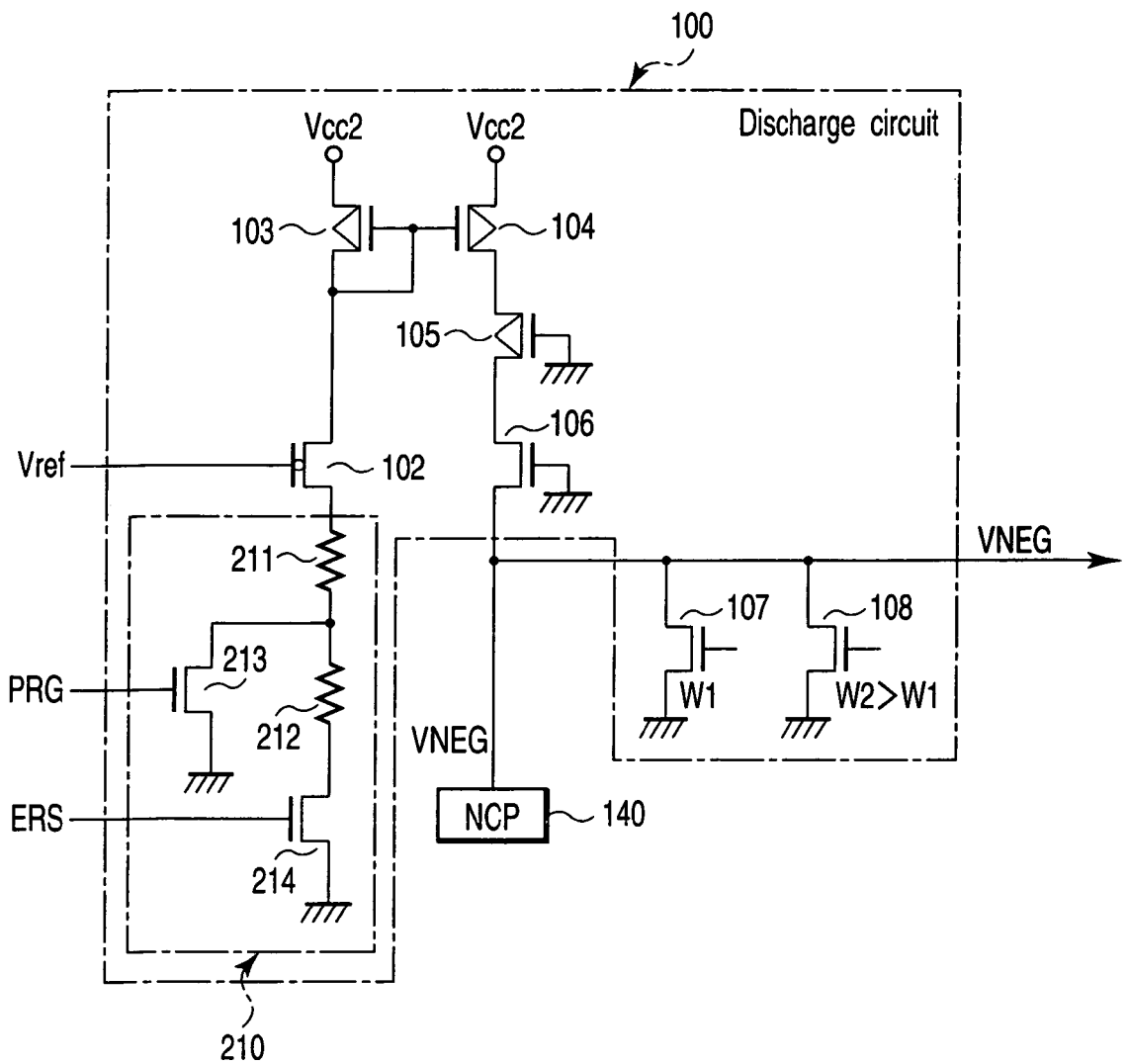
FIG. 13 is a circuit diagram of a discharge circuit included in a flash memory according to a second embodiment of the present invention.

A semiconductor memory device according to a second embodiment of the present invention and a control method for the semiconductor memory device will be explained. The second embodiment is such that the current value of the current Ireset is changed at the reset operation after a write operation or an erase operation in the first embodiment. FIG. 13 is a circuit diagram of the discharge circuit 100 included in the flash memory 10 of the second embodiment. Since the remaining configuration is the same as that of the first embodiment, it explanation will be omitted.

As shown in FIG. 13, the discharge circuit 100 of the second embodiment uses a current control circuit 210 instead of the resistive element 101 in the configuration explained in the first embodiment. The current control circuit 210 includes resistive elements 211, 212, and n-channel MOS transistors 213, 214.

One end of the resistive element 211 is connected to the source of the MOS transistor 102. The other end of the resistive element 211 is connected to one end of the resistive element 212. The MOS transistor 213 has its drain connected to the junction node of the resistive elements 211, 212 and its source grounded. A write signal PRG is inputted to the gate of the MOS transistor 213. The MOS transistor 214 has its drain connected to the other end of the resistive element 212 and its source grounded. An erase signal ERS is inputted to the gate of the MOS transistor 214. The write signal PRG and erase signal ERS are made high in a write operation and in an erase operation, respectively.

Figure 14:
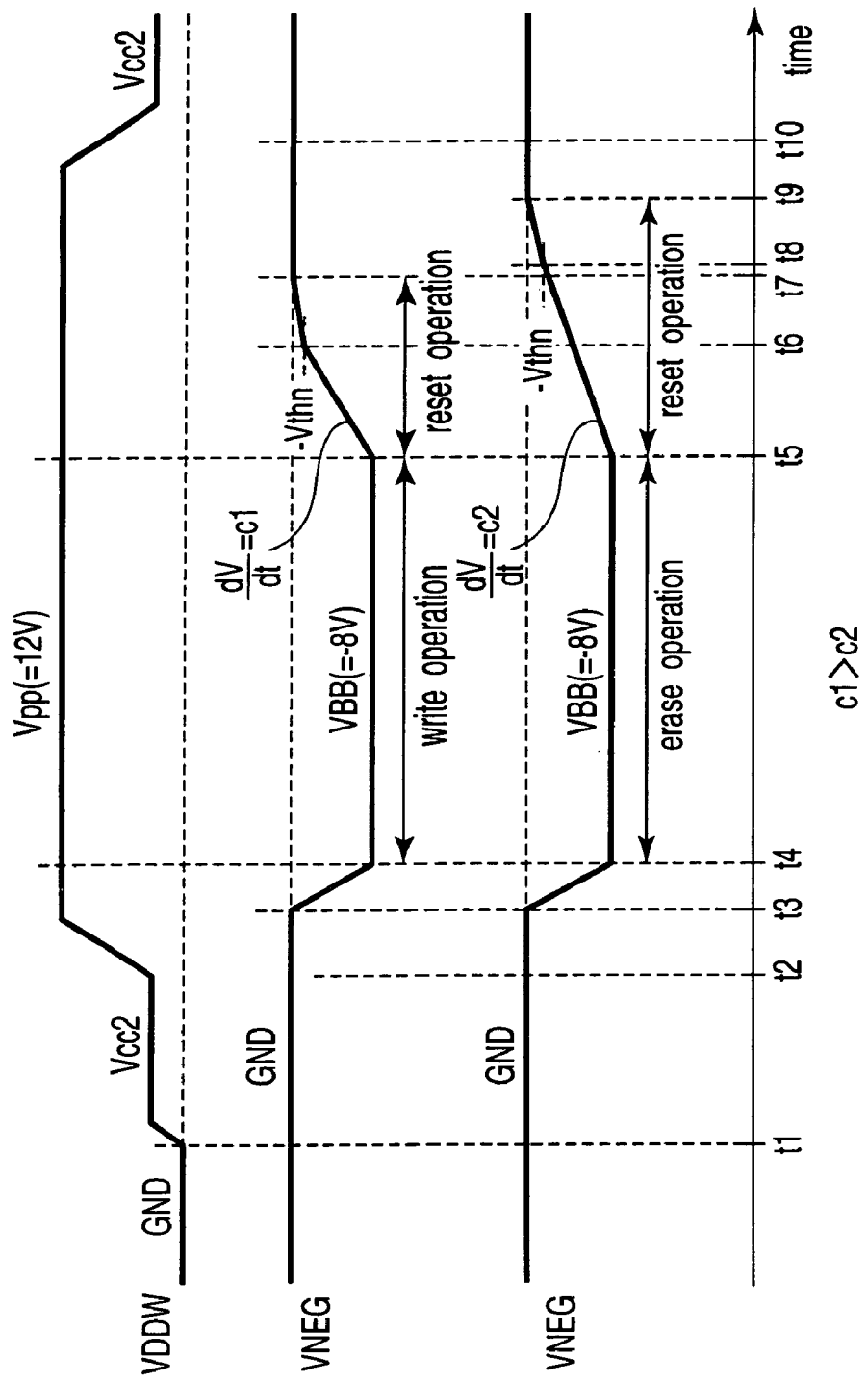
FIG. 14 is a timing chart for the potentials at node VDDW and node VNEG included in the flash memory of the second embodiment.

Next, the operation of the flash memory of the second embodiment will be explained by reference to FIG. 14. FIG. 14 is a timing chart for the potentials at node VDDW and node VNEG. Since the write operation, erase operation, and read operation are the same as in the first embodiment, explanation of them will be omitted. Hereinafter, a reset operation (the operation of returning node VNEG to 0V) after a write operation and a reset operation after an erase operation will be explained separately.

<Reset Operation after Writing>

Figure 15:
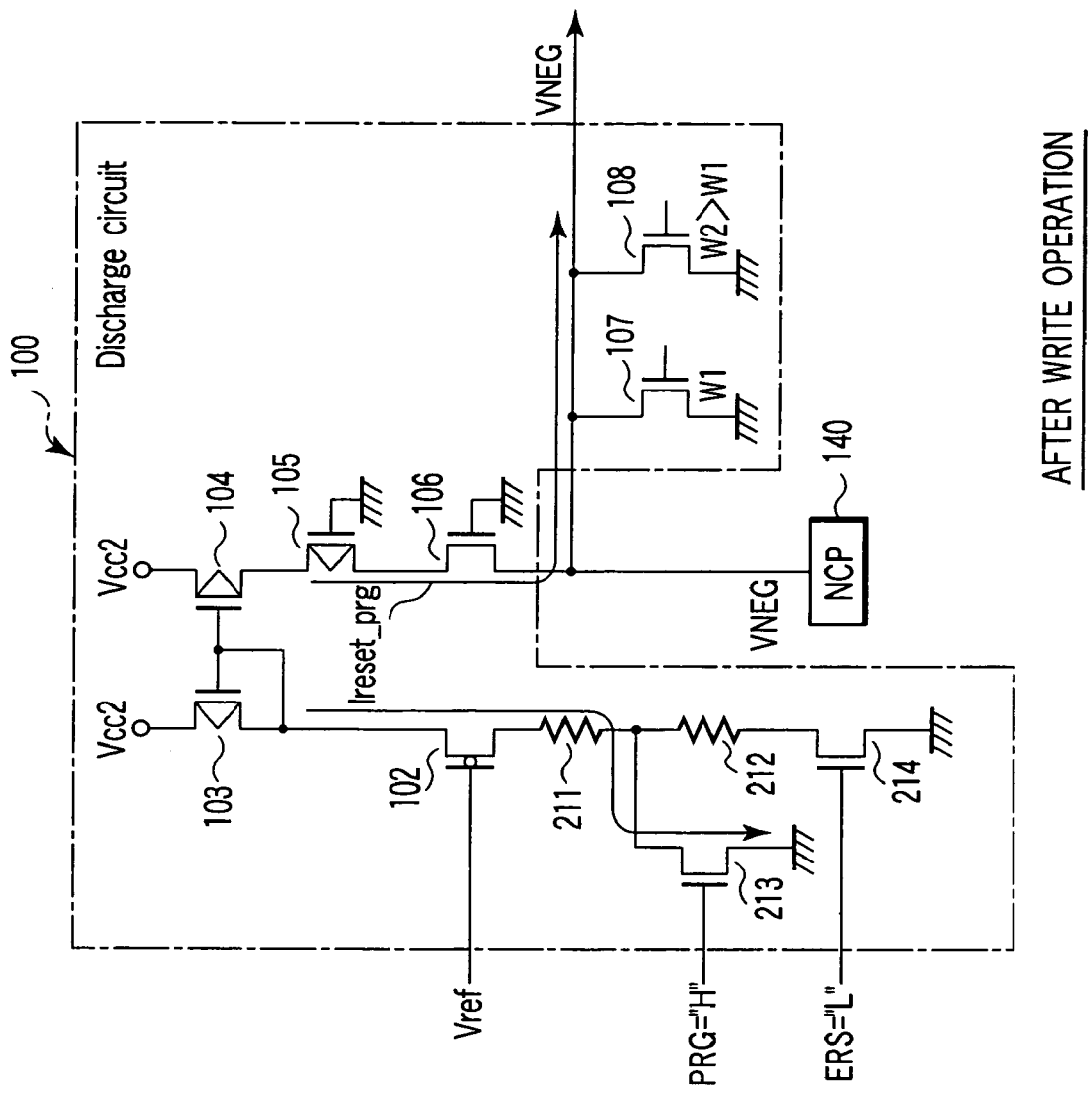
FIG. 15 is a circuit diagram of the discharge circuit in a reset operation after a write operation in the flash memory of the second embodiment.

As shown in FIG. 14, in the period between time t4 and time t5, the charge pump circuit 140 outputs the negative potential VBB to node VNEG. Then, at time t5 when the write operation is completed, a reset operation is started. That is, first, the charge pump circuit 140 is deactivated, with the result that node VNEG goes into the floating state at VBB. Then, the discharge circuit 100 supplies the current Ireset_prg to node VNEG, which is shown in FIG. 15. First, the reference voltage generator 110 supplies the reference voltage Vref to the discharge circuit 100. In addition, the write signal PRG inputted to the gate of the MOS transistor 213 of the discharge circuit is made high and the erase signal ERS inputted to the MOS transistor 214 is made low. Thus, the MOS transistor 213 is turned on and the MOS transistor 214 is turned off. Then, the current mirror circuit formed of the MOS transistors 103, 104 supplies the constant current Ireset_prg ($=\alpha \cdot \text{Vref}/R2$) according to the reference voltage Vref and the resistance value R2 of the resistive element 211.

While the constant current Ireset_prg is being supplied to node VNEG, the charge at node VNEG is discharged. At time t6, the potential at node VNEG reaches −Vthn. The operation after this is the same as explained in the first embodiment.

<Reset Operation after Erasing>

Figure 16:
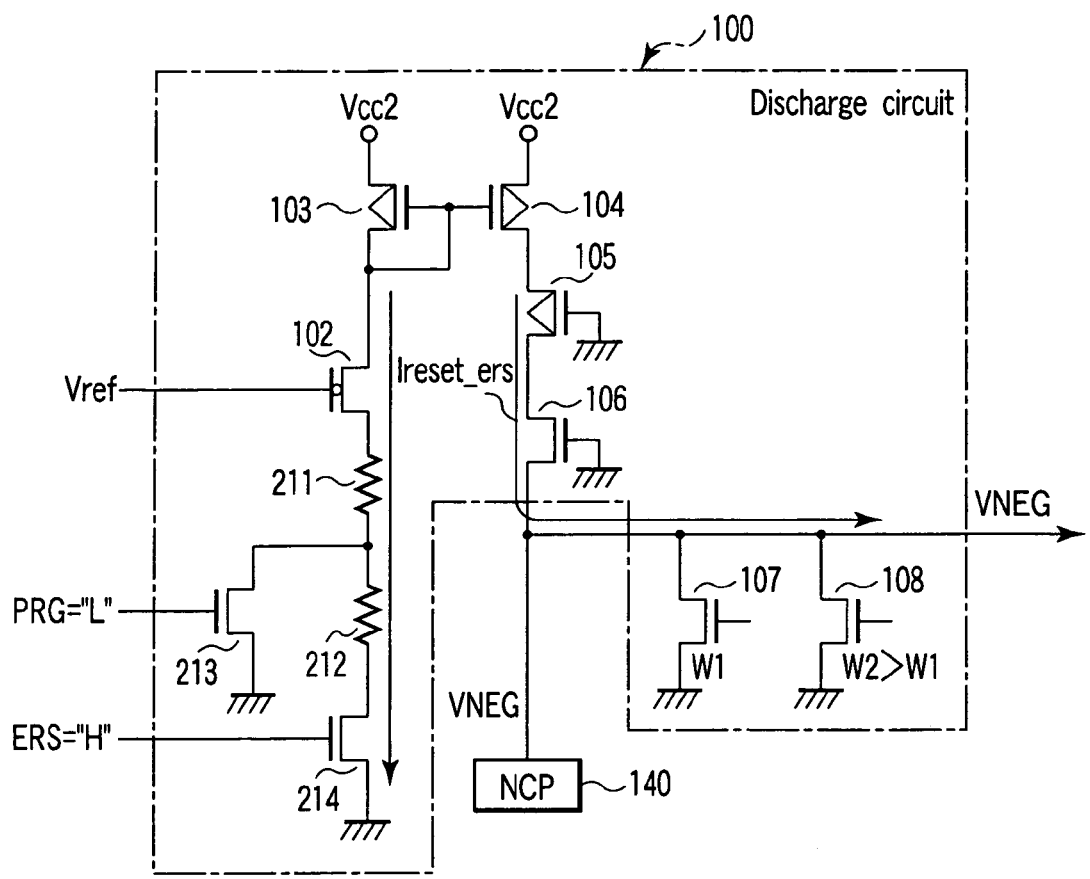
FIG. 16 is a circuit diagram of the discharge circuit in a reset operation after an erase operation in the flash memory of the second embodiment.

As shown in FIG. 14, in the period between time t4 and time t5, an erase operation is carried out. Then, at time t5 when the erase operation is completed, a reset operation is started. That is, first, the charge pump circuit 140 is deactivated, with the result that node VNEG goes into the floating state at VBB. Then, the discharge circuit 100 supplies the current Ireset_ers to node VNEG, which is shown in FIG. 16. First, the reference voltage generator 110 supplies the reference voltage Vref to the discharge circuit 100. In addition, the write signal PRG inputted to the gate of the MOS transistor 213 of the discharge circuit is made low and the erase signal ERS inputted to the MOS transistor 214 is made high. Thus, the MOS transistor 213 is turned off and the MOS transistor 214 is turned on. Then, the current mirror circuit composed of the MOS transistors 103, 104 supplies the constant current Ireset_ers ($=\alpha \cdot \text{Vref}/(R2+R3)$) according to the reference voltage Vref and the resistance values R2, R3 of the resistive elements 211, 212. Here, Ireset_ers meets the condition Ireset_ers<Ireset_prg.

While the constant current Ireset_ers is being supplied to node VNEG, the charge at node VNEG is discharged. At time t7, the potential at node VNEG reaches −Vthn. The operation after this is the same as explained in the first embodiment.

As described above, the flash memory of the second embodiment produces the effect in the following item (4) in addition to the effects in items (1) to (3) explained in the first embodiment.

(4) The effect of coupling noise after erasing can be reduced effectively.

As described above, the data is written in pages, whereas the data is erased in blocks. The number of memory cells written into simultaneously is generally 256 bits to 512 bits, depending on the specification of the product. The number of memory cells erased from simultaneously is, for example, about 64 kilobits to 128 kilobits. These units are determined by the chip area, the reliability of memory cells, specifications, and the like. The number of erase bits is generally larger than the number of write bits. Therefore, the parasitic capacitance Cprog between the word lines (VPP) and the terminals (0V, VBB) excluding the word lines in a write operation and the parasitic capacitance between the word lines (VBB) and the other terminals (0V, VPP) in an erase operation has the following relationship: Cerase>>Cprog. Therefore, a reset operation after erasing is more liable to be affected by coupling than a reset operation after writing. In other words, the transient current flowing in a reset operation after an erase operation is much larger than that in a reset operation after a write operation.

In the second embodiment, however, the discharge circuit 100 includes the current control circuit 210. The current Ireset_ers caused to flow to node VNEG in a reset operation after erasing has a smaller current value than that of the current Ireset_prg caused to flow to node VNEG in a reset operation after writing. Thus, as shown in FIG. 14, a potential change of dV/dt=c2 at node VNEG in reset operation after erasing is smaller than a potential change of dV/dt=c1 at node VNEG in a reset operation after writing. That is, a voltage change at node VNEG after an erase operation is made gentler than that after a write operation. Thus, the coupling in a reset operation after erasing can be suppressed effectively.

Ireset_prg and Ireset_ers can be changed freely by the resistive elements 211, 212 in the current control circuit 210. Therefore, the most suitable currents Ireset_prg, Ireset_ers can be supplied according to the product specification, that is, by setting the resistance values of the resistive elements 211, 212 according to the number of memory cells written into or erased from simultaneously.

In addition, the time required for the potential at node VNEG to reach −Vthn from VBB after a write operation is shorter than that after an erase operation. Therefore, the reset operation time after a write operation can be made shorter than that after an erase operation.

A semiconductor memory device according to a third embodiment of the present invention and a control method for the semiconductor memory device will be explained. The third embodiment is such that the potential at node VNEG is caused to rise to 0V, while the discharge circuit is causing the current Ireset to flow in the first embodiment. FIG. 17 is a circuit diagram of the discharge circuit 100 included in the flash memory 10 of the third embodiment. Since the remaining configuration is the same as that of the first embodiment, its explanation will be omitted.

As shown in FIG. 17, the discharge circuit 100 of the third embodiment is such that the MOS transistor 107 is eliminated from the configuration explained in the first embodiment. In FIG. 17, the value of the reference voltage Vref is set to the threshold value (Vthn) of the MOS transistor 106. The reference voltage Vref is then applied to not only the gate of the MOS transistor 102 but also the gate of the MOS transistor 106.

Next, the operation of the flash memory according to the third embodiment will be explained by reference to FIG. 18. FIG. 18 is a timing chart for the potentials at node VDDW and node VNEG. Since a write operation, an erase operation, and a read operation are the same as those in the first embodiment, explanation of them will be omitted. Hereinafter, only a reset operation will be explained.

As shown in FIG. 18, in the period between time t4 and time t5, the charge pump circuit 140 outputs the negative voltage VBB to node VNEG. At time t5 when a write operation is completed, a reset operation is started. Specifically, first, the charge pump circuit 140 is deactivated. Thus, node VNEG goes into the floating state at VBB. Then, the discharge circuit 100 supplies the current Ireset to node VNEG, which is as shown in FIG. 10 explained in the first embodiment. The reference voltage Vref is applied to the gate of the MOS transistor 106.

While the constant current Ireset is being supplied to node VNEG, the charge at node VNEG is discharged. At time t6, the potential at node VNEG reaches 0V. When the potential at node VNEG has reached 0V, the MOS transistor 106 is cut off. As a result, Ireset does not flow into node VNEG. Thereafter, at time t7, the MOS transistor 108 is turned on, connecting node VNEG to GND.

After node VNEG has been set to 0V, the potential at node VDDW is set to Vcc2 and then to 0V.

As described above, the flash memory of the third embodiment produces not only the effects in items (1) to (3) explained in the first embodiment but also the effect in the following item (5).

(5) The configuration of the discharge circuit can be simplified.

To the MOS transistor 106 of the discharge circuit according to the third embodiment, a voltage of its threshold level (Vthn) is applied. Thus, even when the potential at node VNEG has reached −Vthn, the MOS transistor 106 is not cut off and therefore the current Ireset is supplied to node VNEG. Therefore, node VNEG can be raised to 0V, while the current Ireset is being supplied to node VNEG. Accordingly, the MOS transistor 107 needed in the first and second embodiments becomes unnecessary, which helps simplify the configuration of the discharge circuit 100. At the same time, control of the discharge circuit can be simplified.

Figure 19:
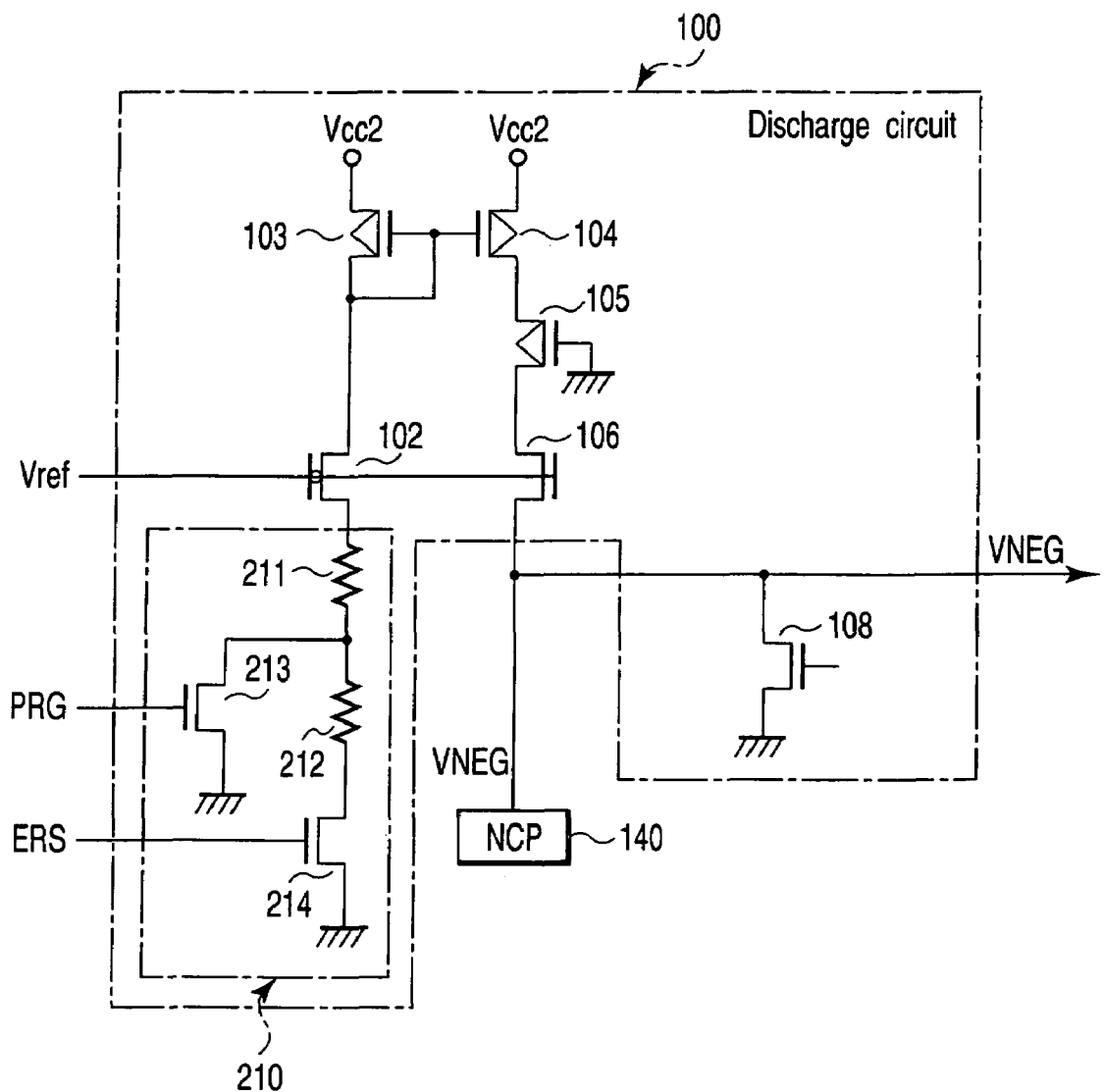
FIG. 19 is a circuit diagram of a discharge circuit included in a flash memory according to a fourth embodiment of the present invention.

A semiconductor memory device according to a fourth embodiment of the present invention and a control method for the semiconductor memory device will be explained. The fourth embodiment is a combination of the second and third embodiments. FIG. 19 is a circuit diagram of the discharge circuit 100 included in the flash memory 10 of the fourth embodiment. Since the remaining configuration is the same as that of the first embodiment, its explanation will be omitted.

As shown in FIG. 19, the discharge circuit 100 of the fourth embodiment is such that the MOS transistor 107 is eliminated from the configuration of FIG. 13 explained in the second embodiment. In FIG. 19, the value of the reference voltage Vref is set to the threshold value (Vthn) of the MOS transistor 106. The reference voltage Vref is applied to not only the gate of the MOS transistor 102 but also the gate of the MOS transistor 106.

Next, the operation of the flash memory according to the fourth embodiment will be explained by reference to FIG. 20. FIG. 20 is a timing chart for the potentials at node VDDW and node VNEG. Since a write operation, an erase operation, and a read operation are the same as those in the first embodiment, explanation of them will be omitted. Hereinafter, a reset operation (the operation of returning node VNEG to 0V) after writing and a reset operation after erasing will be explained separately.

<Reset Operation after Writing>

As shown in FIG. 20, in the period between time t4 and time t5, the charge pump circuit 140 outputs the negative potential VBB to node VNEG. Then, at time t5 when the write operation is completed, a reset operation is started. Specifically, first, the charge pump circuit 140 is deactivated, with the result that node VNEG goes into the floating gate at VBB. Then, the discharge circuit 100 supplies the current Ireset_prg to node VNEG, which is as shown in FIG. 15 explained in the second embodiment. First, the reference voltage generator 110 supplies the reference voltage Vref to the discharge circuit 100. The reference voltage Vref is supplied to not only the gate of the MOS transistor 102 but also the gate of the MOS transistor 106. In addition, the write signal PRG inputted to the gate of the MOS transistor 213 of the discharge circuit is made high and the erase signal ERS inputted to the MOS transistor 214 is made low. Thus, the MOS transistor 213 is turned on and the MOS transistor 214 is turned off. Then, the current mirror circuit formed of the MOS transistors 103, 104 supplies the constant current Ireset_prg according to the reference voltage Vref and the resistance value R2 of the resistive element 211.

While the constant current Ireset_prg is being supplied to node VNEG, the charge at node VNEG is discharged. At time t6, the potential at node VNEG reaches 0V. When the potential at node VNEG has reached 0V, the MOS transistor 106 is cut off. Thus, Ireset_prg does not flow to node VNEG. Thereafter, at time t7, the MOS transistor 108 is turned on, connecting node VNEG to GND.

After node VNEG has been set to 0V, the potential at node VDDW is set to Vcc2 and then to 0V.

<Reset Operation after Erasing>

A reset operation after an erase operation is almost the same as in the second embodiment. Specifically, at time t5, the discharge circuit 100 supplies the current Ireset_ers to node VNEG. Then, the reference voltage Vref is supplied to not only the gate of the MOS transistor 102 but also the gate of the MOS transistor 106. Thus, the charge at node VNEG is discharged, while the constant current Ireset_ers is being supplied to node VNEG. At time t6, the potential at node VNEG reaches 0V. When the potential at node VNEG has reached 0V, the MOS transistor 106 is cut off. Thereafter, at time t7, the MOS transistor 108 is turned on, connecting node VNEG to GND.

As described above, the flash memory of the fourth embodiment produces not only the effects in items (1) to (3) explained in the first embodiment but also the effects in items (4) and (5) explained in the second and third embodiments.

Figure 21:
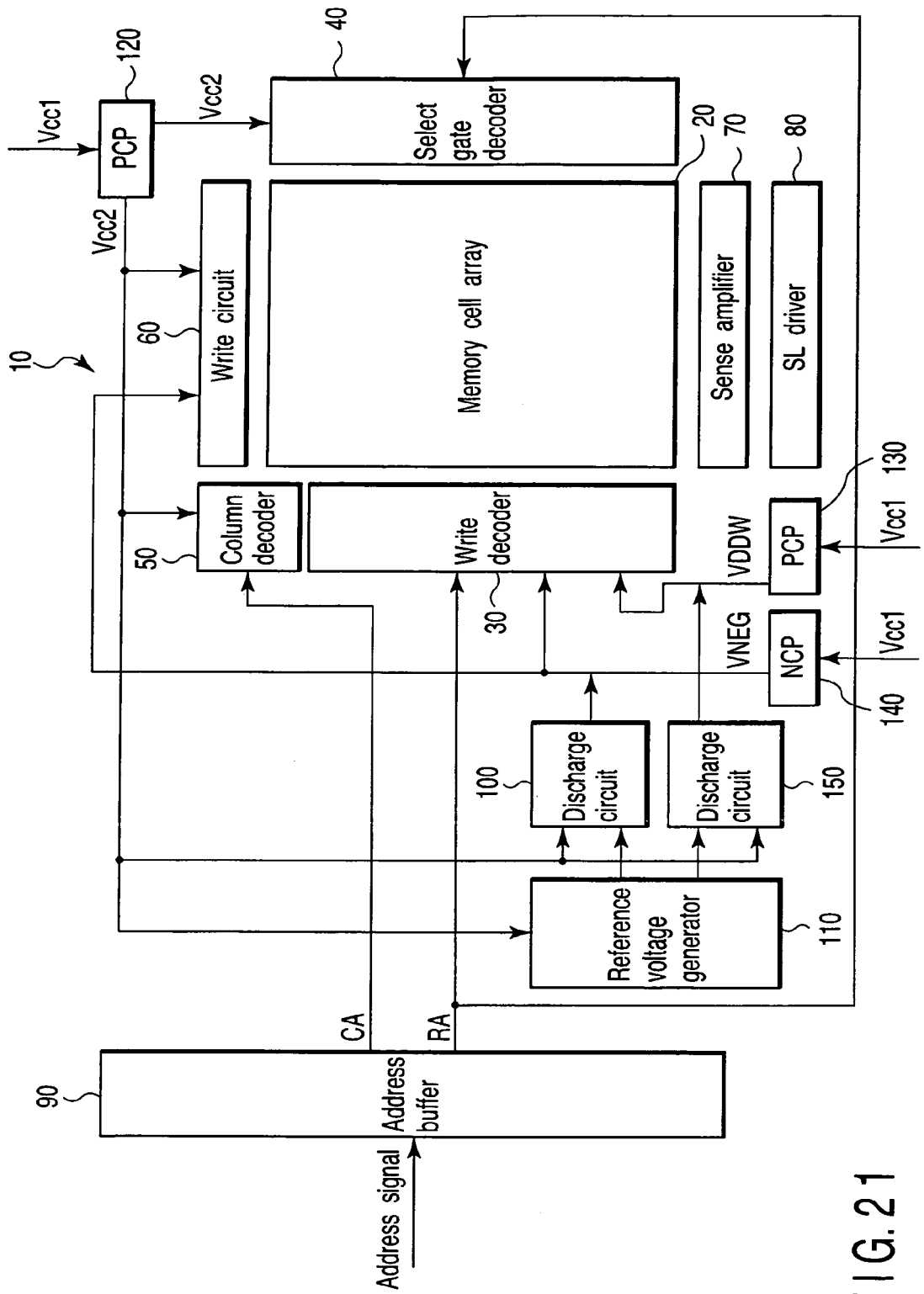
FIG. 21 is a block diagram of a flash memory according to a fifth embodiment of the present invention.

Next, a semiconductor memory device according to a fifth embodiment of the present invention and a control method for the semiconductor memory device will be explained by reference to FIG. 21. The fifth embodiment is such that a discharge circuit is provided not only for node VNEG but also for node VDDW. FIG. 21 is a block diagram of a flash memory according to the fifth embodiment.

As shown in FIG. 21, the flash memory 10 further includes a discharge circuit 150 in the configuration of FIG. 1 explained in the first embodiment. The discharge circuit 150 discharges the charge at node VDDW after a write operation or an erase operation.

Figure 22:
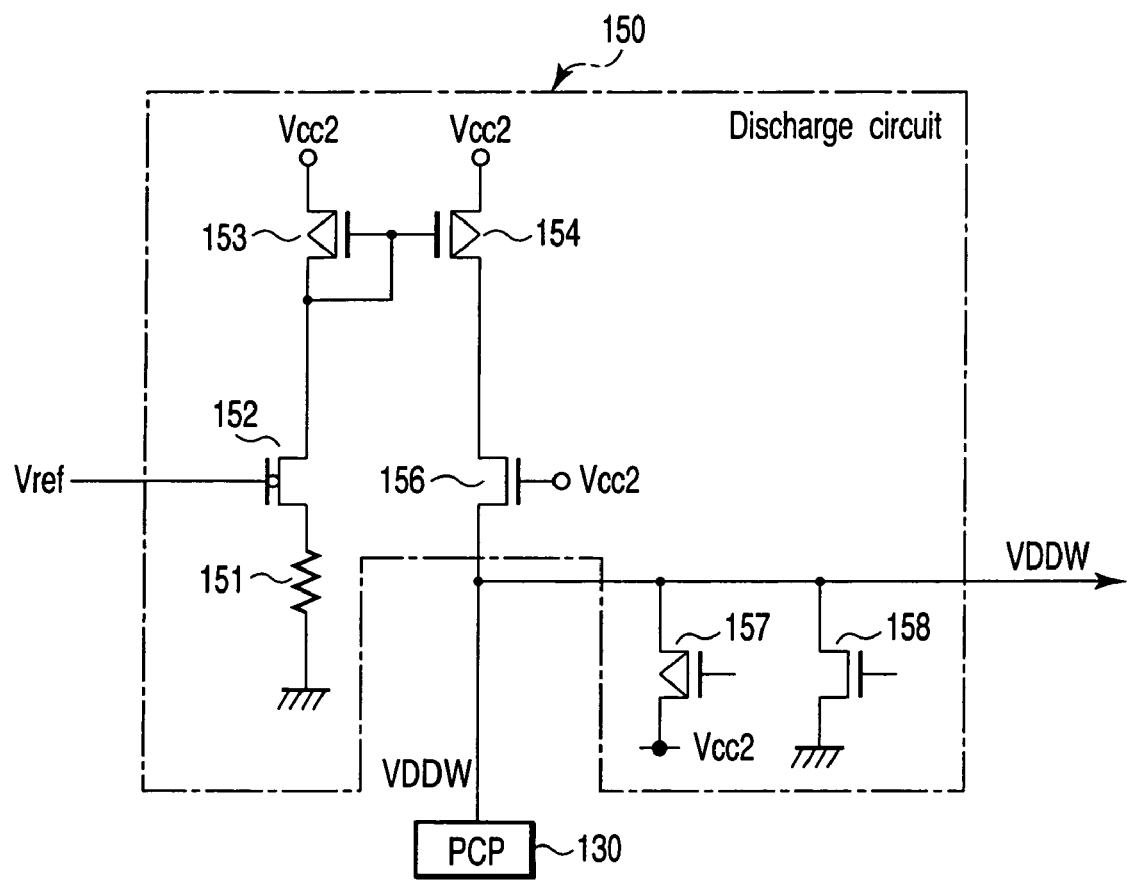
FIG. 22 is a circuit diagram of a discharge circuit included in the flash memory of the fifth embodiment.

FIG. 22 is a circuit diagram showing a configuration of the discharge circuit 150. As shown in FIG. 22, the discharge circuit 150 includes a resistive element 151, an intrinsic MOS transistor 152, n-channel MOS transistors 156, 158, and p-channel MOS transistors 153, 154, 157.

One end of the resistive element 151 is connected to ground. The source of the MOS transistor 152 is connected to the other end of the resistive element 151. The reference voltage Vref generated by the reference voltage generator 110 is applied to the gate of the MOS transistor 152. The gates of the MOS transistors 153, 154 are connected to each other, thereby forming a current mirror circuit. The drains of the MOS transistors 153, 154 are connected to Vcc2. The source of the MOS transistor 153 is connected to the drain of the MOS transistor 152 and to the gate of the MOS transistor 153. The source of the MOS transistor 154 is connected to the source of the MOS transistor 156. The MOS transistor 156 has its gate applied with Vcc2 and its source connected to node VDDW. The MOS transistor 157 has its drain connected to node VDDW and its source connected to the Vcc2 node. The MOS transistor 158 has its drain connected to node VDDW and its source connected to ground.

The MOS transistor 156 has a thicker gate insulating film than that of the MOS transistors forming memory cells or the MOS transistors 153, 154 forming the current mirror circuit in the discharge circuit 150. The reason is that the MOS transistor 156 is connected directly to node VDDW and the positive potential VPP is applied to node VDDW.

Since the remaining configuration of the flash memory 10 is the same as that in the first embodiment, its explanation will be omitted.

Figure 23:
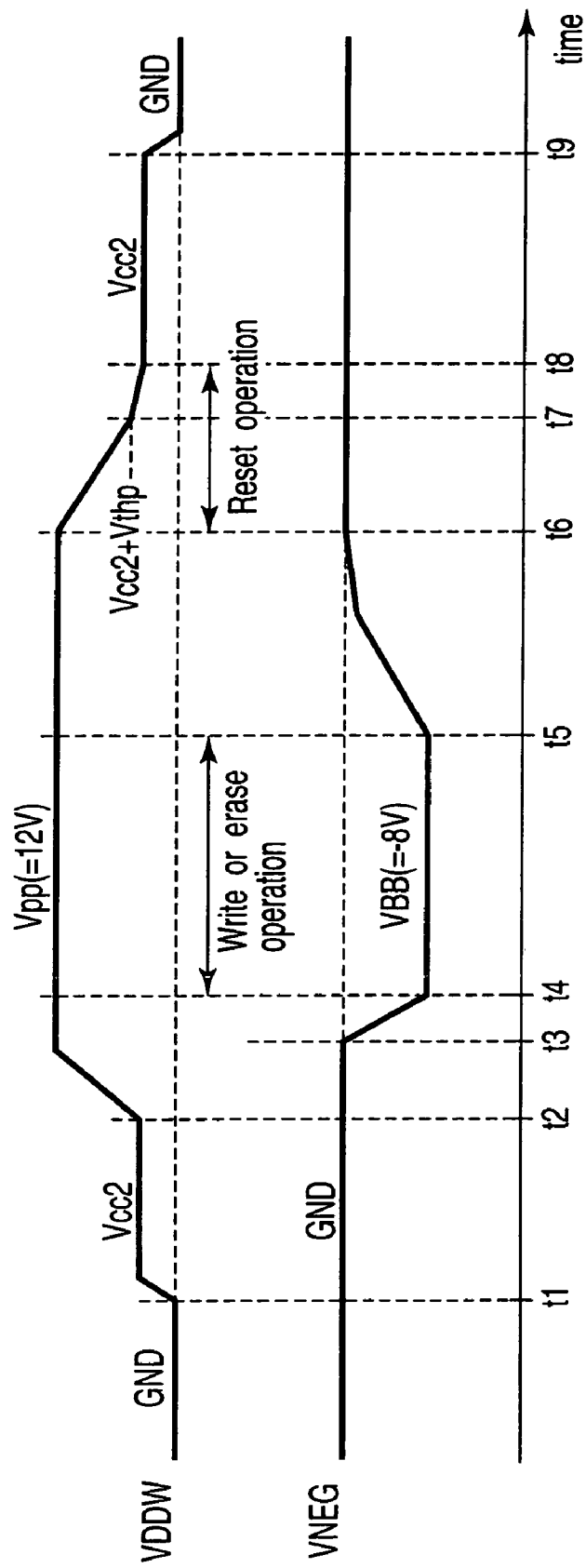
FIG. 23 is a timing chart for the potentials at node VDDW and node VNEG included in the flash memory of the fifth embodiment.

Next, the operation of the flash memory of the fifth embodiment will be explained by reference to FIG. 23. FIG. 23 is a timing chart of the potentials at node VDDW and node VNEG. Since a write operation, an erase operation, and a read operation are the same as in the first embodiment and the resetting of node VNEG is the same as in the first to fourth embodiments, explanation of them will be omitted. Hereinafter, the resetting of node VDDW will be explained.

<Resetting of Node VDDW>

First, as explained in the first to fourth embodiments, a write operation or an erase operation is carried out in the period between time t4 and time t6. Then, at time t5, node VNEG is reset. This is done by the method explained in the first to fourth embodiments.

At time t6 when node VNEG is set to 0V, the resetting of node VDDW is started.

First, the charge pump circuit 130 is deactivated, with the result that node VDDW goes into the floating gate at VPP. Then, the reference voltage generator 110 supplies the reference voltage Vref to the discharge circuit 100. Then, the current mirror circuit formed of the MOS transistors 153, 154 supplies the constant current Ireset2 ($=\alpha \cdot Vref/R4$) according to the reference voltage Vref and the resistance value R4 of the resistive element 151. Since the potential at node VDDW at time t6 is VPP, the p-channel MOS transistor 156 is on. Thus, Ireset2 flows to node VDDW. This is the same as in FIG. 10 explained in the first embodiment. As a result, the charge at node VDDW is discharged to the Vcc2 node. For example, the charge accumulated in the parasitic capacitance between node VDDW and GND or in the parasitic capacitance between node VDDW and node VNEG moves to the Vcc2 node. As a result, as shown in the period between time t6 and time t7 of FIG. 23, the potential at node VDDW drops from VPP at a constant rate.

At time t7, when the potential at node VDDW has reached Vcc2+Vthp, the MOS transistor 156 is cut off. Here, Vthp is the threshold voltage of the MOS transistor 156. Therefore, Ireset cannot flow to node VDDW. Accordingly, at time t7, the MOS transistor 157 is turned on. This is the same as in FIG. 11 of the first embodiment. As a result, node VDDW is connected to the Vcc2 node, releasing the charge to the Vcc2 node.

As a result, the potential at node VDDW becomes Vcc2 (time 8). Thereafter, the MOS transistor 158 is turned on at time T9 as needed, which connects node VDDW to GND, setting the potential at node VDDW to 0V.

As described above, with the flash memory of the fifth embodiment, while the constant current Ireset2 is being supplied to node VDDW, the potential at node VDDW is reset to Vcc2 (more precisely, Vcc2+Vthp). Therefore, as for node VDDW, the effects in items (1) to (3) explained in the first embodiment are obtained.

Figure 24:
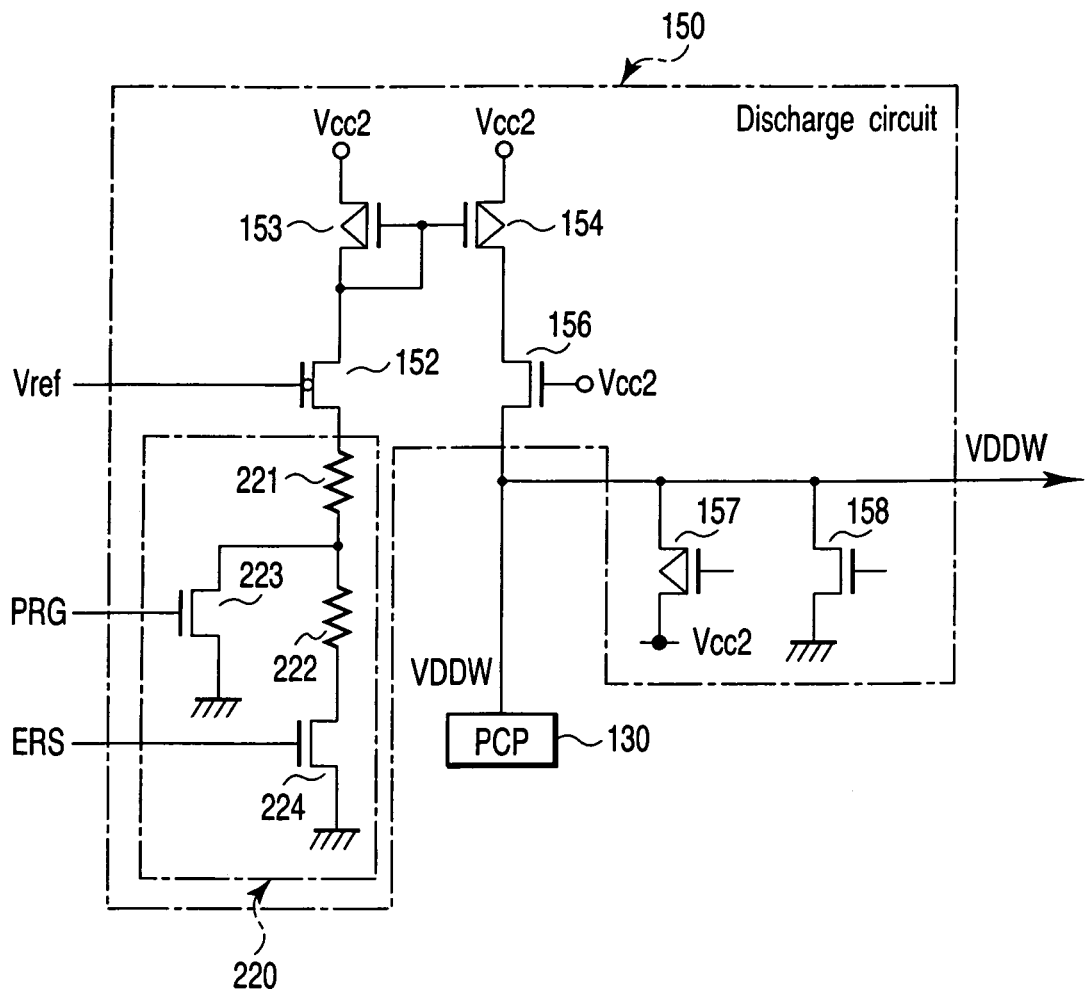
FIG. 24 is a circuit diagram of a discharge circuit included in a flash memory according to a sixth embodiment of the present invention.

A semiconductor memory device according to a sixth embodiment of the present invention and a control method for the semiconductor memory device will be explained. The sixth embodiment is such that the current value of the current Ireset2 caused to flow in a reset operation after writing is made different from that in a reset operation after erasing in the fifth embodiment. FIG. 24 is a circuit diagram of the discharge circuit 150 included in the flash memory 10 of the sixth embodiment. Since the remaining configuration is the same as that of the fifth embodiment, it explanation will be omitted.

As shown in FIG. 24, the discharge circuit 150 of the sixth embodiment uses a current control circuit 220 instead of the resistive element 151 in the configuration explained in the fifth embodiment. The current control circuit 220 includes resistive elements 221, 222, and n-channel MOS transistors 223, 224.

One end of the resistive element 221 is connected to the source of the MOS transistor 152. The other end of the resistive element 221 is connected to one end of the resistive element 222. The MOS transistor 223 has its drain connected to the junction node of the resistive elements 221, 222 and its source grounded. A write signal PRG is inputted to the gate of the MOS transistor 223. The MOS transistor 224 has its drain connected to the other end of the resistive element 222 and its source grounded. An erase signal ERS is inputted to the gate of the MOS transistor 224. The write signal PRG and erase signal ERS are made high in a write operation or in an erase operation, respectively.

Figure 25:
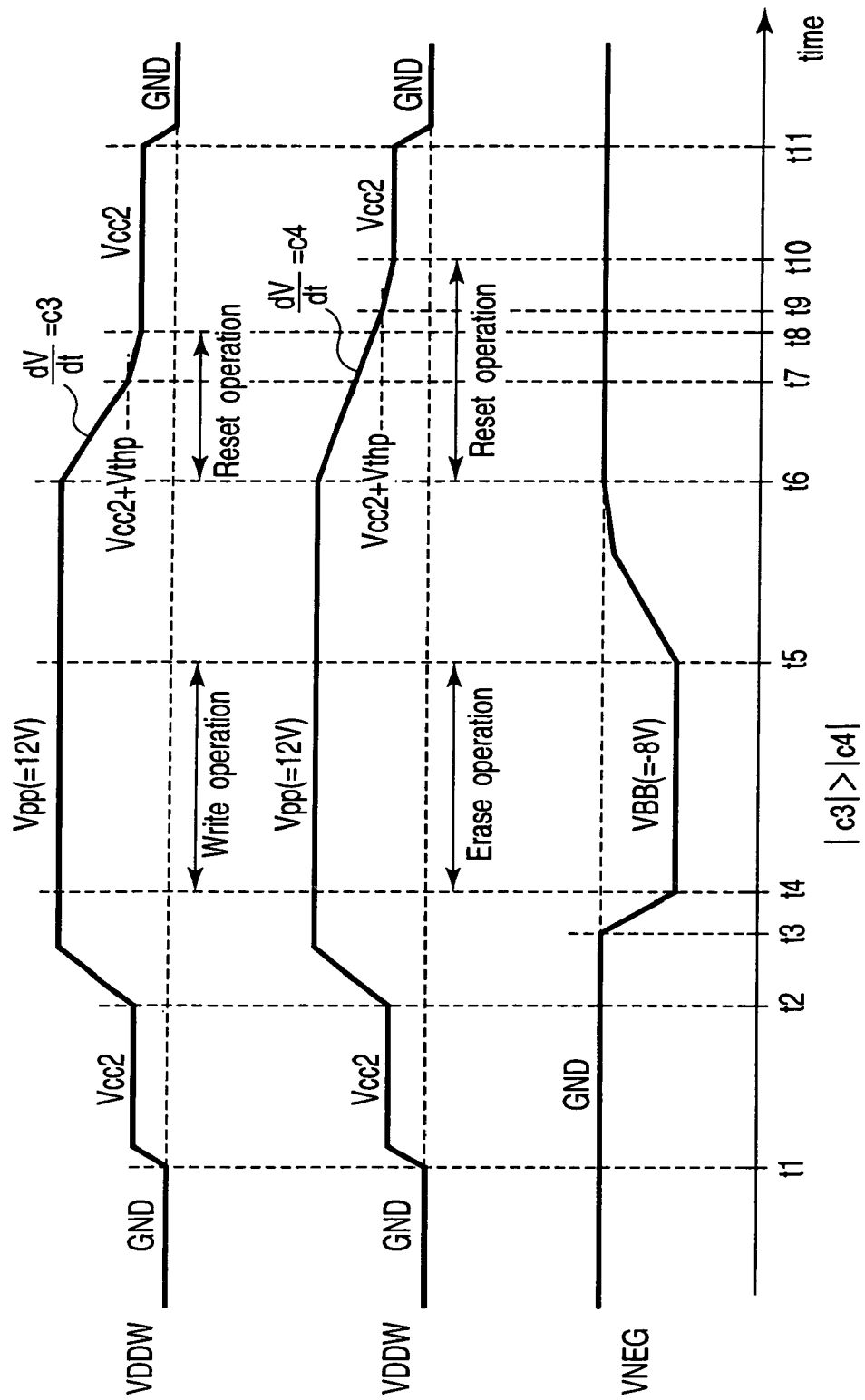
FIG. 25 is a timing chart for the potentials at node VDDW and node VNEG included in the flash memory of the sixth embodiment.

Next, the operation of the flash memory of the sixth embodiment will be explained by reference to FIG. 25. FIG. 25 is a timing chart for the potentials at node VDDW and node VNEG. Since a write operation, an erase operation, and a read operation are the same as in the first embodiment and the resetting of node VNEG is the same as in the first to fourth embodiments, explanation of them will be omitted. Hereinafter, the resetting of node VDDW after a write operation and that after an erase operation will be explained separately.

<Resetting after Write Operation>

As shown in FIG. 25, in the period between time t4 and time t6, the charge pump circuit 130 outputs the positive potential VPP to node VDDW. Then, at time t6 when the resetting of node VNEG is completed, a reset operation of node VDDW is started. That is, first, the charge pump circuit 130 is deactivated, with the result that node VDDW goes into the floating gate at VPP. Then, the discharge circuit 150 supplies the current Ireset2_prg to node VDDW, which is as shown in FIG. 15 explained in the second embodiment. First, the reference voltage generator 110 supplies the reference voltage Vref to the discharge circuit 150. In addition, the write signal PRG inputted to the gate of the MOS transistor 223 of the discharge circuit is made high and the erase signal ERS inputted to the gate of the MOS transistor 224 is made low. Thus, the MOS transistor 223 is turned on and the MOS transistor 224 is turned off. Then, the current mirror circuit formed of the MOS transistors 153, 154 supplies the constant current Ireset2_prg (=α·Vref/R5) according to the reference voltage Vref and the resistance value R5 of the resistive element 221.

While the constant current Ireset2_prg is being supplied to node VDDW, the charge at node VDDW is discharged. At time t7, the potential at node VDDW reaches Vcc2+Vthp. The operation after this is the same as explained in the fifth embodiment.

<Resetting after Erase Operation>

As shown in FIG. 25, in the period between time t4 and time t5, an erase operation is carried out. Then, at time t6 when the resetting of node VNEG is completed, the resetting of node VDDW is started. That is, first, the charge pump circuit 130 is deactivated, with the result that node VDDW goes into the floating gate at VPP. Then, the discharge circuit 150 supplies the current Ireset2_ers to node VDDW, which is as shown in FIG. 16 explained in the second embodiment. First, the reference voltage generator 110 supplies the reference voltage Vref to the discharge circuit 150. In addition, the write signal PRG inputted to the gate of the MOS transistor 223 of the discharge circuit 150 is made low and the erase signal ERS inputted to the MOS transistor 224 is made high. Thus, the MOS transistor 223 is turned off and the MOS transistor 224 is turned on. Then, the current mirror circuit formed of the MOS transistors 153, 154 supplies the constant current Ireset2_ers (=α·Vref/(R5+R6)) according to the reference voltage Vref and the resistance values R5, R6 of the resistive elements 221, 222. Here, Ireset2_ers meets the condition Ireset2_ers<Ireset2_prg.

While the constant current Ireset2_ers is being supplied to node VDDW, the charge at node VDDW is discharged. At time t9, the potential at node VDDW reaches Vcc2+Vthp. The operation after this is the same as explained in the fifth embodiment.

As described above, in the flash memory of the sixth embodiment, while the constant current is being supplied to node VDDW, node VDDW is reset. Then, the current Ireset2_ers caused to flow to node VDDW in the reset operation after an erase operation is made smaller in value than the current Ireset2_prg caused to flow to node VDDW in the reset operation after a write operation. Therefore, as shown in FIG. 25, a potential change of |dV/dt|=|c4| at node VDDW in the reset operation after an erase operation is smaller than a potential change of |dV/dt|=|c3| at node VDDW in the reset operation after a write operation. That is, a voltage change at node VDDW after an erase operation is made gentler than that after a write operation. Therefore, as for node VDDW, the effects in items (1) to (4) explained in the first and second embodiments are obtained.

Figure 26:
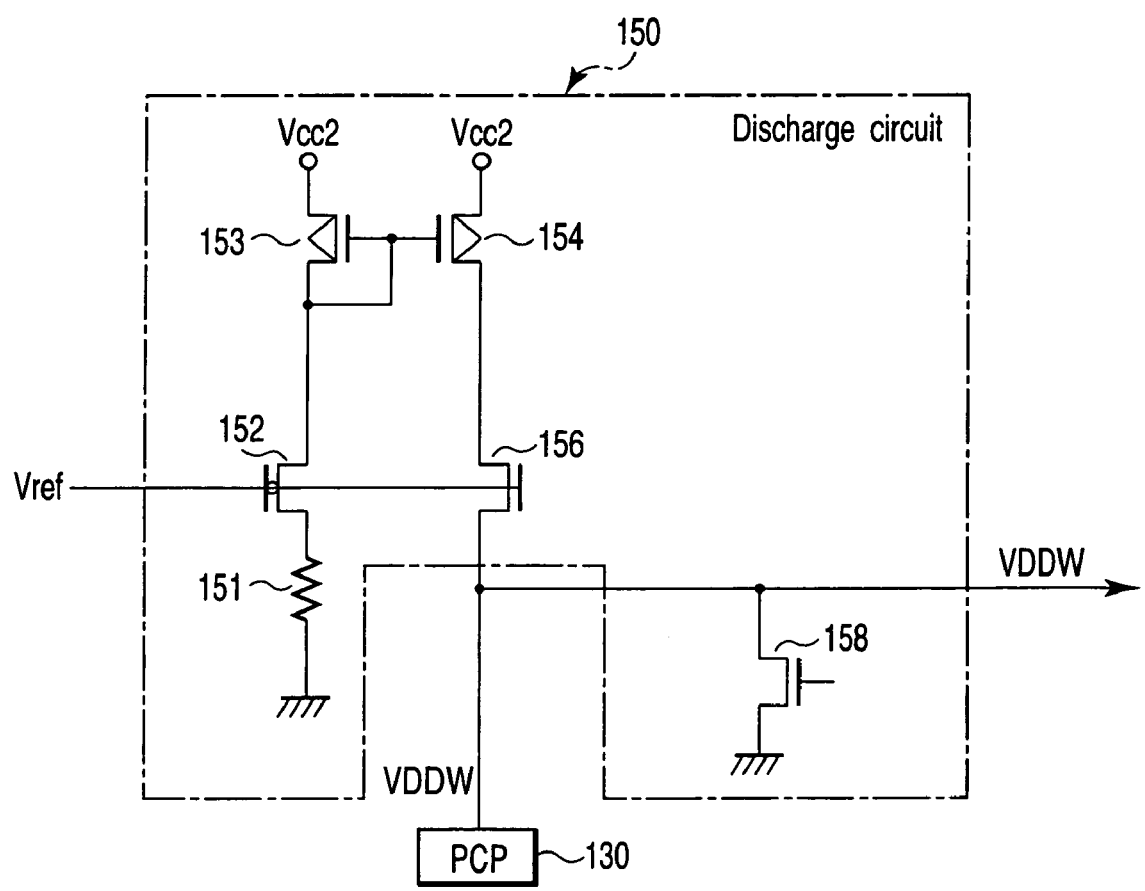
FIG. 26 is a circuit diagram of a discharge circuit included in a flash memory according to a seventh embodiment of the present invention.

A semiconductor memory device according to a seventh embodiment of the present invention and a control method for the semiconductor memory device will be explained. The seventh embodiment is such that the potential at node VDDW is lowered to 0V, while the discharge circuit is causing the current Ireset to flow in the fifth embodiment. That is, the third embodiment is applied to node VDDW. FIG. 26 is a circuit diagram of the discharge circuit 150 included in the flash memory 10 of the seventh embodiment. Since the remaining configuration is the same as that of the fifth embodiment, its explanation will be omitted.

As shown in FIG. 26, the discharge circuit 150 of the seventh embodiment is such that the MOS transistor 157 is eliminated from the configuration explained in the fifth embodiment. In FIG. 26, the value of the reference voltage Vref is set to the threshold value (Vthp) of the MOS transistor 156. The reference voltage Vref is applied to not only the gate of the MOS transistor 152 but also the gate of the MOS transistor 156.

Figure 27:
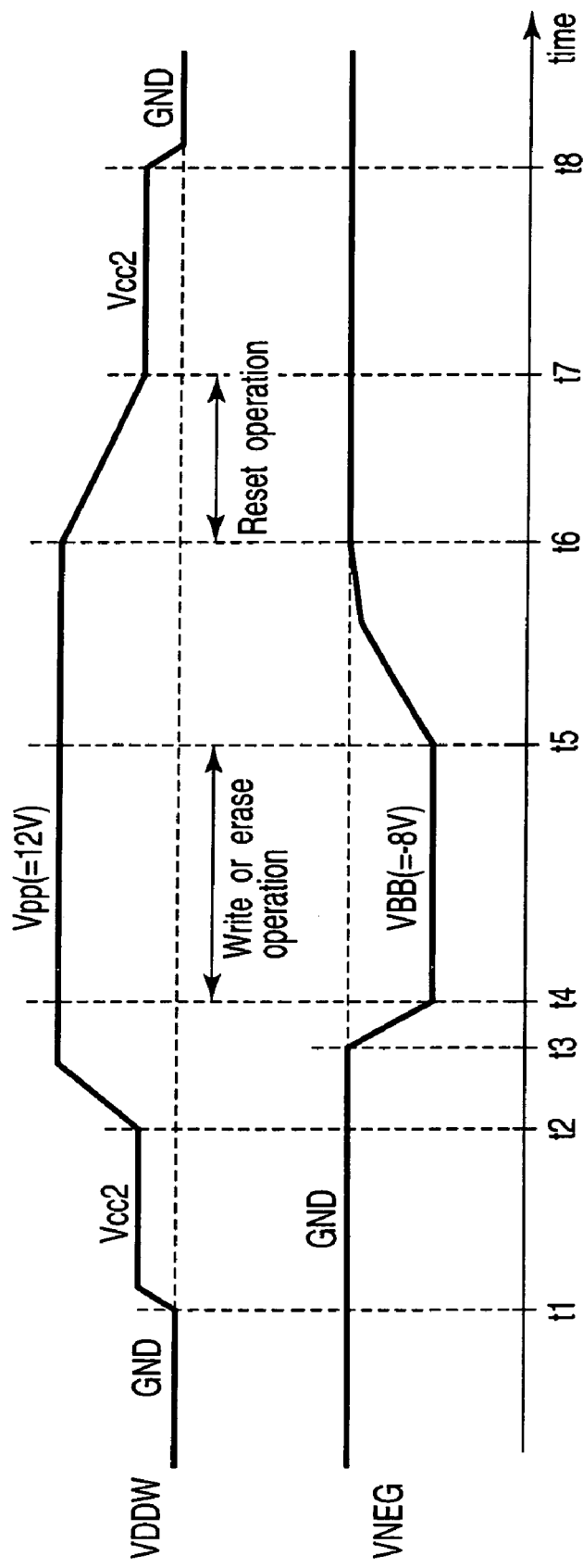
FIG. 27 is a timing chart for the potentials at node VDDW node and node VNEG included in the flash memory of the seventh embodiment.

Next, the operation of the flash memory according to the seventh embodiment will be explained by reference to FIG. 27. FIG. 27 is a timing chart for the potentials at node VDDW and node VNEG. Since a write operation, an erase operation, and a read operation are the same as those in the first embodiment and the resetting of node VDDW is the same as in the first to fourth embodiments, explanation of them will be omitted. Hereinafter, only the resetting of node VDDW will be explained.

As shown in FIG. 27, in the period between time t4 and time t6, the charge pump circuit 130 outputs the positive voltage VPP to node VDDW. At time t6 when the resetting of node VNEG is completed, the resetting of node VDDW is started. Specifically, first, the charge pump circuit 130 is deactivated. Thus, node VDDW goes into the floating state at VPP. Then, the discharge circuit 150 supplies the current Ireset2 to node VDDW, which is as shown in FIG. 10 explained in the first embodiment. The reference voltage Vref is applied to the gate of the MOS transistor 156.

While the constant current Ireset2 is being supplied to node VDDW, the charge at node VDDW is discharged. At time t7, the potential at node VDDW reaches Vcc2. When the potential at node VDDW has reached Vcc2, the MOS transistor 156 is cut off. As a result, Ireset2 does not flow to node VDDW. Thereafter, at time t8, the MOS transistor 158 is turned on, connecting node VDDW to GND.

As described above, in the flash memory of the seventh embodiment, the MOS transistor 156 of the discharge circuit 150 is applied with a voltage of its threshold level (Vthp). Thus, even when the potential at node VDDW has reached Vcc2+Vthp, the MOS transistor 156 is not cut off, supplying the current Ireset2 to node VDDW. Therefore, the potential at node VDDW can be lowered to Vcc2, while the current Ireset2 is being supplied to node VDDW. Thus, the MOS transistor 157 needed in the fifth and sixth embodiments becomes unnecessary. Accordingly, as for node VDDW, the effects in items (1) to (3) and (5) explained in first and third embodiments are obtained.

Figure 28:
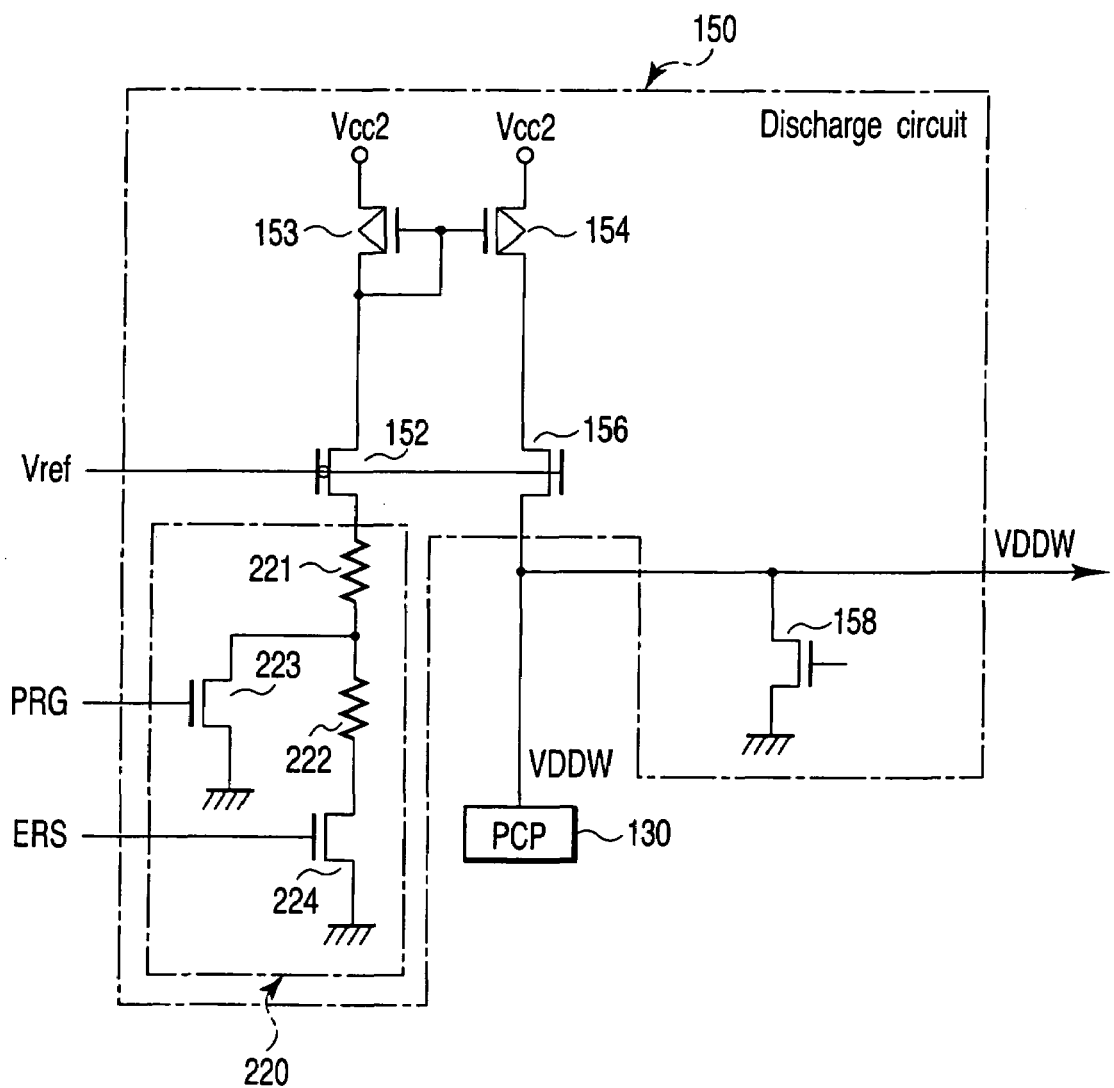
FIG. 28 is a circuit diagram of a discharge circuit included in a flash memory according to an eighth embodiment of the present invention.

Next, a semiconductor memory device according to an eighth embodiment of the present invention and a control method for the semiconductor memory device will be explained. The eighth embodiment is a combination of the sixth and seventh embodiments. That is, in the eighth embodiment, the fourth embodiment is applied to node VDDW. FIG. 28 is a circuit diagram of the discharge circuit 150 included in the flash memory 10 of the eighth embodiment. Since the remaining configuration is the same as that of the fifth embodiment, its explanation will be omitted.

As shown in FIG. 28, the discharge circuit 150 of the eighth embodiment is such that the MOS transistor 157 is eliminated from the configuration of FIG. 24 explained in the sixth embodiment. In FIG. 24, the value of the reference voltage Vref is set to the threshold value (Vthp) of the MOS transistor 156 and the reference voltage Vref is applied to not only the gate of the MOS transistor 152 but also the gate of the MOS transistor 156.

Figure 29:
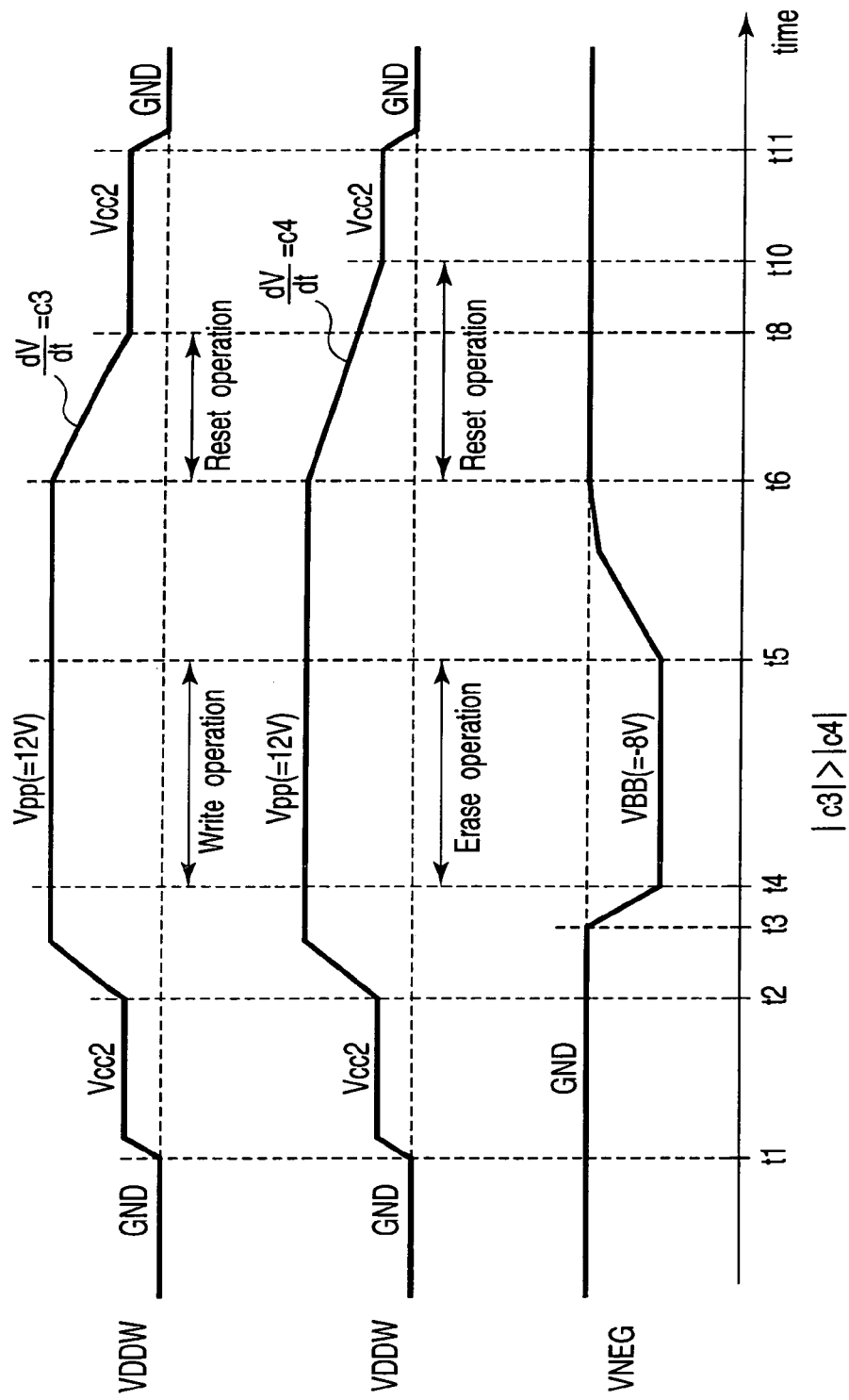
FIG. 29 is a timing chart for the potentials at node VDDW and node VNEG included in the flash memory of the eighth embodiment.

Next, the operation of the flash memory according to the eighth embodiment will be explained by reference to FIG. 29. FIG. 29 is a timing chart for the potentials at node VDDW and node VNEG. Since a write operation, an erase operation, and a read operation are the same as those in the first embodiment and the resetting of node VNEG is the same as in the first to fourth embodiments, explanation of them will be omitted. Hereinafter, the resetting of node VDDW after a write operation and that after an erase operation will be explained separately.

<Reset Operation after Writing>

As shown in FIG. 29, in the period between time t4 and time t5, a write operation is carried out. At time t6 when the resetting of node VNEG is completed, the resetting of node VDDW is started. That is, first, the charge pump circuit 130 is deactivated, with the result that node VDDW goes into the floating gate at VPP. Then, the discharge circuit 150 supplies the current Ireset2_prg to node VDDW, which is as explained in the second and sixth embodiments.

While the constant current Ireset2_prg is being supplied to node VDDW, the charge at node VDDW is discharged. At time t8, the potential at node VDDW reaches Vcc2. When the potential at node VDDW has reached Vcc2, the MOS transistor 156 is cut off. Thereafter, if necessary, for example, at time t11, the MOS transistor 158 is turned on, connecting node VDDW to GND.

<Reset Operation after Erasing>

The reset operation after erasing is almost the same as in the sixth embodiment. Specifically, at time t6, the discharge circuit 150 supplies the current Ireset2_ers to node VDDW. Then, the reference voltage Vref is supplied to not only the gate of the MOS transistor 152 but also the gate of the MOS transistor 156. Thus, the charge at node VDDW is discharged, while the constant current Ireset2_ers is being supplied to node VDDW. At time t10, the potential at node VDDW reaches Vcc2.

As described above, the flash memory of the eighth embodiment produces not only the effects in items (1) to (3) explained in the first embodiment but also the effects in items (4) and (5) explained in the second and third embodiments.

Next, a semiconductor memory device according to a ninth embodiment of the present invention and a control method for the semiconductor memory device will be explained. In the ninth embodiment, a concrete example of the charge pump circuit in the first to eighth embodiments is shown. FIGS. 30 and 31 are circuit diagrams of the charge pump circuits 130, 140, respectively.

As shown in FIG. 30, the charge pump circuit 130 has an oscillator section 230 and an output section 240.

The oscillator section 230 has a first oscillator section 231 and a second oscillator section 232. The first oscillator section 231 includes an odd number of inverters 233 connected in series and capacitance elements 234 each connected between the output node of the corresponding inverter 233 and ground. The output of the last-stage inverter 233 is fed back to the input of the first-stage inverter 233. The second oscillator section 232 is such that the input and output of each of the inverters 233 are replaced with each other in the first oscillator section 231. The first oscillator section 231 outputs a pulse signal complementary to a pulse signal outputted from the second oscillator section 232. The frequency of each of the pulse signals is determined by the capacitance of the capacitance element 234.

The output section 240 includes intrinsic MOS transistors 241 to 243 and a capacitance element 244. The current paths of a plurality of MOS transistors 241 are connected in series. The source of a MOS transistor 242 whose drain is connected to the Vcc2 node and whose gate is connected to its drain is connected to the source of each of the MOS transistors 241. The gate of each of the MOS transistors 241 at odd-numbered stages is connected to the output node of the second oscillator section 232 via a capacitance element 244. The gate of each of the MOS transistors 241 at even-numbered stages is connected to the output node of the first oscillator section 231 via a capacitance element 244. Then, the drain of the last-stage MOS transistor 241 is connected to the source and gate of the MOS transistor 243. The drain of the MOS transistor 243 is connected to node VDDW. The output section 240 with the above configuration outputs the positive voltage VPP at node VDDW on the basis of the pulse signal generated at the oscillator section 230.

The charge pump circuit 140 has an oscillator section 250 and an output section 260 as shown in FIG. 31. The oscillator section 250 has the same configuration as that of the oscillator section 230 of the charge pump circuit 130. The output section 260 is such that the individual MOS transistors in the output section of the charge pump circuit 130 are formed of p-channel MOS transistors. The output section 260 outputs the negative voltage VBB at node VNEG on the basis of the pulse signal generated at the oscillator section 250.

The flash memory 10 according to the first to eighth embodiments can use the charge pump circuit configured as described above.

Figure 32:
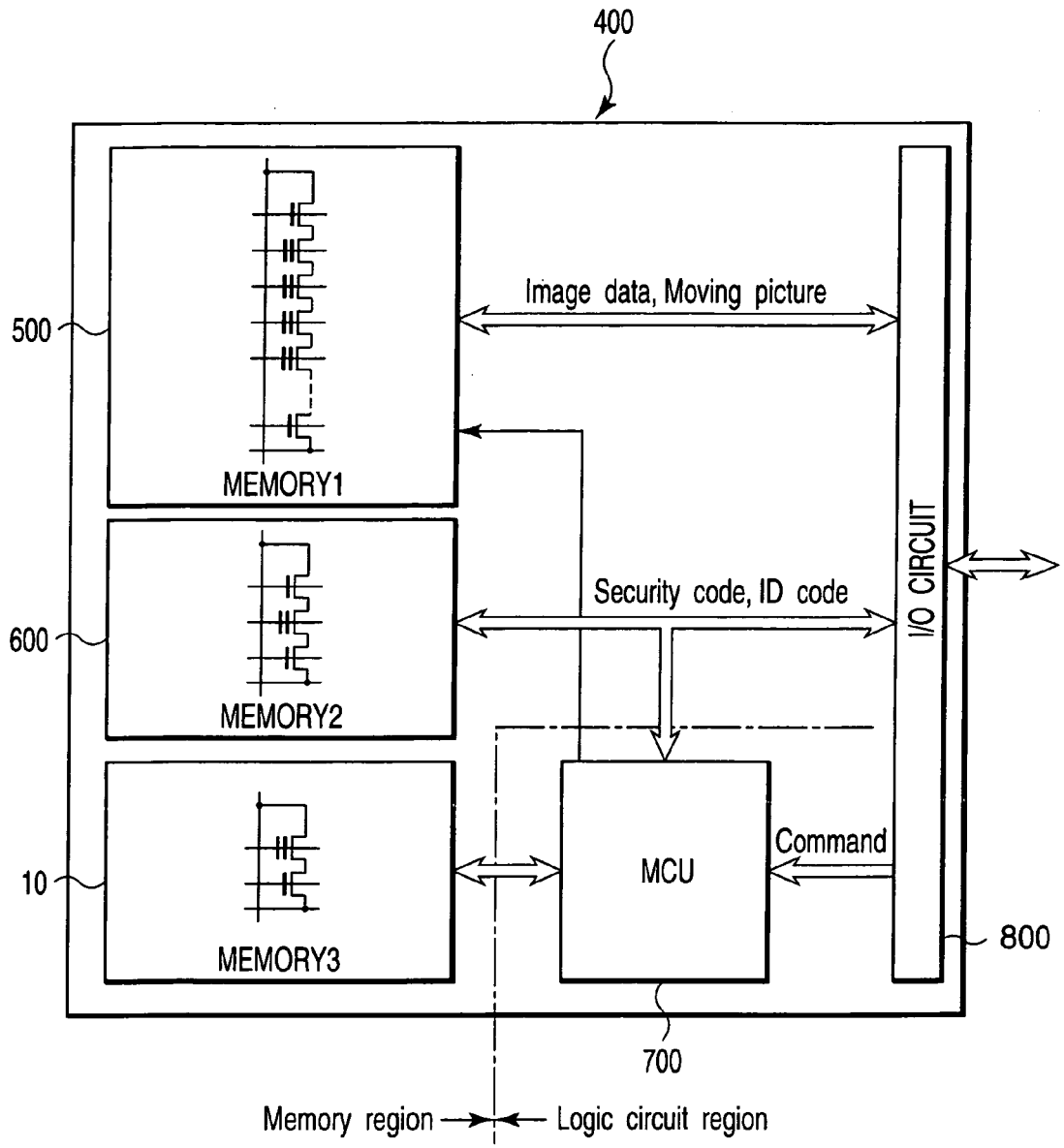
FIG. 32 is a block diagram of a system LSI including a flash memory according to a tenth embodiment of the present invention.

Next, a semiconductor memory device according to a tenth embodiment of the present invention will be explained by reference to FIG. 32. The tenth embodiment relates to a system LSI including a flash memory according to each of the first to ninth embodiments. FIG. 32 is a block diagram of a system LSI according to the tenth embodiment.

As shown in FIG. 32, a system LSI 400 comprises a NAND flash memory 500, a 3Tr-NAND flash memory 600, a 2Tr flash memory 10, an MCU 700, and an I/O circuit 800 embedded on a same semiconductor substrate.

The NAND flash memory 500 is used as a storage memory for storing image data or video data.

The 3Tr-NAND flash memory 600 holds an ID code or security code for accessing the LSI 400.

The 2Tr flash memory 10 holds program data for the MCU 700 to operate.

The MCU 700 does processing on the basis of the program read from the 2Tr flash memory 10, in response to various commands externally inputted. At this time, the MCU 700 accesses the 2Tr flash memory 10 directly without intervention of an SRAM (Static Random Access Memory) or the like. The processing done by the MCU 700 includes the compression or decompression of the data inputted to the NAND flash memory 500 and control of an external device. In addition, the MCU 700 reads specific data from the 3Tr-NAND flash memory 600, when the data held in the NAND flash memory 500 is accessed from the outside. Then, the MCU 700 checks the read-out data against the externally inputted ID code or security code. If they coincide with each other, the MCU 700 permits access to the NAND flash memory 500. When access to the NAND flash memory 500 is permitted, the data in the NAND flash memory 500 is accessed from the outside (host). Specifically, the MCU 700 triggers the NAND flash memory 500 in response to the command received from the outside, thereby reading (writing) the data.

The I/O circuit 800 controls the receiving/transmitting of signals between the LSI 400 and the outside.

Next, the configuration of two semiconductor memories 500, 600 included in the LSI 400 will be explained in detail below. The 2Tr flash memory 10 is as explained in the first to ninth embodiments.

<NAND Flash Memory>

Figure 33:
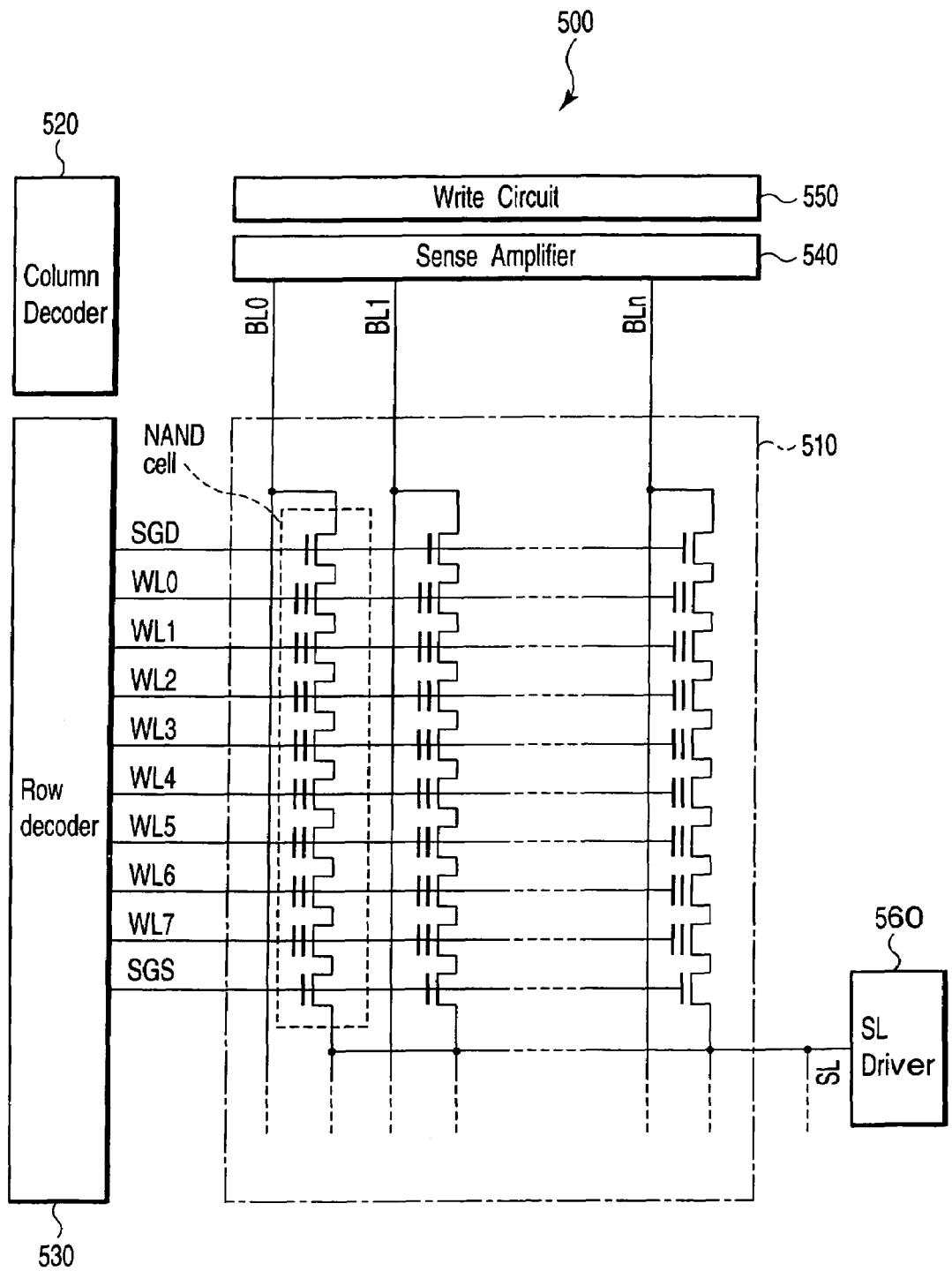
FIG. 33 is a block diagram of a NAND flash memory.

The configuration of the NAND flash memory 500 will be explained by reference to FIG. 33. FIG. 33 is a block diagram of a NAND flash memory.

As shown in FIG. 33, the NAND flash memory 500 comprises a memory cell array 510, a column decoder 520, a row decoder 530, a sense amplifier 540, a write circuit 550, and a source line driver 560.

The memory cell array 510 has a plurality of NAND cells arranged in a matrix. Each of the NAND cells includes eight memory cell transistors MTs and select transistors ST1, ST2. A memory cell transistor MT has a stacked-gate structure that includes a floating gate formed on a semiconductor substrate with a gate insulating film interposed therebetween and a control gate formed on the floating gate with an inter-gate insulating film interposed therebetween. The number of memory cell transistors MTs is not limited to 8 and may be 16 or 32. The number is illustrative and not restrictive. The adjoining ones of the memory cell transistors MTs share their source and drain. They are arranged in such a manner that their current paths are connected in series between the select transistors ST1, ST2. The drain region at one end of the series connection of the memory cell transistors MTs is connected to the source region of the select transistor ST1. The source region at the other end is connected to the drain region of the select transistor ST2.

The control gates of the memory cell transistors MTs in a same row are connected commonly to any one of word lines WL0 to WLm. The gates of the select transistors ST1, ST2 in the same row are connected commonly to select gate lines SGD, SGS, respectively. The drains of the select transistors ST1 in a same column are connected commonly to any one of bit lines BL0 to BLn. The sources of the select transistors ST2 are connected commonly to a source line SL and then connected to a source line driver 560. Both of the select transistors ST1, ST2 are not necessarily needed. Only one of them may be used, provided that it can select a NAND cell.

The column decoder 520 decodes a column address signal, thereby obtaining a column address decode signal. Then, on the basis of the column address decode signal, the column decoder 520 selects any of the bit lines BL0 to BLn.

The row decoder 530 decodes a row address signal, thereby obtaining a row address decode signal. Then, the row decoder 530 selects any one of the word lines WL0 to WLm and the select gate lines SG0 to SGm.

The sense amplifier 540 amplifies the data read from the memory cell MC selected by the row decoder 530 and column decoder 520.

The write circuit 550 latches write data.

The source line driver 560 applies a voltage to the source line SL.

<3Tr-NAND Flash Memory>

Figure 34:
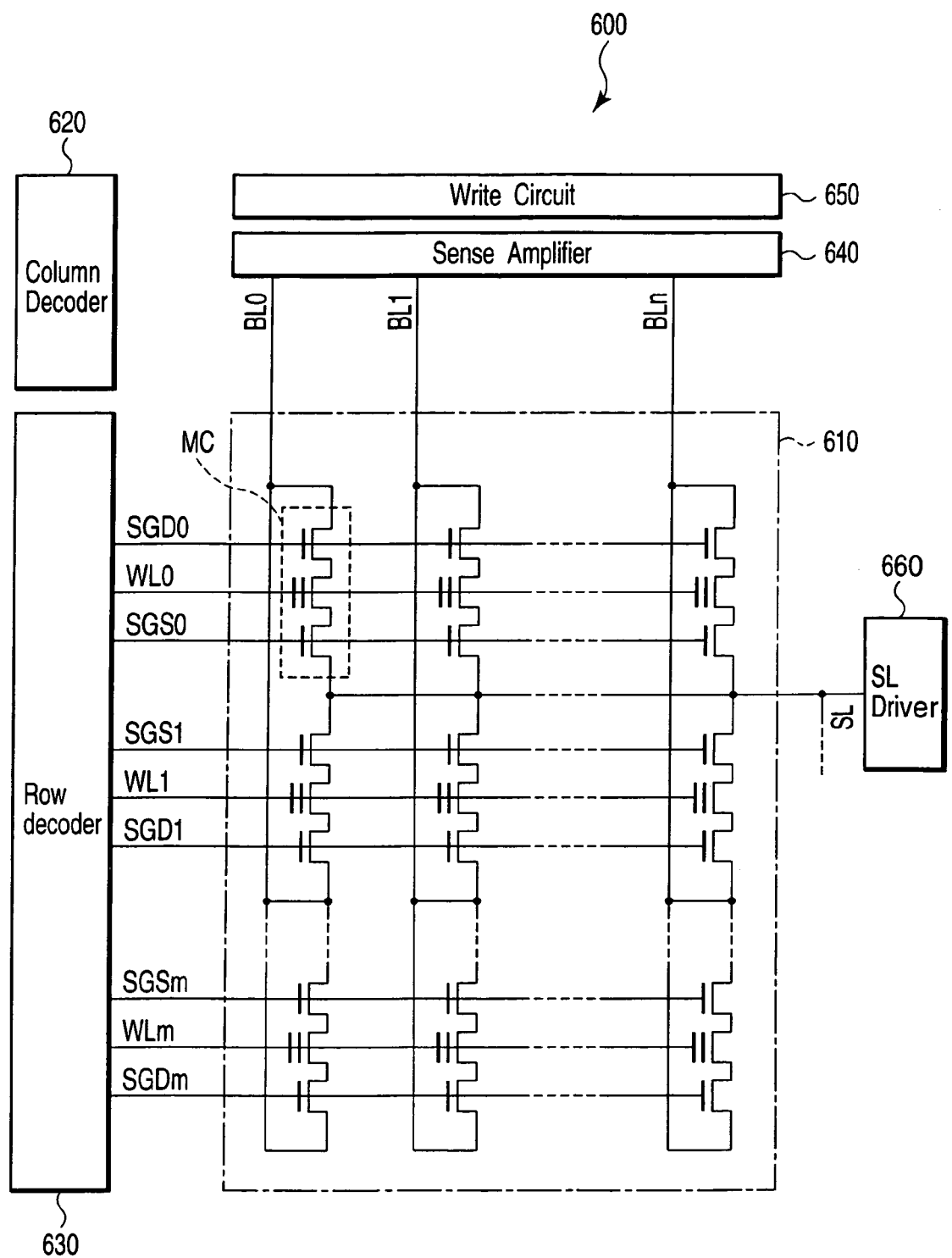
FIG. 34 is a block diagram of a 3Tr-NAND flash memory.

Next, the configuration of the 3Tr-NAND flash memory 600 will be explained by reference to FIG. 34. FIG. 34 is a block diagram of the 3Tr-NAND flash memory 600.

As shown in FIG. 34, the 3Tr-NAND flash memory 600 includes a memory cell array 610, a column decoder 620, a row decoder 630, a sense amplifier 640, a write circuit 650, and a source line driver 660.

The memory cell array 610 has a plurality of ((m+1)×(n+1)) memory cells MCs (m and n are natural numbers) arranged in a matrix. Each of the memory cells MCs includes a memory cell transistor MT and select transistors ST1, ST2, which have their current paths connected in series with one another. The current path of the memory cell transistor MT is connected between the current paths of the select transistors ST1, ST2. That is, the memory cell MC is equivalent to a NAND cell where the number of memory cell transistors MT is reduced to one in the NAND flash memory 500. The memory cell transistor MT has a stacked gate structure that includes a floating gate formed on a semiconductor substrate on a gate insulating film interposed therebetween and a control gate formed on the floating gate with an inter-gate insulating film interposed therebetween. The source region of the select transistor ST1 is connected to the drain region of the memory cell transistor MT. The source region of the memory cell transistor MT is connected to the drain region of the select transistor ST2. Memory cells MCs adjoining each other in the column direction share the drain region of the select transistor ST1 or the source region of the select transistor ST2.

The control gates of the memory cell transistors MTs of the memory cells MCs in a same row are connected commonly to any one of word lines WL0 to WLm. The gates of the select transistors ST1 of the memory cells in a same row are connected commonly to any one of select gate lines SGD0 to SGDm. The gates of the select transistors ST2 of the memory cells in a same row are connected commonly to any one of select gate lines SGS0 to SGSm. The drain regions of the select transistors ST1 of the memory cells MCs in a same column are connected commonly to any one of bit lines BL0 to BLn. The sources of the select transistors ST2 of the memory cells MCs are connected commonly to a source line SL and then connected to the source line driver 660.

The column decoder 620 decodes a column address signal, thereby producing a column address decode signal. On the basis of the column address decode signal, the column decoder 620 selects any of bit lines BL0 to BLn.

The row decoder 630 decodes a row address signal, thereby producing a row address decode signal. Then, the row decoder 630 selects any one of word lines WL0 to WLm and select gate lines SG0 to SGm.

The sense amplifier 640 amplifies the data read from the memory cell MC selected by the row decoder 630 and column decoder 620.

The write circuit 650 latches write data.

The source line driver 660 supplies a voltage to the source line SL.

With the LSI of the tenth embodiment, not only the effects in the above items (1) to (5) but also the following effects are obtained.

(6) It is possible to be embedded a plurality of types of flash memories on a single chip, while suppressing the manufacturing cost.

The memory cell transistors MTs and select transistors ST1, ST2, ST included in the NAND flash memory 500, 3Tr-NAND flash memory 600, and 2Tr flash memory 10 are formed in the same processes. That is, the individual MOS transistors are formed in the same oxidizing process, film-forming process, impurity implanting process, photolithographic etching process. As a result, the gate insulating film, inter-gate insulating film, the floating gates and control gates of the memory cell transistors MTs, and the select gates of the select transistors are the same in the three flash memories 10, 500, 600. In such a manufacturing method, the memory cell arrays of the three flash memories can be formed by as many processes as are required to form a single flash memory. Therefore, the manufacturing cost of a system LSI including three types of semiconductor memories can be reduced.

(7) The performance of the system LSI can be made higher.

The system LSI of the tenth embodiment has not only the 2Tr flash memory as explained in the first to ninth embodiments but also the NAND flash memory 500 and 3Tr-NAND flash memory 600.

Unlike the NAND flash memory 500 and 3Tr-NAND flash memory 600, the 2Tr flash memory 10 uses a positive voltage (12V) and a negative voltage (−8V) in a write operation and an erase operation. Then, the 2Tr flash memory 10 gives a potential difference of 20V between the control gate and the channel. Therefore, the write inhibit voltage can be set to 0V near the midpoint between the 12V and −8V, which makes it easy to apply the write inhibit voltage from the bit line. Because the positive and negative voltages are used, the potential difference applied to the gate insulating film of the MOS transistors used in the row decoders 30, 40 is 12V or −8V. Therefore, the gate insulating film of the MOS transistors used in the row decoders 30, 40 included in the 2Tr flash memory 10 may be thinner than that of the MOS transistors used in the row decoders 530, 630 included in the NAND flash memory 500 and 3Tr-NAND flash memory 600. Therefore, the row decoders 30, 40 can be made more compact. In addition, the operating speed of the row decoders 30, 40 can be made faster than that of the row decoders 530, 630. Accordingly, the operating speed of the 2Tr flash memory can be improved and the random access can be made faster.

In the tenth embodiment, the program data for the MCU 700 to operate is stored in the 2Tr flash memory 10. Thus, the 2Tr flash memory can operate at high speed as described above. Therefore, the MCU 700 can read the data directly from the 2Tr flash memory 10 without the intervention of a RAM or the like. As a result, a RAM or the like is not needed, which helps simplify the configuration of the system LSI and improve the operating speed.

In addition, the 3Tr-NAND flash memory 600 holds an ID code and a security code. These code data are not so large in the amount of data, but are frequently changed and updated. Thus, the memory to hold the code data is required to operate at relating high speed. In this respect, the 3Tr-NAND flash memory 600 has a smaller erase unit than that of the NAND flash memory 500 and can rewrite the data in pages. Therefore, it can be said that the 3Tr-NAND flash memory 600 is the preferable semiconductor memory to hold the code data.

A conventional LSI including a NAND flash memory requires the following controller to prevent a rewrite operation from concentrating on a specific block. The controller converts addresses inputted in ware leveling or logic form into physical addresses or, when a block malfunctions, determines the block to be faulty and performs control to prevent the faulty block from being used. In the tenth embodiment, however, such a controller is not needed. The reason is that the 2Tr flash memory 10 is caused to hold a firmware program to control the blocks in the NAND flash memory 500 and the MCU 700 is caused to perform such control. The MCU 700 performs the control in an interval of time between its original jobs (such as the process of controlling an external device or the process of computing the data inputted to the NAND flash memory 500). Of course, when the comparison of the throughput capacity of the MCU 700 with the amount of work the MCU 700 has to process has shown that the amount of work has exceeded the capacity, a hardware sequencer or the like may be provided to control the NAND flash memory 500.

For example, in the logic circuit region, the CPU 210 may be formed on an SOI substrate. In the memory region, the individual memories 10, 500, 600 may be formed on a bulk silicon substrate.

As described above, a flash memory according to the first to tenth embodiments has a discharge circuit. After the charge pump circuit that generates a positive voltage or a negative voltage is deactivated, the charge is discharged to the power supply potential or the ground potential, while current is being supplied to the output node of the charge pump circuit. Therefore, the potential change at the output node of the charge pump circuit can be made gentle and therefore the coupling noise can be reduced.

In addition, the current caused to flow to discharge the output node of the charge pump circuit after a write operation is made different from that after an erase operation. Concretely, after an erase operation, discharging is done, while a smaller current than that after a write operation is being caused to flow. Thus, even when erasing is done with the larger parasitic capacitance than that in a write operation, the coupling noise can be reduced. In other words, the time required to discharge the output node of the charge pump circuit after a write operation is made different from that after an erase operation. Specifically, discharging is done for a longer time after an erase operation than after a write operation. Therefore, the potential change at the output node of the charge pump circuit can be made gentler.

Furthermore, after a specific time has elapsed since the output node of the charge pump circuit reached 0V, the output node is connected to GND by the large-size MOS transistor. Therefore, the noise resistance of the output node can be improved.

In the first to eighth embodiments, explanation has been given using a 2Tr flash memory. In the embodiments, however, a NAND flash memory or a 3Tr-NAND flash memory may be used instead.

Furthermore, in the first to eighth embodiments, explanation has been given using the case where the bit lines are hierarchized into the global bit lines and the local bit lines. It goes without saying that the embodiments may be applied to a case where the bit lines are not hierarchized. However, when the bit lines are hierarchized, the parasitic capacitance on the write global bit lines and read global bit lines are reduced, which improves the operating speed of the flash memory. In addition, the erroneous writing of data into the memory cells connected to the unselected local bit lines is prevented effectively, which improves the reliability of the write operation.

Figure 35:
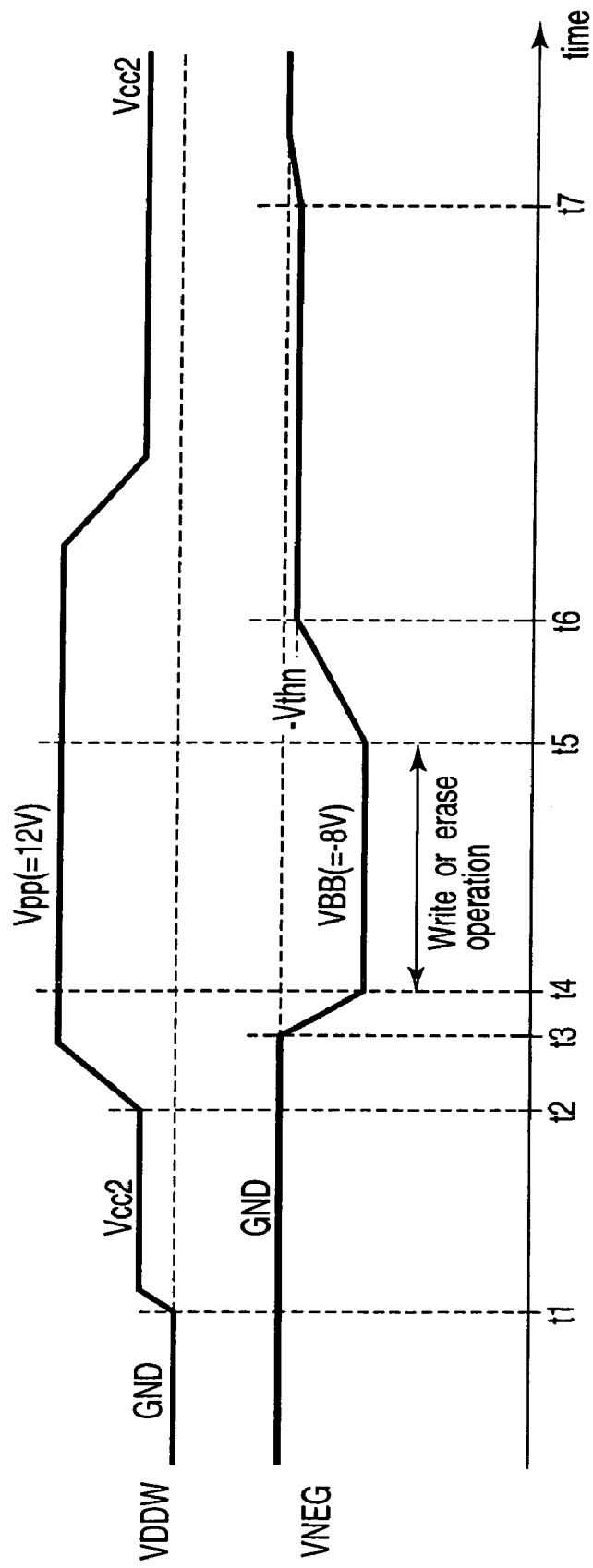
FIG. 35 is a timing chart for the potentials at node VDDW and node VNEG included in a flash memory according to a first modification of the first to tenth embodiments.

Furthermore, in the first and second embodiments, explanation has been given about a case where the MOS transistor 107 is turned on as soon as the potential at node VNEG reaches −Vthn, thereby putting the potential at node VNEG to 0V. However, as shown in FIG. 35, the MOS transistor 107 may be turned on after, for example, node VDDW is reset. The time when the MOS transistor 107 is turned on is not particularly limited. The reason is that the potential change from −Vthn to 0V have no adverse effect on the coupling. The same holds true in the fifth and sixth embodiments. The potential at node VDDW may be changed from Vcc2+Vthp to Vcc2 at any time.

Figure 36:
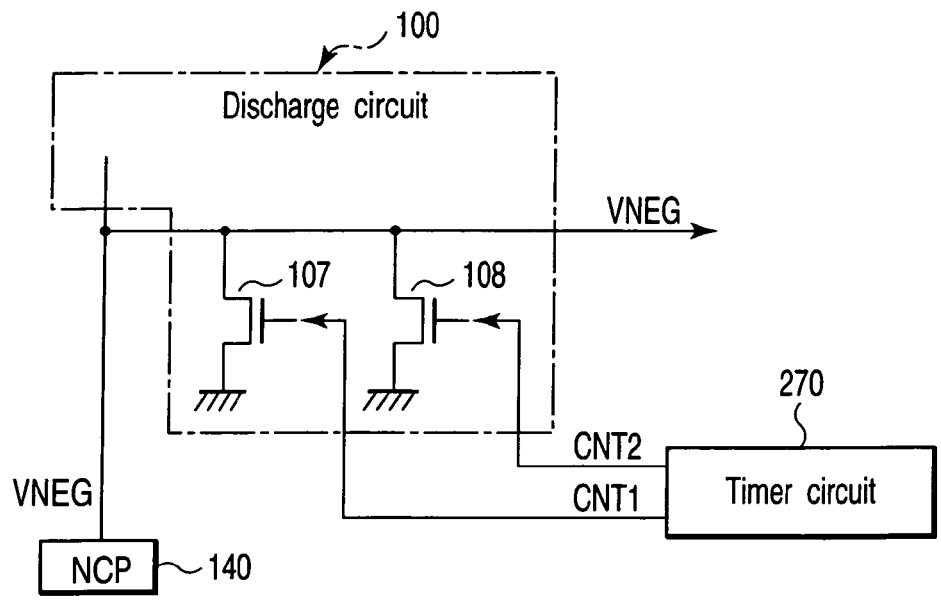
FIG. 36 is a circuit diagram of a discharge circuit included in a flash memory according to a second modification of the first to tenth embodiments.

In addition, as shown in FIG. 36, the gates of the MOS transistors 107, 108 in the discharge circuit 100 can be controlled by, for example, a timer circuit. Specifically, a timer circuit 270 measures the elapsed time since a reset operation is started. When a specific time has elapsed, the MOS transistor 107 is first turned on and then the MOS transistor 108 is turned on.

Figure 37:
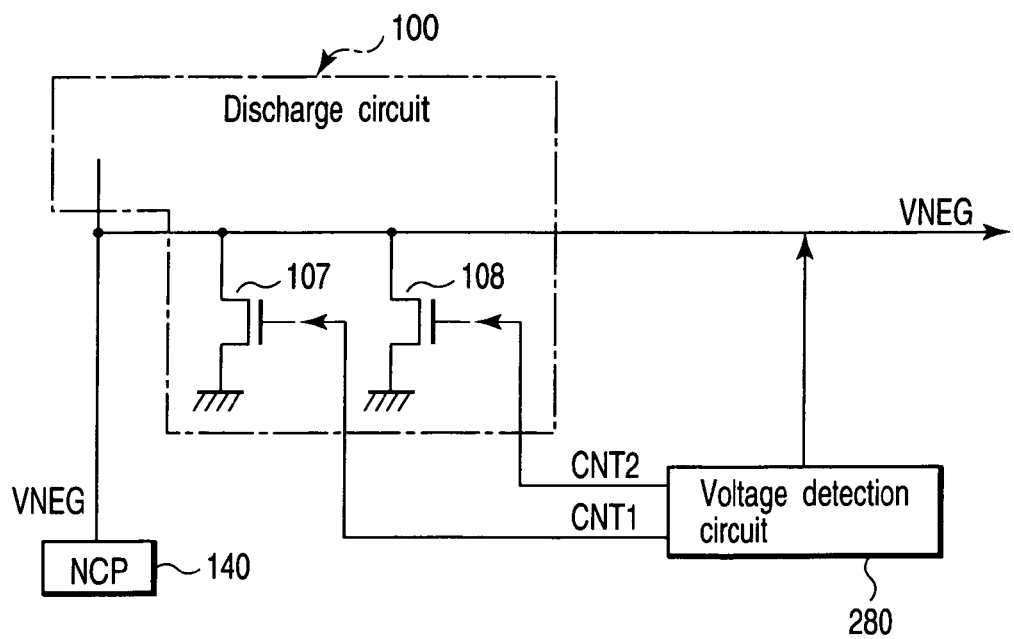
FIG. 37 is a circuit diagram of a discharge circuit included in a flash memory according to a third modification of the first to tenth embodiments.

Moreover, as shown in FIG. 37, the gates of the MOS transistors 107, 108 in the discharge circuit 100 may be controlled by a voltage detection circuit 280. Specifically, the voltage detection circuit 280 senses node VNEG. When the detection circuit 280 has sensed that the potential at node VNEG has reached a specific potential (e.g., Vthn), the MOS transistor 107 is turned on. Then, when the circuit 280 has sensed that node VNEG has reached 0V, the MOS transistor 108 is turned on.

Figure 38:
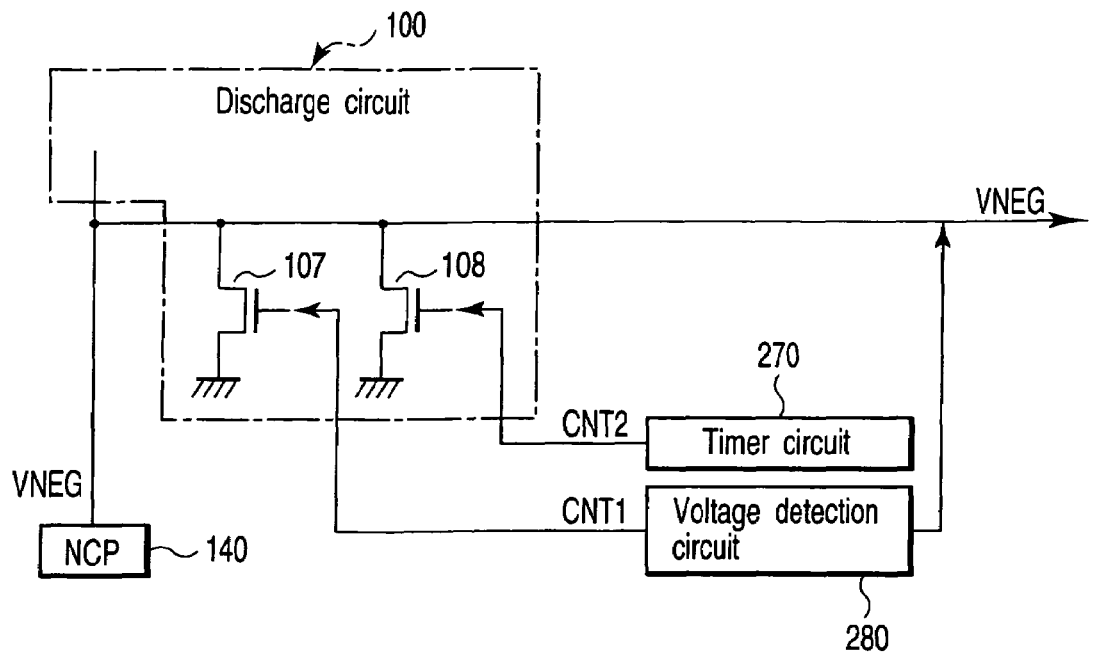
FIG. 38 is a circuit diagram of a discharge circuit included in a flash memory according to a fourth modification of the first to tenth embodiments.

Of course, as shown in FIG. 38, the configuration of FIG. 36 may be combined with that of FIG. 37. Specifically, when the voltage detection circuit 280 has sensed that the potential at node VNEG is −Vthn, the MOS transistor 107 is first turned on. Then, after a specific time has elapsed at the timer 270, the MOS transistor 108 is turned on.

Figure 39:
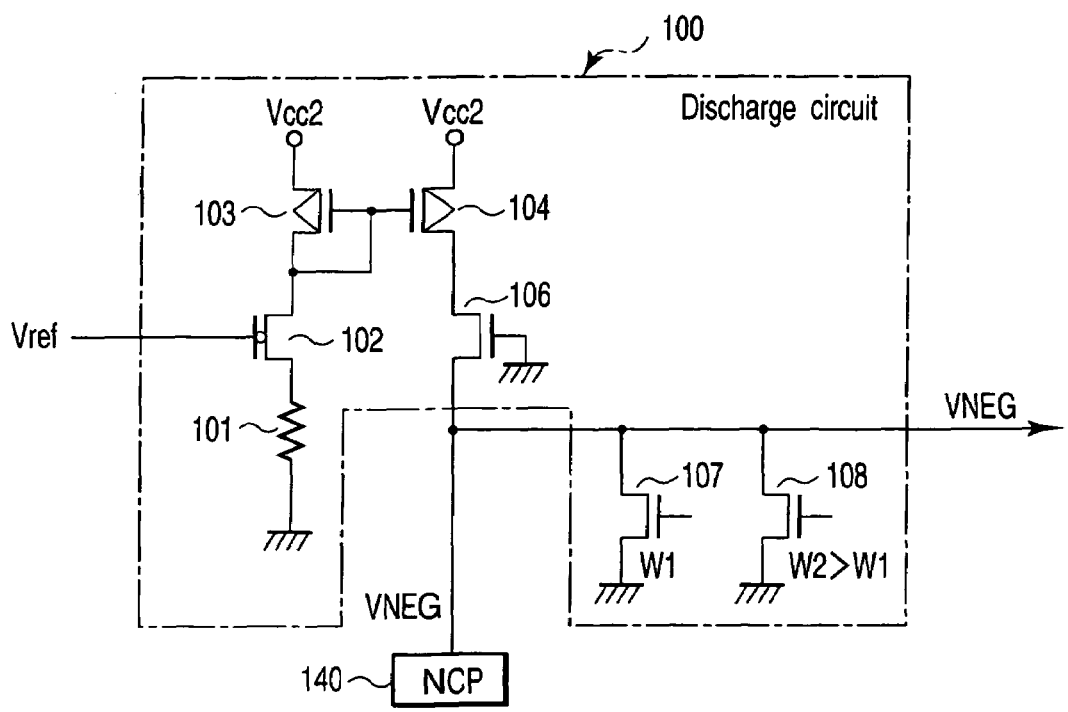
FIG. 39 is a circuit diagram of a discharge circuit included in a flash memory according to a fifth modification of the first to tenth embodiments.

FIGS. 36 to 38 may be applied to the MOS transistors 157, 158 in the discharge circuit 150. In addition, as shown in FIG. 39, the MOS transistor 105 may be eliminated from the discharge circuit 100, depending on the situation.

Figure 40:
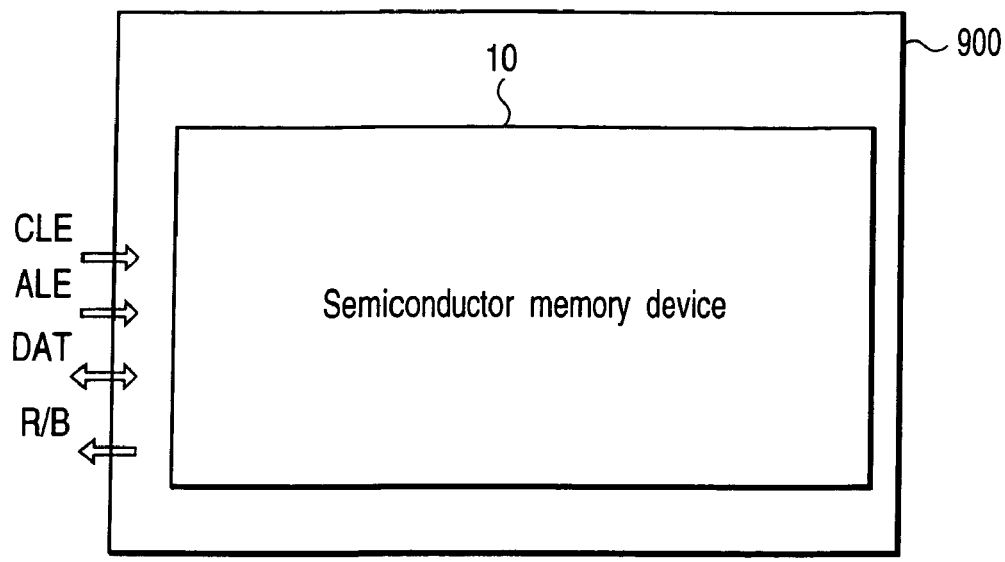
FIG. 40 is a block diagram of a memory card including a flash memory according to the first to tenth embodiments.

Next, applications of the aforementioned semiconductor memory devices will be explained. FIG. 40 shows an example of a memory card. As shown in FIG. 40, the memory card 900 includes a 2Tr flash memory 10 explained in the first to eighth embodiments. The flash memory 10 receives specific controls signals and data from an external unit (not shown). In addition, the flash memory 10 outputs specific control signals and data to the external unit.

A signal line (DAT), a command line enable signal line (CLE), an address line enable signal line (ALE) and a ready/busy signal line (R/B) are connected to the memory card 10 having the 2Tr flash memory. The signal line (DAT) transfers data, address or command signals. The command line enable signal line (CLE) transfers a signal, which indicates that a command signal is transferred on the signal line (DAT). The address line enable signal line (ALE) transfers a signal, which indicates that an address signal is transferred on the signal line (DAT). The ready/busy signal line (R/B) transfers a signal, which indicates whether the memory device is ready, or not.

Figure 41:
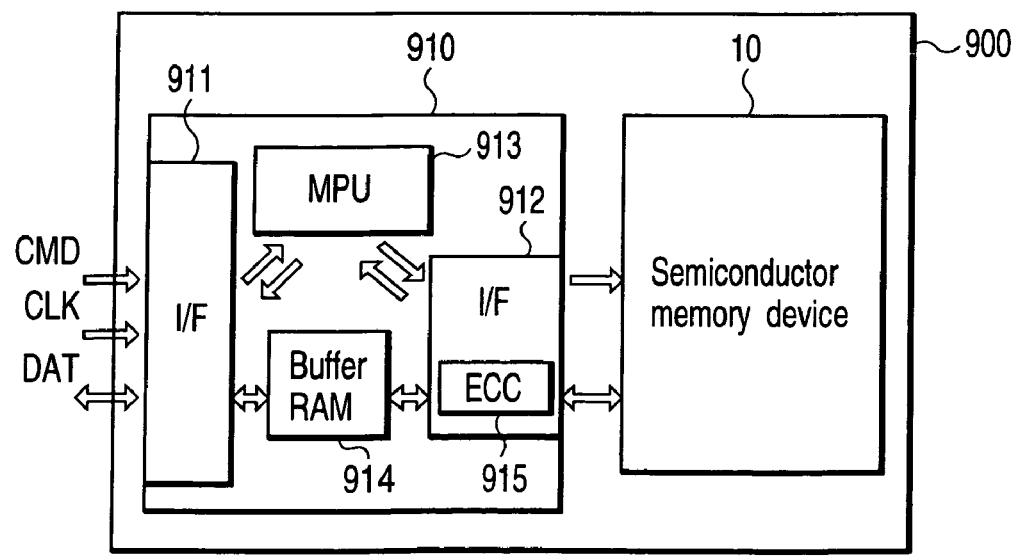
FIG. 41 is a block diagram of a memory card including a flash memory according to the first to tenth embodiments.

Another exemplary implementation is shown in FIG. 41. The memory card shown in FIG. 41 differs from the memory card presented in FIG. 40 in that the memory card of FIG. 41 includes, in addition to the memory device, a controller 910 which controls the flash memory 10 and receives/transfers predetermined signals from/to an external device (not shown).

The controller 910 includes interface units (I/F) 911, 912, a microprocessor unit (MPU) 913, a buffer RAM 914 and an error correction code unit (ECC) 915. The interface units (I/F) 911, 912 receives/outputs predetermined signals from/to an external device (not shown). The microprocessor unit 913 converts a logical address into a physical address. The buffer RAM 914 stores data temporarily. The error correction code unit 915 generates an error correction code. A command signal line (CMD), a clock signal line (CLK) and a signal line (DAT) are connected to the memory card 900. It should be noted that the number of the control signal lines, bit width of the signal line (DAT) and a circuit construction of the controller could be modified suitably.

Figure 42:
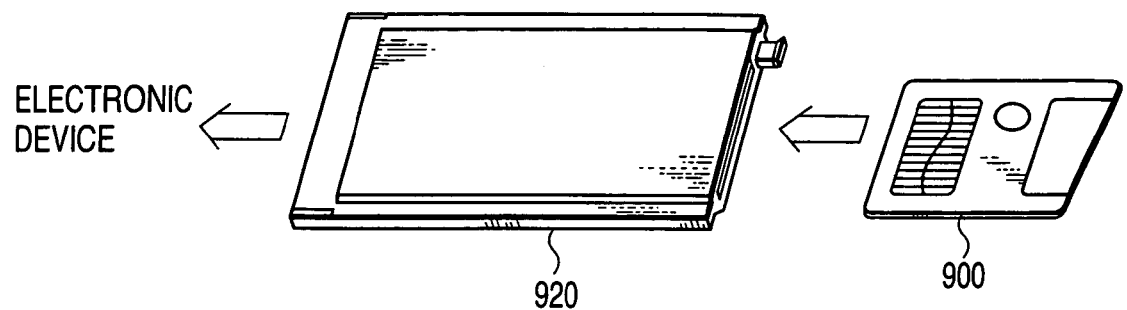
FIG. 42 shows an outward appearance of a memory card including a flash memory according to the first to tenth embodiments and a card holder.

As can be seen from FIG. 42, a memory cardholder 920 is provided for receiving a memory card 900. The cardholder 920 is connected to an electronic device (not shown) and is operable as an interface between the card and the electronic device. The cardholder 920 may perform one or more of the functions of the controller 910.

FIG. 42 shows another application. As shown in FIG. 42, the memory card 900 is inserted into a cardholder 920, which is then connected to electronic equipment (not shown). The cardholder 920 may have a part of the function of the controller 910.

Figure 43:
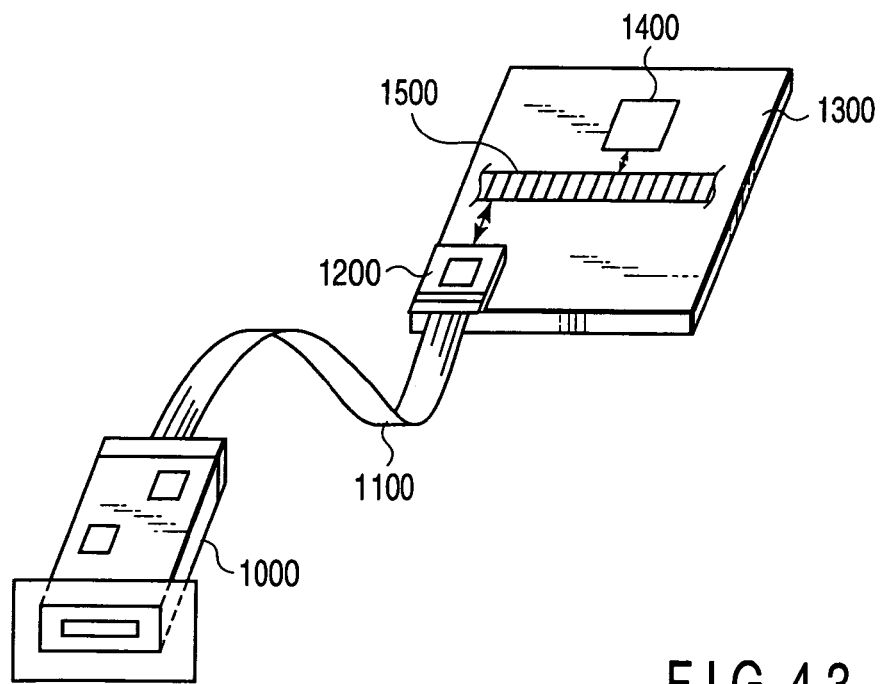
FIG. 43 shows an outward appearance of a connection unit for connecting with a memory card including a flash memory according to the first to tenth embodiments.

FIG. 43 shows another application. As shown in FIG. 43, the memory card 900 or the cardholder 920 in which the memory card 900 has been inserted is inserted into a connection unit 1000. The connection unit 1000 is connected to a board 1300 via a connection cable 1100 and an interface circuit 1200. The board 1300 includes a CPU 1400 and a bus 1500.

FIG. 44 shows another application. The memory card 900 or the cardholder 920 in which the memory card 900 has been inserted is inserted into the connection unit 1000. The connection unit 1000 is connected to a personal computer 2000 via the connection cable 1100.

Figure 46:
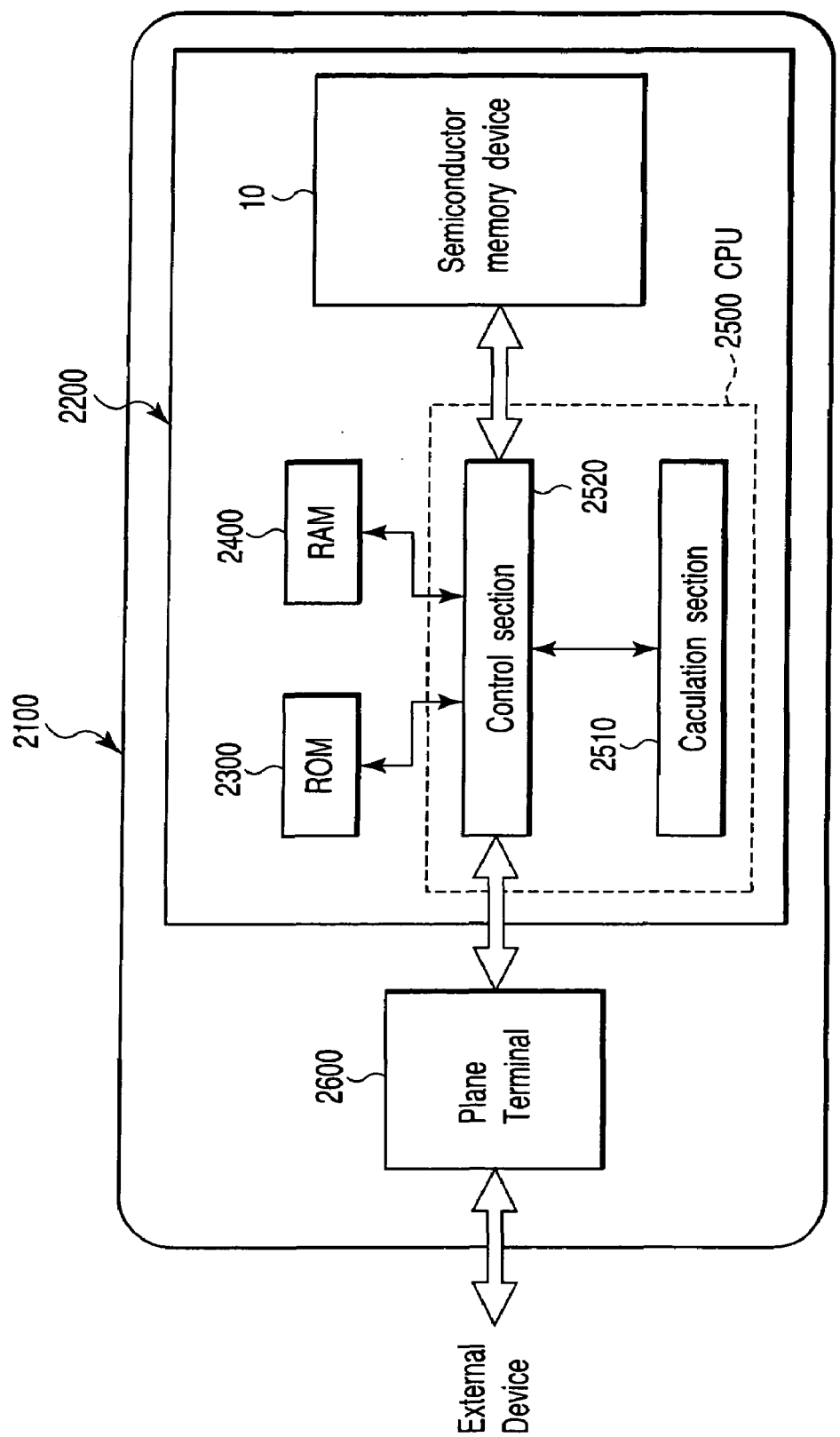
FIG. 46 is a block diagram of an IC card including a flash memory according to the first to tenth embodiments.

FIGS. 45 and 46 show another application. As shown in FIGS. 45 and 46, an IC card 2100 includes an MCU 2200. The MCU 2200 includes the flash memory 10 according to any one of the above embodiments, other circuits, including ROM 2300 and RAM 2400, and a CPU 2500. The IC card 2100 is connectable to the MCU 2200 via a plane connecting terminal 2600 connected to the MCU 2200 and provided on the IC card 2100. The CPU 2500 includes a computing section 2510 and a control section 2520 connected to the flash memory 10, ROM 2300, and RAM 2400. For example, the MPU 2200 is provided on one side of the IC card 2100 and the plane connecting terminal 2600 is provided on the other side.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   memory cells each of which has a first MOS transistor with a stacked gate including a floating gate formed on a gate insulating film on a well region formed in the surface of a semiconductor substrate and a control gate formed on an inter-gate insulating film on the floating gate;
   a memory cell array in which the memory cells are arranged in a matrix;
   word lines each of which connects commonly the control gates of the first MOS transistors in a same row;
   a first charge pump circuit which is activated and generates a first voltage in a write operation and erase operation and which supplies the first voltage to either the well region or the word lines;
   a discharge circuit which, when the first charge pump circuit is deactivated, discharges the charge generated by the first charge pump circuit to ground or to a power-supply potential, while causing current to flow to an output node of the first voltage;
   a second charge pump circuit which is activated and generates a second voltage in the write operation and erase operation and which supplies the second voltage to either the well region or the word lines,
   wherein the first and second voltages are a negative voltage and a positive voltage, respectively,
   the second charge pump circuit is deactivated after the charge generated by the first charge pump circuit is discharged by the discharge circuit, and
   the discharge circuit, when the second charge pump circuit is deactivated, discharges the charge generated by the second charge pump circuit to ground or to the power-supply potential, while causing the current to flow to an output node of the second voltage;
   wherein each of the memory cells includes a second MOS transistor which has a drain connected to the source of the first MOS transistor,
   the device further includes a select gate line which connects commonly the gates of the second MOS transistors in a same row,
   the first charge pump circuit supplies the negative voltage to the select gate lines and the well region in the write operation and to the word lines in the erase operation, and
   the second charge pump circuit supplies the positive voltage to the word line in the write operation and to the well region in the erase operation.

2. The semiconductor memory device according to claim 1, further comprising:
   bit lines each of which connects commonly the drains of the first MOS transistors in a same column;
   source lines each of which connects commonly the sources of the second MOS transistors;
   a first row decoder which selects any one of the word lines and supplies the negative voltage not only to the selected word line but also to all of the select gate lines in the write operation and which supplies the negative voltage to all of the word lines in the erase operation; and
   a second row decoder which selects any one of the select gate lines and applies a voltage lower than the positive voltage to the selected select gate line in a read operation.

3. The semiconductor memory device according to claim 1, wherein the discharge circuit further includes
   a first switch which switches the connection between the output node of the first voltage and ground or the power-supply potential, and
   a second switch element which switches the connection between the output node of the first voltage and ground or the power-supply potential, which is turned on a specific time after the first switch element is turned on, and which has a larger current supplying capability than the first switch element.

4. A semiconductor memory device comprising:
   memory cells each of which has a first MOS transistor with a stacked gate including a floating gate formed on a gate insulating film on a well region formed in the surface of a semiconductor substrate and a control gate formed on an inter-gate insulating film on the floating gate, and a second MOS transistor which has a drain connected to the source of the first MOS transistor;
   a memory cell array in which the memory cells are arranged in a matrix;
   word lines each of which connects commonly the control gates of the first MOS transistors in a same row;
   select gate lines each of which connects commonly the gates of the second MOS transistors in a same row;
   a first charge pump circuit which is activated and generates a negative voltage in a write operation and erase operation and which supplies the negative voltage to the select gate lines and the well region in the write operation and to the word lines in the erase operation; and
   a discharge circuit which, when the first charge pump circuit is deactivated, discharges the charge generated by the first charge pump circuit to ground or to a power-supply potential, while causing current to flow to an output node of the negative voltage, and which makes the current value supplied in discharging after the write operation different from that in discharging after the erase operation;
   wherein the discharge circuit includes
   a reference voltage generator which generates a reference voltage,
   a current mirror circuit which includes a third MOS transistor and supplies the current according to the reference voltage, an output node of the current mirror circuit being connected to the output node of the negative voltage, and a current control circuit which makes the amount of current supplied by the current mirror circuit after the write operation different from that after the erase operation.

5. The semiconductor memory device according to claim 4, wherein the discharge circuit further includes a fourth MOS transistor which has a current path connected between the output node of the current mirror circuit and the output node of the negative voltage and which has a thicker gate insulating film than that of the third MOS transistor.

6. The semiconductor memory device according to claim 4, further comprising:

a second charge pump circuit which is activated and generates a positive voltage in the write operation and erase operation and which supplies the positive voltage to the word lines in the write operation and to the well region in the erase operation, wherein the second charge pump circuit is deactivated and the charge generated by the second charge pump circuit is discharged by the discharge circuit after the charge generated by the first charge pump circuit is discharged.

7. The semiconductor memory device according to claim 4, wherein the discharge circuit further includes a first switch which switches the connection between the output node of the negative voltage and ground or the power-supply potential, and a second switch element which switches the connection between the output node of the negative voltage and ground or the power-supply potential, which is turned on a specific time after the first switch element is turned on, and which has a larger current supplying capability than the first switch element.

8. The semiconductor memory device according to claim 4, further comprising:

bit lines each of which connects commonly the drains of the first MOS transistors in a same column;

source lines each of which connects commonly the source of the second MOS transistors;

a first row decoder which selects any one of the word lines and supplies the negative voltage not only to the selected word line but also to all of the select gate lines in the write operation and which supplies the negative voltage to all of the word lines in an erase operation; and a second row decoder which selects any one of the select gate lines and applies a voltage lower than the positive voltage to the selected select gate line in a read operation.

9. A semiconductor memory device comprising:

memory cells each of which has a first MOS transistor with a stacked gate including a floating gate formed on a gate insulating film on a well region formed in the surface of a semiconductor substrate and a control gate formed on an inter-gate insulating film on the floating gate, and a second MOS transistor which has a drain connected to the source of the first MOS transistor;

a memory cell array in which the memory cells are arranged in a matrix;

word lines each of which connects commonly the control gates of the first MOS transistors in a same row;

select gate lines each of which connects commonly the gates of the second MOS transistors in a same row;

a first charge pump circuit which is activated and generates a negative voltage in a write operation and erase operation and which supplies the negative voltage to the select gate lines and the well region in the write operation and to the word lines in the erase operation; and a discharge circuit which, when the first charge pump circuit is deactivated, discharges the charge generated by the first charge pump circuit to ground or to a power-supply potential, while causing current to flow to an output node of the negative voltage, and which makes the time required to discharge after the write operation different from that to discharge after the erase operation;

wherein the discharge circuit includes a reference voltage generator which generates a reference voltage, a current mirror circuit which includes a third MOS transistor and supplies the current according to the reference voltage, an output node of the current mirror circuit being connected to the output node of the negative voltage, and a current control circuit which makes the amount of current supplied by the current mirror circuit after the write operation different from that after the erase operation.

10. The semiconductor memory device according to claim 9, wherein the discharge circuit further includes a fourth MOS transistor which has a current path connected between the output node of the current mirror circuit and the output node of the negative voltage and which has a thicker gate insulating film than that of the third MOS transistor.

11. The semiconductor memory device according to claim 9, further comprising:

a second charge pump circuit which is activated and generates a positive voltage in the write operation and erase operation and which supplies the positive voltage to the word lines in the write operation and to the well region in the erase operation, wherein the second charge pump circuit is deactivated and the charge generated by the second charge pump circuit is discharged by the discharge circuit after the charge generated by the first charge pump circuit is discharged.

12. The semiconductor memory device according to claim 9, wherein the discharge circuit further includes a first switch which switches the connection between the output node of the negative voltage and ground or the power-supply potential, and a second switch element which switches the connection between the output node of the negative voltage and ground or the power-supply potential, which is turned on a specific time after the first switch element is turned on, and which has a larger current supplying capability than the first switch element.

13. The semiconductor memory device according to claim 9, further comprising:

bit lines each of which connects commonly the drains of the first MOS transistors in a same column;

source lines each of which connects commonly the source of the second MOS transistors;

a first row decoder which selects any one of the word lines and supplies the negative voltage not only to the selected word line but also to all of the select gate lines in the write operation and which supplies the negative voltage to all of the word lines in an erase operation; and a second row decoder which selects any one of the select gate lines and applies a voltage lower than the positive voltage to the selected select gate line in a read operation.

14. A method of controlling a semiconductor memory device, comprising:
 causing a first charge pump circuit to apply a positive voltage to a first node;
 causing a second charge pump circuit to apply a negative voltage to a second node;
 writing data into or erasing data from nonvolatile memory cells by using the positive and negative voltages;
 deactivating the first charge pump circuit after data is written into or read from the nonvolatile memory cells;
 causing a discharge circuit to discharge the charge at the first node to ground or a power-supply potential, while causing current flow to the first node;
 causing a first MOS transistor to connect the first node to ground after the charge at the first node is discharged;
 causing a second MOS transistor which has a current supplying capability larger than that of the first MOS transistor to connect the first node to ground after the first node is connected to ground by the first MOS transistor.

15. The method according to claim 14,
 wherein discharging the charge at the first node is done for a longer time after an erase operation than after write operation.

16. A memory card comprising a semiconductor memory device recited in claim 1.

17. The memory card according to claim 16, further comprising a control circuit which controls the semiconductor device.

* * * * *